US010036955B2

(12) United States Patent
Kwak et al.

(10) Patent No.: US 10,036,955 B2
(45) Date of Patent: Jul. 31, 2018

(54) PORTABLE IMAGE-FORMING DEVICE

(71) Applicant: S-PRINTING SOLUTION CO., LTD., Suwon-si, Gyeonggi-do (KR)

(72) Inventors: Eun-bit Kwak, Suwon-si (KR); Yong-shik Park, Yongin-si (KR); Ho-jun Jang, Seongnam-si (KR); Song-baik Jin, Seoul (KR); Kwang-hyuck So, Seoul (KR); Sang-in Lee, Seongnam-si (KR)

(73) Assignee: S-PRINTING SOLUTION CO., LTD., Suwon-si (KR)

(*) Notice: Subject to any disclaimer, the term of this patent is extended or adjusted under 35 U.S.C. 154(b) by 120 days.

(21) Appl. No.: 15/038,653

(22) PCT Filed: Sep. 25, 2014

(86) PCT No.: PCT/KR2014/008950
§ 371 (c)(1),
(2) Date: May 23, 2016

(87) PCT Pub. No.: WO2015/080370
PCT Pub. Date: Jun. 4, 2015

(65) Prior Publication Data
US 2016/0291473 A1    Oct. 6, 2016

(30) Foreign Application Priority Data

Nov. 26, 2013  (KR) .......................... 10-2013-0144339
Nov. 26, 2013  (KR) .......................... 10-2013-0144347
Sep. 5, 2014   (KR) .......................... 10-2014-0118645

(51) Int. Cl.
*G03B 17/50*    (2006.01)
*G03F 7/20*     (2006.01)

(52) U.S. Cl.
CPC ..................................... *G03F 7/20* (2013.01)

(58) Field of Classification Search
USPC .......................................................... 396/39
See application file for complete search history.

(56) References Cited

U.S. PATENT DOCUMENTS 6,734,948 B2 *  5/2004  Futakami ............... G03B 17/52
                                                   347/238
7,053,921 B2 *  5/2006  Chino ....................... B41J 2/465
                                                   347/241
(Continued)

FOREIGN PATENT DOCUMENTS

JP    2000-89350    3/2000
JP    2001-256011   9/2001
(Continued)

OTHER PUBLICATIONS

English translation of JP 2004-294608, Oct. 21, 2004.*
(Continued)

*Primary Examiner* — Rodney Fuller
(74) *Attorney, Agent, or Firm* — Staas & Halsey LLP

(57) ABSTRACT

A portable image-forming device includes a housing, an exposure member for exposing an instant film disposed inside of the housing by means of a light radiating from the screen of a portable display device, a shading member linked in movement with the exposure member so as to shade the instant film, a traction member connected to the exposure member so as to move the exposure member to a pre-exposure position, and a developing-agent-spreading member for spreading a developing agent, which is provided on the instant film, over the entire instant film. The traction member and the developing-agent-spreading member are manually operated by a user.

20 Claims, 85 Drawing Sheets

(56) References Cited

U.S. PATENT DOCUMENTS

| | | | |
|---|---|---|---|
| 2001/0033744 A1* | 10/2001 | Ohmura | G03B 17/52 396/30 |
| 2004/0090528 A1 | 5/2004 | Miyamoto | |
| 2015/0138526 A1* | 5/2015 | Degani | B41F 17/00 355/77 |
| 2016/0295035 A1* | 10/2016 | Park | H04N 1/00177 |

FOREIGN PATENT DOCUMENTS

| | | |
|---|---|---|
| JP | 2001-268422 | 9/2001 |
| JP | 2004-294608 | 10/2004 |

OTHER PUBLICATIONS

English translation of JP 2000-089350, Mar. 31, 2000.*
International Search Report dated Dec. 24, 2014 from International Application No. PCT/KR2014/008950, 2 pages.
Written Opinion dated Dec. 24, 2014 from International Application No. PCT/KR2014/008950, 14 pages.

* cited by examiner

PORTABLE IMAGE-FORMING DEVICE

CROSS REFERENCE TO RELATED APPLICATIONS

This application is a U.S. national stage application of PCT/KR2014/008950 filed on Sep. 25, 2014 and claims the priority benefit of Korean Application Nos. 10-2013-0144339, 10-2013-0144347 and 10-2014-0118645, filed Nov. 26, 2013, Nov. 26, 2013 and Sep. 5, 2014 respectively, in the Korean Intellectual Property Office, the disclosures of each of which are incorporated herein by reference.

BACKGROUND

1. Field

The disclosure generally relates to a portable image-forming device, and more particularly, to a portable image-forming device for printing an image displayed in a screen of a portable display device on an instant film.

2. Description of the Related Art

In general, an instant camera may include an embedded instant film and may obtain a printed picture immediately by photographing an image, performing a light exposing operation and developing operation with respect to the embedded instant film and discharging the instant film to outside the camera.

However, the above-described conventional instant camera requires a sufficient distance between a lens and the instant film, which causes an increase of an overall volume and deterioration of portability of the camera.

In addition, the conventional instant camera is unable to output an image stored in a memory of a portable display device.

An instant film-type digital still camera or a small portable photo-printer which is being released in recent times may be connected with a portable display device through a cable to receive and output an image of the portable display device, which causes inconvenience of being equipped with a cable to output a picture.

In addition, the above-described digital still camera or small portable photo-printer is driven by being supplied with power (driven for a light exposing operation and a developing operation). Accordingly, the camera may include a charged battery for supplying the power inside the camera, and the charged battery should be charged again when discharged. Specially, when the battery is discharged in an outdoor environment in which charging the battery is unavailable, the digital still camera or small portable photo-printer cannot output a picture.

SUMMARY

Additional aspects and/or advantages will be set forth in part in the description which follows and, in part, will be apparent from the description, or may be learned by practice of the disclosure.

The disclosure has been provided to address the aforementioned and other problems and disadvantages occurring in the related art, and an aspect of the disclosure provides a portable image-forming device for outputting an image displayed in a screen of a portable display device without a cable and outputting an instant film without being supplied power.

The disclosure also provides a portable image-forming device for printing an image displayed in a screen of a display device without change by using an instant film, with a small size, a low-power operated configuration, and a simple structure for reducing manufacturing costs.

According to an embodiment of the disclosure, there is provided a portable image-forming device. The device may include a housing, an exposure member for exposing an instant film disposed in an inside of the housing to a light radiating from a screen of a portable display device, a shading member operating in association with the exposure member so as to shield the instant film, a traction unit connected to the exposure member so as to move the exposure member to a pre-exposure position, and a developing agent-spreading member for spreading a developing agent provided in the instant film over the entire instant film. The traction unit and the developing agent-spreading member are manually operated by a user.

The exposure member may include a lens array, a frame for supporting the lens array, and a shutter slidably engaged with the frame. The shutter may close the lens array in response to the exposure member moving to the pre-exposure position and open the lens array in response to the exposure member moving from the pre-exposure position to an exposure position.

The frame may include a plurality of contact protrusions formed to be in contact with the shutter.

The shading member may be made of an opaque film having an elastic force and include a first shading film and a second shading film respectively being connected to a front end and a rear end of the exposure member. The first shading film and the second shading film may be disposed in the housing in a rolled state such that a part of each of the first shading film and the second shading film is unrolled.

The traction unit may include a lever for pulling the exposure member to the pre-exposure position or a post-exposure position, an elastic member for elastically supporting the lever, and a locking member for locking or releasing the lever at the pre-exposure position of the exposure member.

The lever may be connected to the front end of the exposure member by a first string and connected to the rear end of the exposure member by a second string.

The device may further include a damping unit for elastically supporting the exposure member in a direction in which the exposure member moves from the post-exposure position to the pre-exposure position.

The damping unit may include a guide rail for guiding the exposure member and a coil spring engaged with the guide rail.

The damping unit may include a linear damper connected to the exposure member and a coil spring engaged with the linear damper.

The damping unit may include a guide rail for guiding the exposure member, a coil spring engaged with the guide rail, a rotary damper disposed in the exposure member, a pinion engaged with a rotary shaft of the rotary damper through a center, and a rack disposed in parallel to a moving direction of the exposure member and meshed with the pinion.

The damping unit may include a mechanical vibrator disposed in the exposure member, a pinion engaged with a rotary shaft of the mechanical vibrator through a center, and a pinion disposed in the housing in parallel to the moving direction of the exposure member and gear-engaged with the pinion.

The developing agent-spreading member may be disposed to be adjacent to a discharging hole for discharging the instant film.

The developing agent-spreading member may include a couple of pressure rollers rotatably being disposed in the inside of the housing so as to feed the instant film to the discharging hole, a slave gear for transmitting a torque to any one of the couple of pressure rollers, a main gear for rotating the slave gear, and a rotation knob exposed to an outside of the housing so as to rotate the main gear.

The device may further include an instant film setting unit for introducing a front end of an instant film into the couple of pressure rollers in association with rotation of the rotation knob on one side of the housing.

The instant film setting unit may include a movable gear rotating by being supplied with the torque of the main gear through a plurality of slave gears, a movable member cam-engaged with the movable gear through a front end and reciprocating in a direction parallel to a conveying direction of the instant film according to rotation of the movable gear, and a pusher for pushing a rear end of the instant film by elastically being hinge-engaged with a rear end of the movable member.

The movable gear may include a cam protrusion. The movable member may include at least one cam follower coming into cam-contact with the cam protrusion. The movable member may push the instant film toward the couple of pressure rollers while the cam follower comes into contact with the cam protrusion and move to a position for pushing a rear end of a next instant film in response to contact between the camp protrusion and the cam follower being released.

The housing may form a fixing unit in which the portable display device is inserted on a side in which an incident window is formed.

The fixing unit may include two adjacent surfaces which are open.

The fixing unit may be elastically engaged with the housing in a direction of the housing.

The exposure member may include a lens array and a frame for supporting the lens array. The exposure member may be disposed between the traction unit and the instant film.

The traction unit may include an inserting groove in which one end of the portable display device is inserted. In response the portable display device being pressurized in an inserting direction, the traction unit may move linearly in the inside of the housing.

The traction unit may include a stopping member selectably being connected or disconnected with respect to the exposure member.

The stopping member of the traction unit may include a stopping protrusion detachably being engaged with a stopping hole of the exposure member and a stop-releasing protrusion for detaching the stopping protrusion from the stopping hole.

The stop-releasing protrusion of the stopping member may be formed in an inclined manner so as to climb up a part of the inside of the housing to move to a pre-exposure position.

The traction unit may further include an instant film setting unit for introducing a front end of the instant film into a developing agent-spreading member by pushing a rear end of the instant film in response to the exposure member moving from a pre-exposure position to an exposure position.

The developing agent-spreading member may include a couple of pressure rollers rotatably being disposed in the inside of the housing so as to feed the instant film to a discharging hole of the housing and a driving unit for transmitting a driving force to the couple of pressure rollers, the driving force being generated according to a movement of the traction unit.

The driving unit may include a driving belt connected with a part of the traction unit, a couple of pulley gears for hang the driving belt, and a couple of power transmission gears for receiving a torque of any one of the couple of pulley gears and transmitting the torque to any one of the couple of pressure rollers.

The couple of pressure rollers may further include a couple of slave gears respectively being meshed with each other on one side.

The device may further include an elastic member for moving the traction unit from a pre-exposure position to a post-exposure position by an elastic force. The elastic member may include one end being fixed to the housing and the other end being fixed to the traction unit by means of a string.

The shading member may include a first shading film and a second shading film which are connected to a front end and a rear end of the exposure member, respectively. The first shading film may be disposed in the housing in a rolled state such that a part of the first shading film is unrolled. The second shading film may be disposed in the traction unit in a rolled state such that a part of the second shading film is unrolled.

The damping unit may include a rotary damper disposed in the exposure member, a pinion engaged with a rotary shaft of the rotary damper through a center, and a rack disposed in parallel to a moving direction of the exposure member and meshed with the pinion.

According to an embodiment of the disclosure, there is provided a portable image-forming device. The device may include a housing, an exposure member for exposing an instant film disposed in an inside of the housing to a light radiating from a screen of a portable display device, a shading member operating in association with the exposure member so as to shield the instant film, a traction unit connected to the exposure member so as to move the exposure member to a pre-exposure position, a developing agent-spreading member consisting of a couple of rubber rollers so as to spread a developing agent provided in the instant film over the entire instant film, a driving unit for indirectly transmitting power to the exposure member through the shading member and directly transmitting power to the developing agent-spreading member, and a battery for supplying power to the driving unit.

BRIEF DESCRIPTION OF THE DRAWINGS

These and/or other aspects and advantages will become apparent and more readily appreciated from the following description of the embodiments, taken in conjunction with the accompanying drawings of which:

FIG. 76B is an expanded view of Portion J displayed in FIG. 76a; and

DETAILED DESCRIPTION

Figure 1:
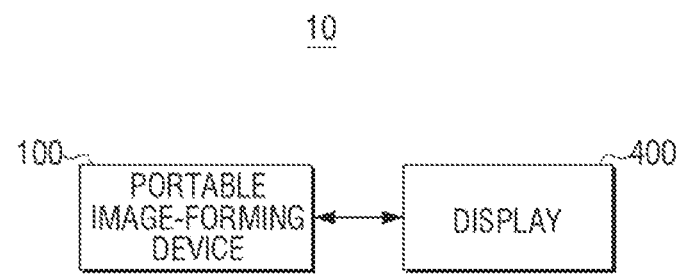
FIG. 1 is a view illustrating an image-forming system according to an embodiment of the disclosure.

Certain embodiments are described in greater detail below with reference to the accompanying drawings. In the following description, like drawing reference numerals are used for like elements, even in different drawings. The matters defined in the description, such as detailed construction and elements, are provided to assist in a comprehensive understanding of the embodiments. However, embodiments may be practiced without those specifically defined matters. Also, well-known functions or constructions are not described in detail since they would obscure the application with unnecessary detail.

FIG. 1 is a view illustrating an image-forming system according to an embodiment of the disclosure.

Referring to FIG. 1, an image-forming system 10 according to this embodiment may include a portable image-forming device 100 and a portable display device 400.

The portable image-forming device 100 is a printing device for exposing an instant film by using an exposure member which is manually operated. The portable image-forming device 100 may print a screen of the portable display device 400 (hereinafter referred to as 'display device') by exposing and developing the screen on the instant film. A detailed description on a structure and operations of the portable image-forming device 100 will be provided below with reference to FIGS. 2 to 56.

The display device 400 displays an image. The display device 400 corrects a location, image quality, and brightness of a displayed image such that the portable image-forming device 100 may print the image with good image quality. To be specific, in the conventional art, various image quality-correcting operations are performed by a portable image-forming device. However, the portable image-forming device 100 according to this embodiment is operated in a non-electric/non-electronic manner, and thus, various correcting operations are performed by the display device 400. A detailed description on a structure and operations of the display device 400 will be provided below with reference to FIG. 57.

As described above, the image-forming system 10 according to this embodiment may perform a printing operation by using a portable image-forming device which does not require power supply, thereby enhancing portability with respect to a portable image-forming device.

Figure 2:
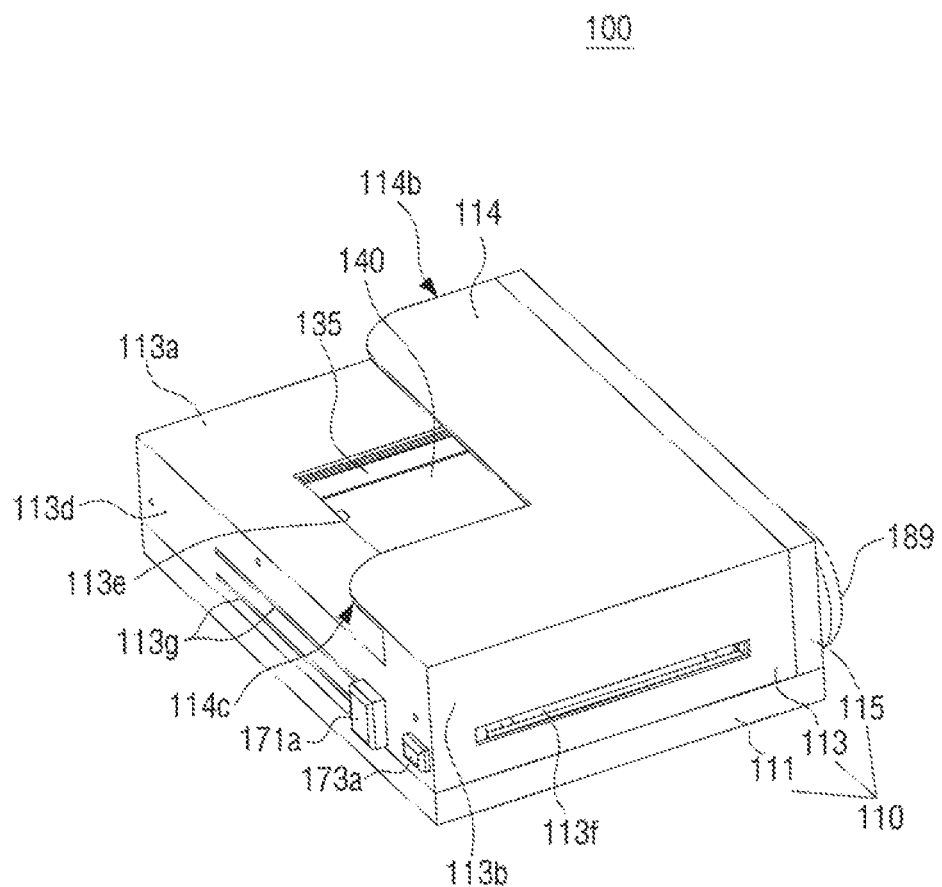
FIG. 2 is a perspective view illustrating a portable image-forming device according to the first embodiment of the disclosure.
Figure 3:
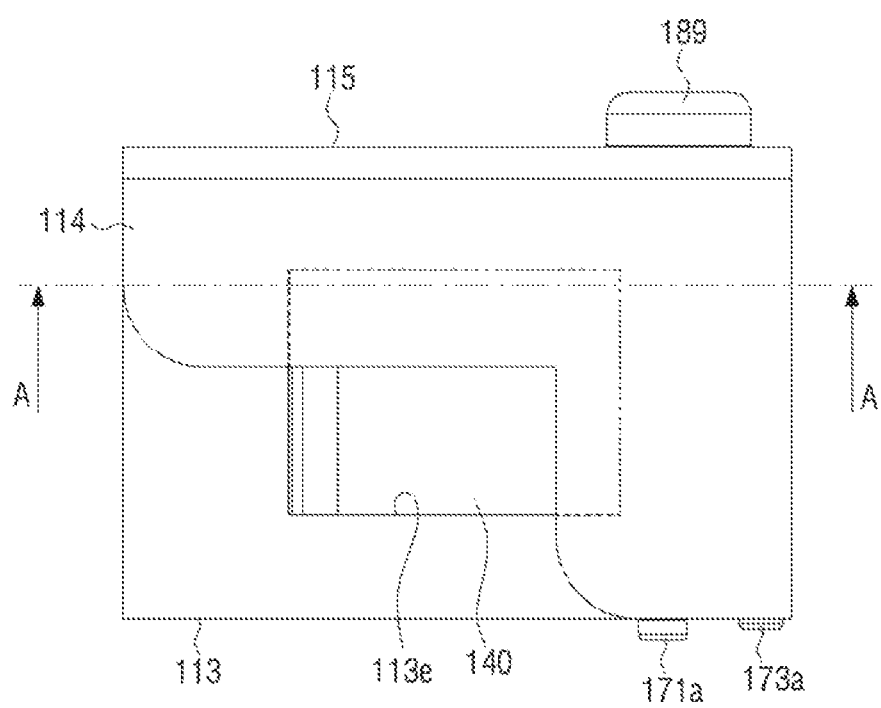
FIG. 3 is an elevation view illustrating the portable image-forming device according to the first embodiment of the disclosure.
Figure 4:
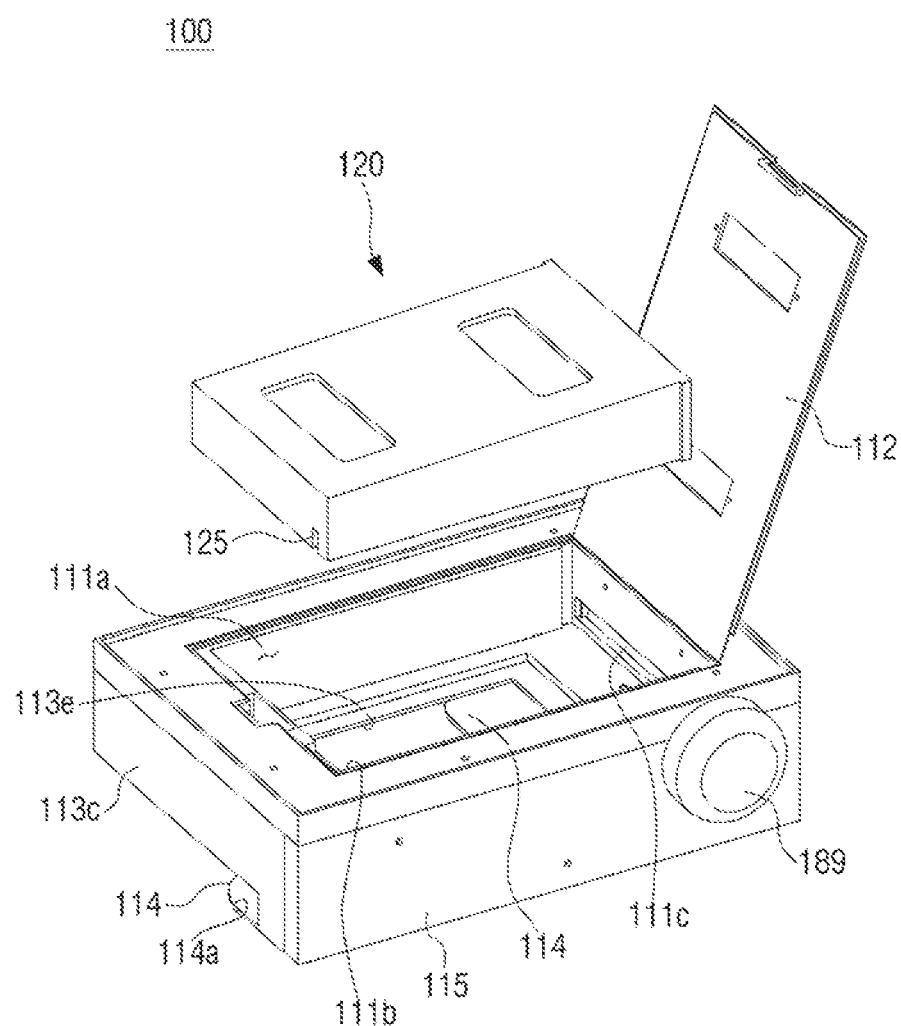
FIG. 4 is a perspective view provided to describe an operation of mounting a film cassette in the portable image-forming device according to the first embodiment of the disclosure.
Figure 5:
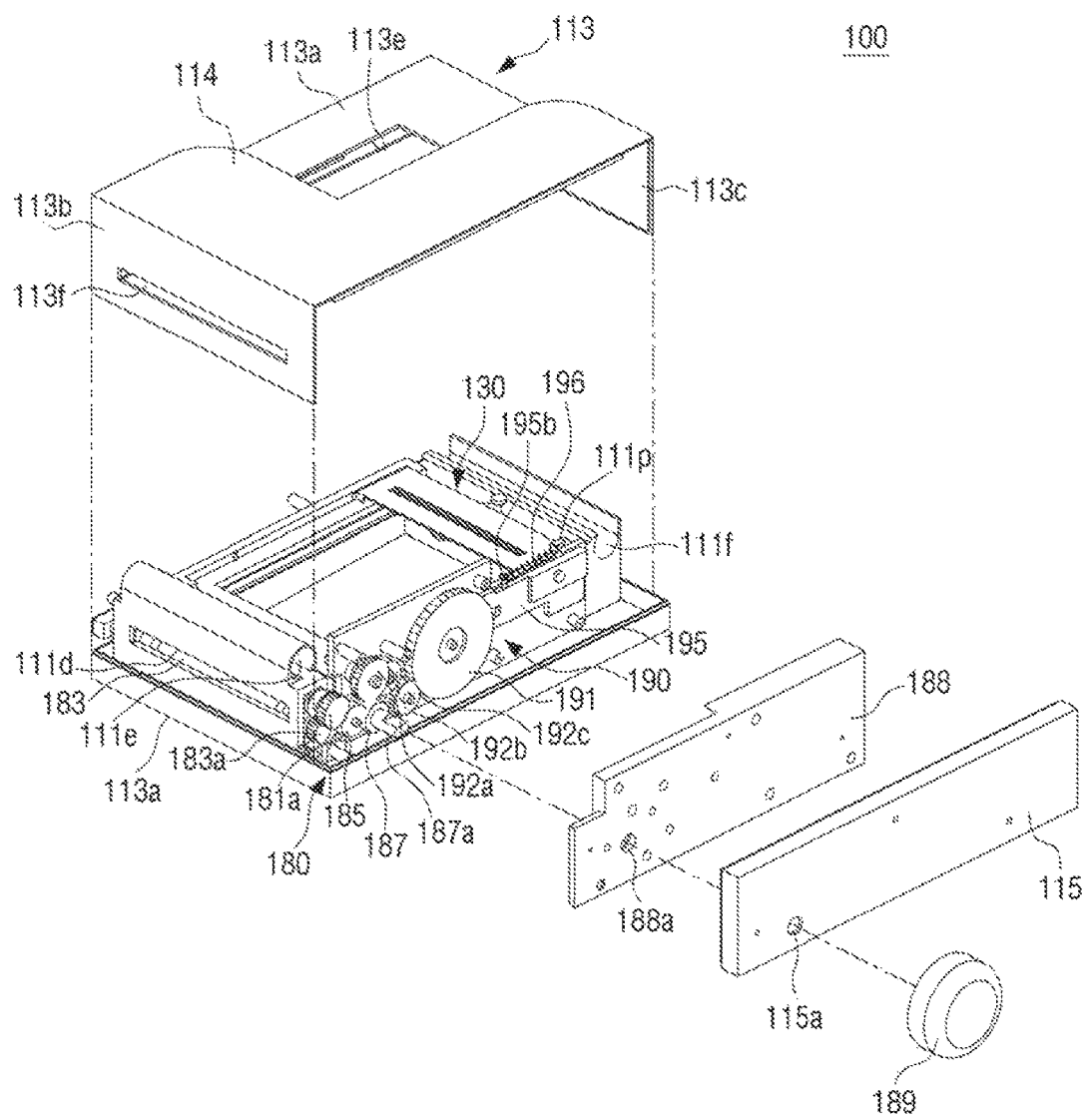
FIG. 5 is an exploded perspective view of the portable image-forming device without a shading member according to the first embodiment of the disclosure.
Figure 6:
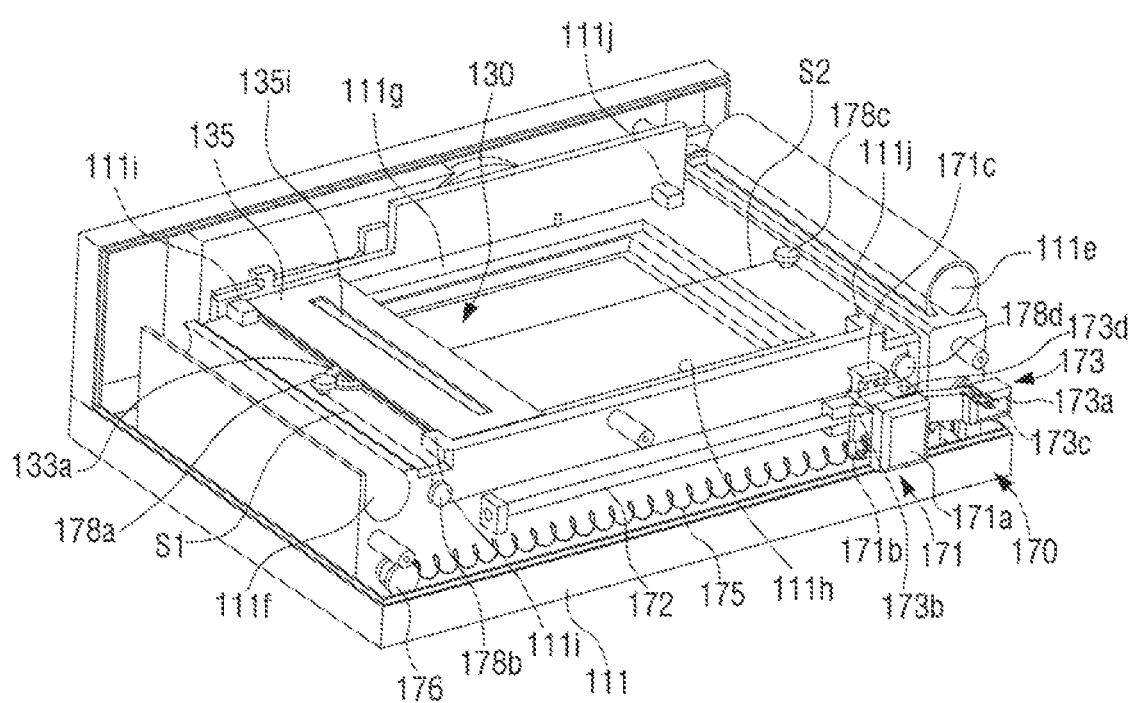
FIG. 6 is a perspective view of the portable image-forming device without an upper housing and the shading member according to the first embodiment of the disclosure.

FIG. 2 is a perspective view illustrating a portable image-forming device according to an embodiment of the disclosure, FIG. 3 is an elevation view illustrating the portable image-forming device according to an embodiment of the disclosure, FIG. 4 is a perspective view provided to describe an operation of mounting a film cassette in the portable image-forming device according an embodiment of the disclosure, FIG. 5 is an exploded perspective view of the portable image-forming device without a shading member according to an embodiment of the disclosure, and FIG. 6 is a perspective view of the portable image-forming device without an upper housing and the shading member according to an embodiment of the disclosure.

Referring to FIGS. 2 to 6, the portable image-forming device 100 according to an embodiment may include a housing 110, an exposure member 130, a shading member 150, a damping unit 155, 156, 157, a traction unit 170, a developing agent-spreading member 180, and an instant film setting unit 190.

The housing 110 may include a lower housing 111, an upper housing 113, and a lateral housing 115.

The lower housing 111 is provided with the exposure member 130, the shading member 150, the traction unit 170, and the developing agent-spreading member 180 in an operable manner at each part of the lower housing 111. That is, the exposure member 130 and the shading member 150 are disposed on an upper side of the lower housing 111, the traction unit 170 is disposed on one side of the lower housing 111, a plurality of slave gears 192a, 192b, 192c and the instant film setting unit 190 are disposed on the other side of the lower housing 111, and the developing agent-spreading member 180 is disposed on a front end of the lower housing 111.

The lower housing 111 has a space 111a in an inside thereof. The space 111a is an element in which the instant film cassette 120 is mounted. The lower housing 111 has a mounting hole 111b for mounting the instant film cassette 120 in the space 111a and a door 112 for opening or closing the mounting hole 111b at a lower side thereof.

The lower housing 111 is provided with a mounting space 111b (refer to FIG. 10) on the front end thereof. The mounting space 111b is an element in which a couple of pressure rollers 181, 183 of the developing agent-spreading member 180 are disposed. On wall surfaces which face each other forming the mounting space 111b, a first passage hole 111c and a second passage hole 111d for transmitting an instant film 140 are formed to correspond to each other.

As illustrated in FIG. 6, the lower housing 111 is provided with a first cylindrical groove 111e and a second cylindrical groove 111f in which a part of the shading member 150 is inserted on an upper surface thereof. A first guide unit 111g and a second guide unit 111h are formed between the first and second cylindrical grooves 111e, 111f. Both sides of the exposure member 130 are slidably seated between the first guide unit 111g and the second guide unit 111h. In this case, the first guide unit 111g and the second guide unit 111h are provided with a first limiting protrusion 111i and a second limiting protrusion 111j for limiting a movement range of the exposure member 130.

As illustrated in FIGS. 4 and 5, the upper housing 113 is detachably engaged with the lower housing 111 so as to cover the upper side, the front end, a rear end, and one lateral side simultaneously. In this case, the upper housing 113 has a first portion 113a for covering the upper side of the lower housing 111, a second portion 113b for covering the front end of the lower housing 111, a third portion 113c for covering the rear end of the lower housing 111, and a fourth portion 113d for covering the one lateral side of the lower housing 111, which are formed as a single body.

An outer surface of the first portion 113a is formed as a flat surface such that the display device 400 may come into contact with the upper housing 113 stably. In addition, referring to FIG. 2, an incident window 113e corresponding to a screen 401 of the display device 400 is formed in a penetrating manner on the first portion 113a. A light radiating from the screen 401 of the display device 400 falls onto a photosensitive surface 141 (refer to FIG. 23A) of the instant film 140 through the incident window 113e. In this case, the light radiating from the screen 401 falls onto the photosensitive surface 141 of the instant film 140 with a different light quantity according to a contrast of an image 403 displayed in the screen 401 of the display device 400.

A discharging hole 113f for discharging the instant film 140 conveyed through the developing agent-spreading member 180 to an outside of the portable image-forming device 100 is formed on the second portion 113b.

The third portion 113c covers the rear end of the lower housing 111 so as to be completely closed. The fourth portion 113d has a plurality of guide holes 113g for guiding a linear movement of a lever 171, in a longitudinal direction of the fourth portion 113d.

The lateral housing 115 is engaged with the other side of the lower housing 111 so as to cover the plurality of slave gears 192a, 192b, 192c and the instant film setting unit 190.

A fixing unit 114 is formed in a shape of a thin plate. The fixing unit 114 is disposed roughly in parallel to the first portion 113a of the lower housing 113 with a certain distance so as to provide an inserting space 114a for inserting the display device 400 between the upper housing 113 and the fixing unit 114.

As illustrated in FIG. 2, the fixing unit 114 has a first opening 114b and a second opening 114c formed in a second direction such that any one of various display devices in different sizes is easily inserted into the inserting space 114a of the display device 400.

Figure 7:
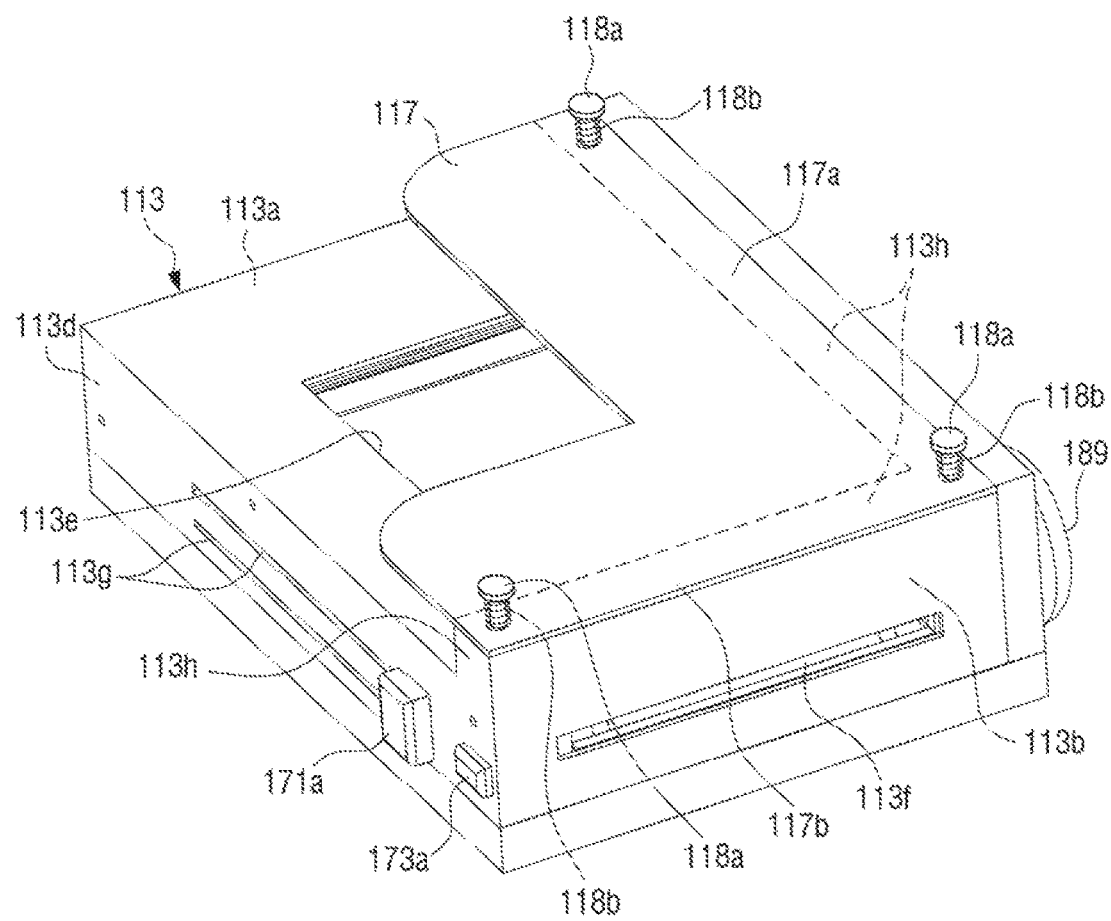
FIG. 7 is a view provided to describe another example of a fixing unit of a portable image-forming device of FIG. 2.
Figure 8:
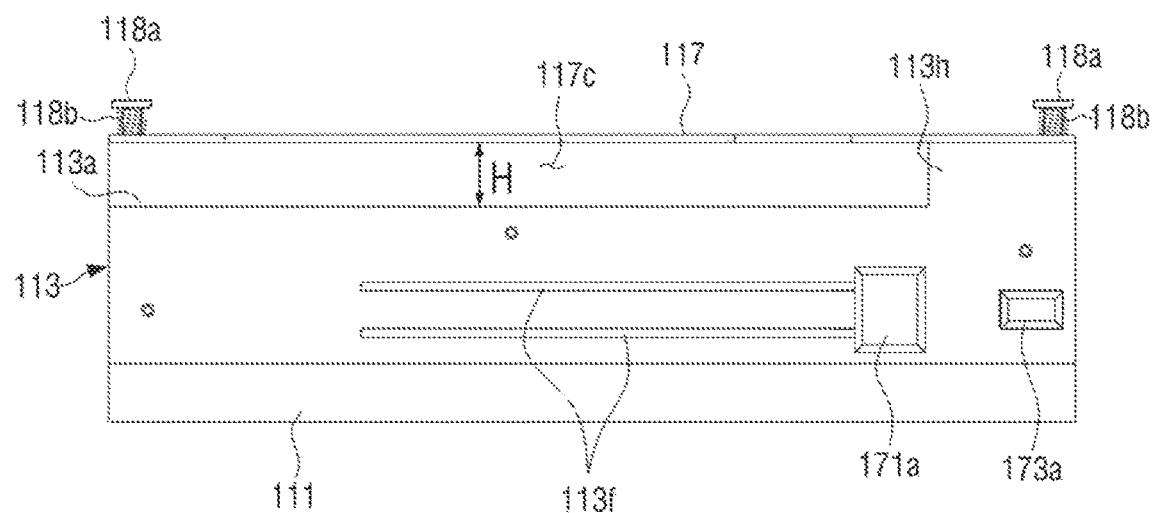
FIG. 8 is a side view of the portable image-forming device of FIG. 7.
Figure 9:
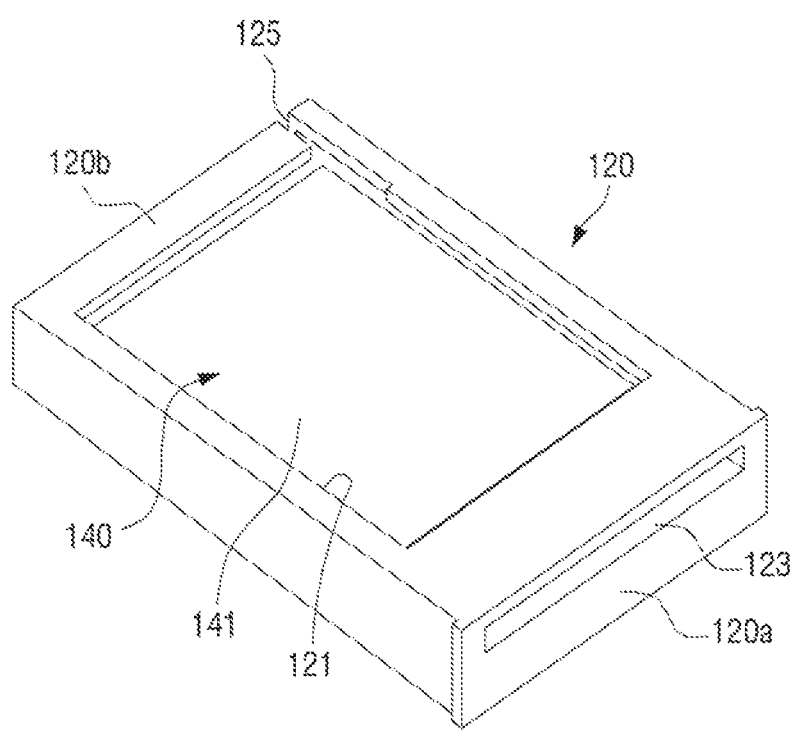
FIG. 9 is a perspective view of a film cassette of FIG. 4.

FIG. 7 is a view provided to describe another example of a fixing unit of the portable image-forming device of FIG. 2, FIG. 8 is a side view of the portable image-forming device of FIG. 7, and FIG. 9 is a perspective view of a film cassette of FIG. 4.

The fixing unit 114 is extended from the upper housing 113 as a single body so as not to be detached from the upper housing 113, but not limited thereto. As illustrated in FIGS. 7 and 8, a fixing unit 117 may be realized so as to be detachable from the upper housing 113.

That is, referring to FIG. 7, the fixing unit 117 is realized as a separate member from the upper housing 113. In this case, the fixing unit 117 has ends 117a, 117b which are seated on a protrusion 113h projected along an end of the first portion 113a of the upper housing 113.

The fixing unit 117 may remain being attached to the protrusion 113h of the upper housing 110 by means of a plurality of guide pins 118a and may move in a direction towards the first portion 113a of the upper housing 110 or in a direction away from the first portion 113a of the upper housing 110, along the plurality of guide pins 118a. In this case, each of the plurality of guide pins 118a is engaged with a coil spring 118b, and the fixing unit 117 adheres to the protrusion 113h by means of the coil spring 118b.

Referring to FIG. 8, in the fixing unit 117, a height (H) of an inserting space 117c in which the display device 400 is inserted may vary to correspond to a thickness of the display device 400. Accordingly, different types of display device 400 having a different thickness may be fixed to the upper housing 113 stably through the fixing unit 117.

Referring to FIG. 9, a plurality of instant films 140 are charged into the instant film cassette 120 in a laminated state. An exposure hole 121 is formed on one surface of the instant film cassette 120 such that the photosensitive surface 141 of the instant film 140 is exposed.

The exposure hole 121 is disposed to roughly correspond to the incident window 113e of the upper housing 113 upon the instant film cassette 120 being mounted in the space 111a of the lower housing 111.

The instant film cassette 120 is provided with an instant film discharging hole 123 on a front end 120a thereof and is provided with a through groove 125 on a rear end 120b thereof. The through groove 125 is an element through which a hook 197g of a pusher 197 passes such that the hook 197g pushes a rear end 140b (refer to FIG. 21A) of the instant film cassette 120 without being interrupted by the rear end 120b.

Figure 10:
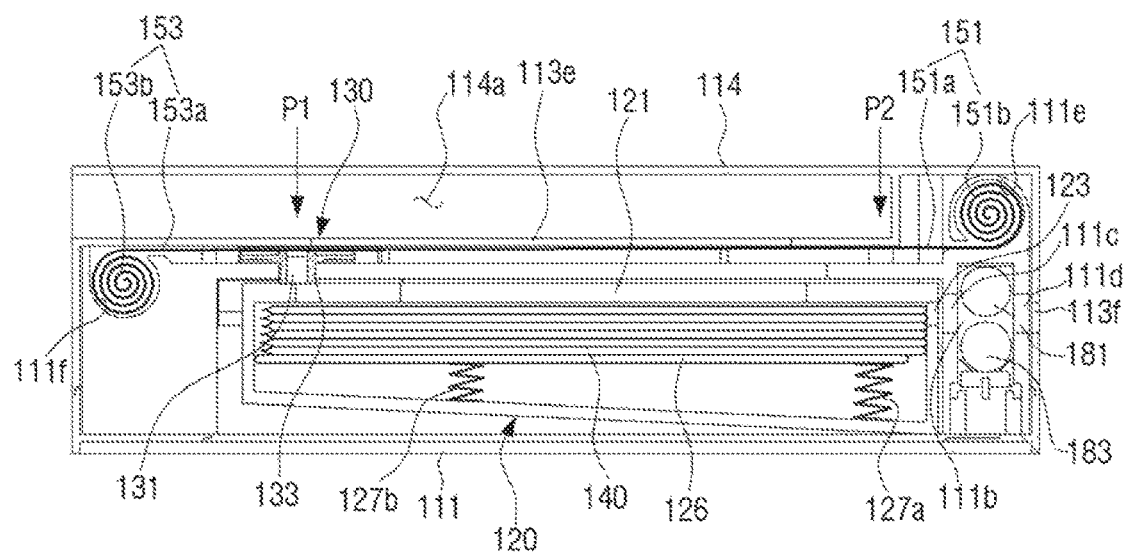
FIG. 10 is a sectional view taken along Line A-A of FIG. 3.

As illustrated in FIG. 10, the instant film cassette 120 may include a supporting plate 126 in which the instant film 140 is stored in an inside thereof. The supporting plate 126 is elastically supported by a plurality of coil springs 127a, 127b toward the exposure hole 121. Accordingly, the supporting plate 126 pressurizes the plurality of instant films 140 upwardly such that the instant film 140 located at the uppermost position among the laminated the instant films 140 adheres to an inner surface of an upper side of the instant film cassette 120. Accordingly, upon the instant film setting unit 190 being operated, the instant film 140 located at the uppermost position may be discharged through an instant film discharging hole 123.

The exposure member 130 exposes the photosensitive surface 141 of the instant film 140 to the light radiating from the screen 401 of the display device 400 while moving along the incident window 113e. The photosensitive surface 141 of the instant film 140 is disposed inside the housing 110.

Figure 11:
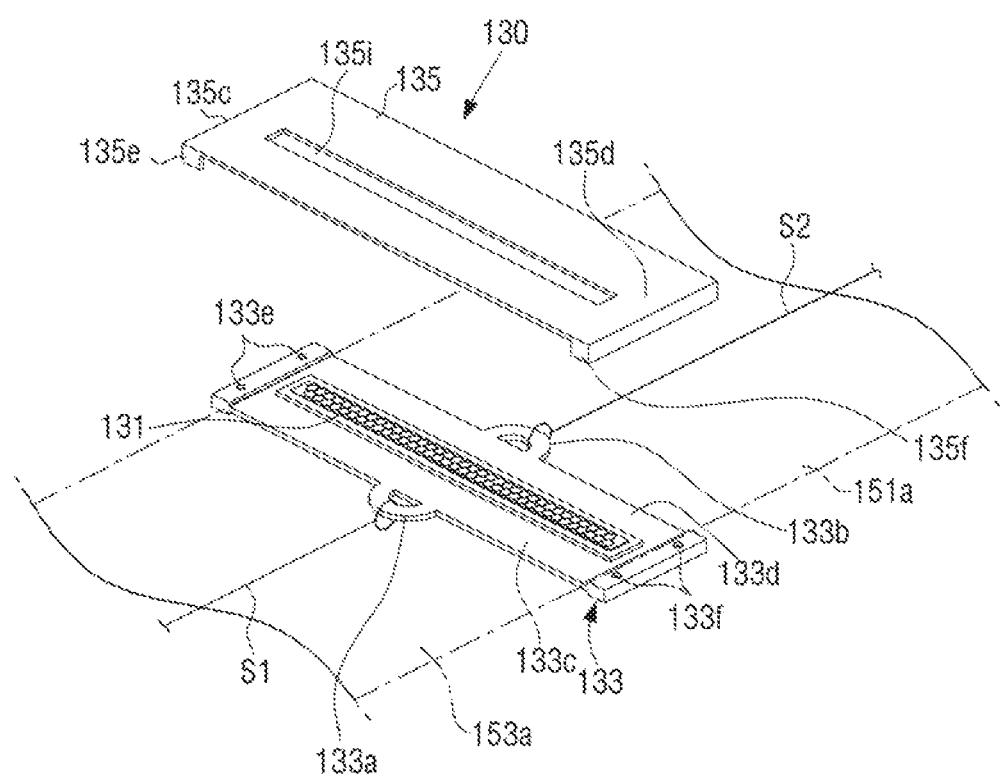
FIG. 11 is an exploded perspective view illustrating a part of an exposure member and a shading member of the portable image-forming device according to the first embodiment of the disclosure.
Figure 12:
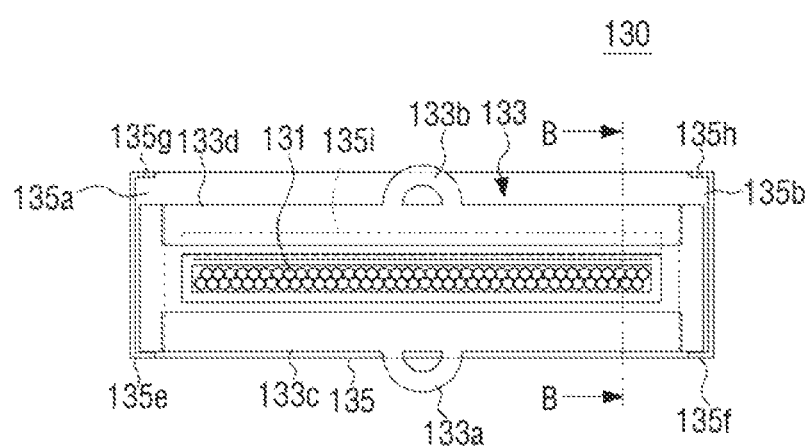
FIG. 12 is a bottom view illustrating the exposure member of FIG. 11.
Figure 13:
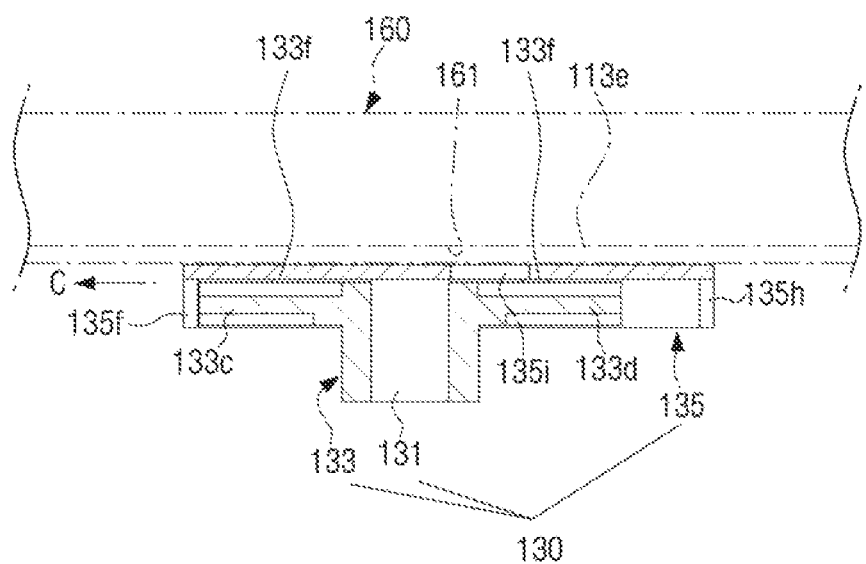
FIG. 13 is a sectional view taken along Line B-B of FIG. 12, provided to describe a state where a lens of the exposure member is closed by a shutter.
Figure 14:
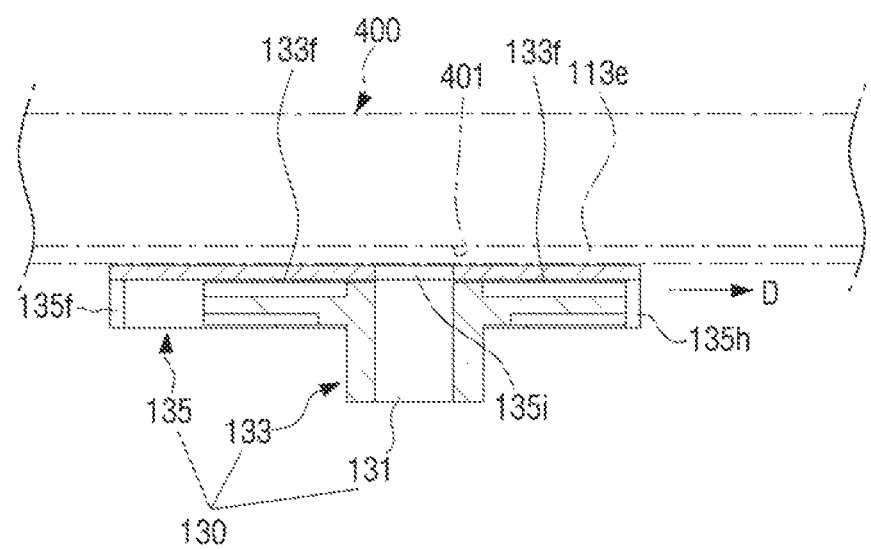
FIG. 14 is a view provided to describe a state where the lens of the exposure member of FIG. 13 is opened by the shutter.

FIG. 10 is a sectional view taken along Line A-A of FIG. 3, FIG. 11 is an exploded perspective view illustrating a part of an exposure member and a shading member of a portable image-forming device according to an embodiment of the disclosure, FIG. 12 is a bottom view illustrating the exposure member of FIG. 11, FIG. 13 is a sectional view taken along Line B-B of FIG. 12, provided to describe a state where a lens of the exposure member is closed by a shutter, and FIG. 14 is a view provided to describe a state where the lens of the exposure member of FIG. 13 is opened by the shutter.

Referring to FIGS. 10 to 14, the exposure member 130 may include a lens array 131, a frame 133, and a shutter 135.

The lens array 131 refers to a small lens group using a difference of a refractive index in a glass fiber. The lens array 131 is a common lens array which is employed when a distance between an object to be scanned and a reader is narrow, for example, a scanner.

As illustrated in FIG. 10, the frame 133 moves the lens array 131 to reciprocate between a pre-exposure position (P1) and a post-exposure position (P2). As illustrated FIG. 11, the frame 133 has a first string (S1) and a second string (S2) which are fixed to a first loop 133a on one end 133c of the frame 133 and a second loop 133b on the other end 133d of the frame 133, respectively. Accordingly, the frame 133 is pulled in a direction of being pulled by the first string (S1) or by the second string (S2). A detailed description on the first string (S1) or the second string (S2) will be provided below.

The frame 133 has one end 133d connected to one end 151a of a first shading film 151 of the shading member 150 and the other end 133c connected to one end 153a of a second shading film 153 of the shading member 150. Accordingly, the frame 133 moves between the pre-exposure position (P1) and the post-exposure position (P2) along with the shading member 150.

The frame 133 is provided with a plurality of contact protrusions 133e, 133f on an upper surface of each of both sides thereof. The plurality of contact protrusions 133e, 133f minimize a contact area between the frame 133 and lower surfaces 135a, 135b of the shutter 135. In this case, upper surfaces 135c, 135d of the shutter 135 come into contact with a lower surface of the first portion 113a of the upper housing 113, and the contact area is broader than a contact area between the frame 133 and the lower surface of the shutter 135 by the plurality of contact protrusions 133e, 133f.

Accordingly, upon the frame 133 being pulled by the first string (S1) or by the second string (S2), a frictional force between the shutter 135 and the lower surface of the first portion 113a of the upper housing 113 is greater than a frictional force between the shutter 135 and the frame 133. Consequently, a moving speed of the shutter 135 is slower than a moving speed of the frame 133.

As illustrated in FIG. 13, upon the frame 133 moving from the post-exposure position (P2) to the pre-exposure position (P1) (Direction C), the one end 133c of the frame 133 moves pushing a first stopping bump 135e, 135f of the shutter 135 according to a difference between the moving speed of the frame 133 and the moving speed of the shutter 135. In this case, a position of a light through hole 135i of the shutter 135 is misaligned with a position of the lens array 131, and thus, the lens array 131 is closed by the shutter 135. Consequently, the instant film 140 is shielded by the shutter 135 and the shading member 150 while the lens array 131 moves from the post-exposure position (P2) to the pre-exposure position (P1).

By contrast, as illustrated in FIG. 14, upon the frame 133 moving from the pre-exposure position (P1) to the post-exposure position (P2) (Direction D), the other end 133d of the frame 133 moves pushing a second stopping bump 135g, 135h of the shutter 135 according to the difference between the moving speed of the frame 133 and the moving speed of the shutter 135. In this case, the position of the light through hole 135i of the shutter 135 is changed to correspond to the position of the lens array 131, and thus, the lens array 131 is opened. Accordingly, the light radiating from the screen 401 of the display device 400 falls onto the instant film 140 through the lens array 131 and the photosensitive surface 141 of the instant film 140 is exposed while the lens array 131 moves from the pre-exposure position (P1) to the post-exposure position (P2).

The shading member 150 may be made of an opaque film having an intrinsic elastic force. The shading member 150 may include the first shading film 151 and the second shading film 153.

Referring to FIG. 10, the first shading film 151 is inserted into the first cylindrical groove 111e in state where the other end 151b is rolled in a circle. The other end 151b is unrolled and spread in response to the frame 133 moving to the pre-exposure position (P1), and then rolled again by the intrinsic elastic force in response to the frame 133 moving to the post-exposure position (P2).

In the same manner, the second shading film 153 is inserted into the second cylindrical groove 111f in state where the other end 153b is rolled in a circle. The other end 153b is unrolled and spread in response to the frame 133 moving to the post-exposure position (P2), and then rolled again by the intrinsic elastic force in response to the frame 133 moving to the pre-exposure position (P1).

Figure 15:
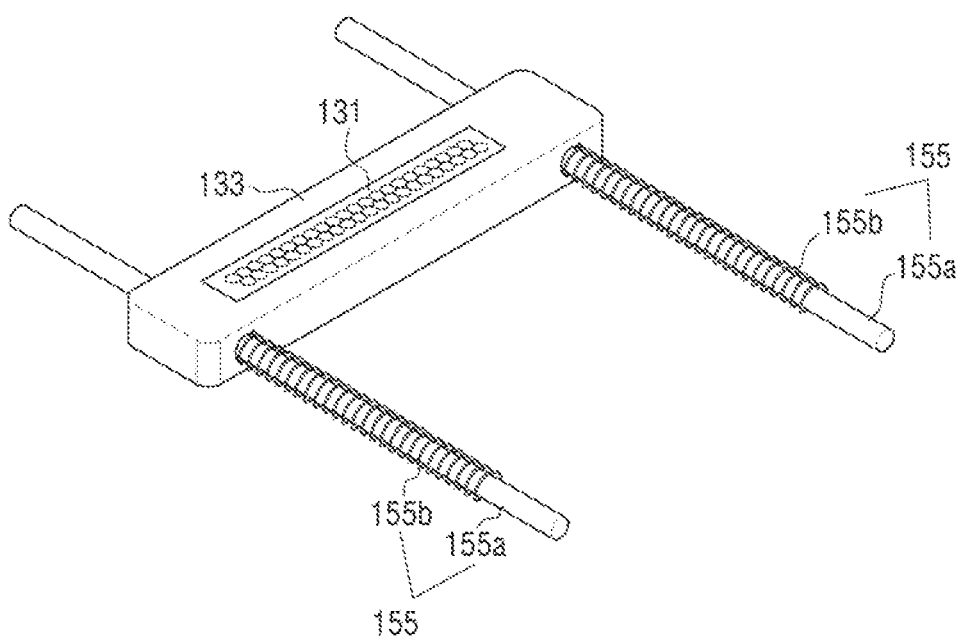
FIGS. 15 to 17 are views illustrating diverse damping structures for controlling a moving speed of a lens when the lens moves from a pre-exposure position to an exposure position.
Figure 16:
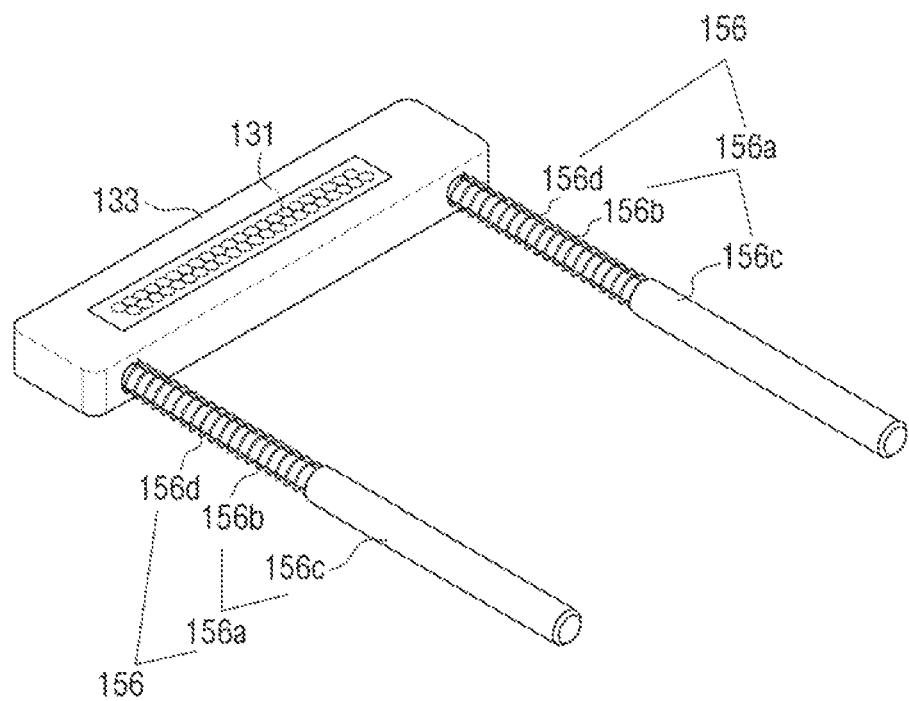
Figure 17:
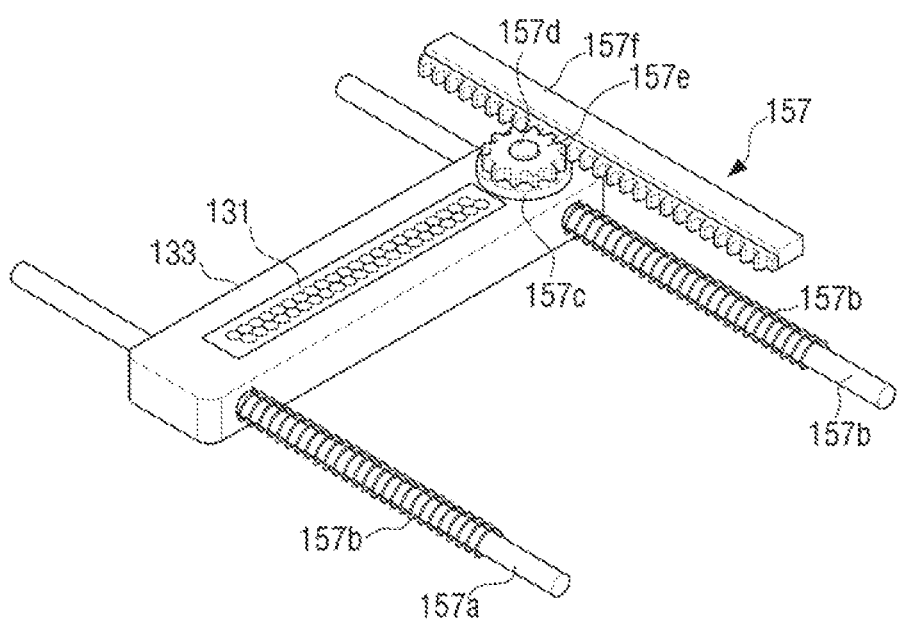

The portable image-forming device 100 may control an exposure amount by properly adjusting a moving speed of the lens array 131 which moves from the pre-exposure position (P1) to the post-exposure position (P2) such that an image printed on the instant film 140 is shown clearly. For doing this, the portable image-forming device 100 may include a damping unit 155, 156, 157 in various structures as illustrated in FIGS. 15 to 17. Referring to FIGS. 15 to 17, the lens array 131 engaged with the shutter 135, and the frame 133 is pulled by the first string (S1) and the second string (S2) and connected to the shading member 150 in the same manner as in the frame 133 of FIG. 11. However, a detailed structure on the frame 133, the first string (S1), the second string (S2), and the shading member 150 is omitted for convenience in explanation.

FIGS. 15 to 17 are views illustrating diverse damping structures for controlling a moving speed of a lens when the lens moves from a pre-exposure position to an exposure position.

Referring to FIG. 15, the damping unit 155 may include a couple of guide rails 155a which penetrate both sides of the frame 133 and a couple of elastic members 155b engaged with each of the guide rails 155a.

The couple of guide rails 155a are disposed in parallel to each other, and both ends of the guide rails 155a are fixed on a certain position of the lower housing 111, respectively. The couple of guide rails 155a guide the frame 133 to reciprocate between the pre-exposure position (P1) and the post-exposure position (P2).

The couple of elastic members 155b include of a coil spring. The couple of elastic members 155b are located on a side of the discharging hole 113f for discharging the instant film 140 (hereinafter referred to as 'instant film discharging hole 113f') of the upper housing 113 and support the frame 133 elastically. Accordingly, the couple of elastic members 155b may reduce a moving speed of the lens array 131 upon the lens array 131 moving from the pre-exposure position (P1) to the post-exposure position (P2) such that proper exposure is applied to the instant film 140 through the lens array 131.

Referring to FIG. 16, the damping unit 156 may include a couple of common linear dampers 156a for elastically supporting the frame 133 and a couple of elastic members 156d engaged with each of the linear dampers 156a.

The couple of linear dampers 156a are disposed in parallel to each other and located on a side of the instant film discharging hole 113f with reference to the lens array 131. The couple of linear dampers 156a have pistons 156b and cylinders 156c, respectively. One end of each of the pistons 156b is connected to one side of the frame 133, and one end of each of the cylinders 156c is fixed on a certain position of the lower housing 111.

The elastic members 156d include of a coil spring and are engaged with each of the pistons 156b so as to support the frame 133 elastically.

In this case, in the same manner as in the damping unit 155 described above, the damping unit 156 may reduce the moving speed of the lens array 131 upon the lens array 131 moving from the pre-exposure position (P1) to the post-exposure position (P2) such that the proper exposure is applied to the instant film 140.

Referring to FIG. 17, the damping unit 157 may include a couple of guide rails 157a which penetrate both side of the frame 133, a couple of elastic members 157b engaged with the guide rails 157a, a common rotary damper 157c, a pinion 157e, and a rack 157f.

The couple of guide rails 157a are disposed in parallel to each other and have both ends respectively being fixed on a certain position of the lower housing 111. The couple of guide rails 157a guide the frame 133 so as to reciprocate between the pre-exposure position (P1) and the post-exposure position (P2).

The couple of elastic members 157b include of a coil spring and are located on the side of the instant film discharging hole 113f with reference to the lens array 131 so as to support the frame 133 elastically.

The rotary damper 157c may be disposed on one side of the upper surface of the frame 133. The pinion 157e is engaged with a rotary shaft 157d of the rotary damper 157c. The pinion 157e rotates in association with the rotary shaft 157d and is meshed with the rack 157f fixed on a certain position of the lower housing 111.

The damping unit 157 may reduce the moving speed of the lens array 131 upon the lens array 131 moving from the pre-exposure position (P1) to the post-exposure position (P2) by means of the couple of elastic members 157b and the rotary damper 157c such that the proper exposure is applied to the instant film 140.

In this case, the damping unit 157 may be replaced with a common mechanical vibrator (not shown), needless to say.

The traction unit 170 is a component for moving the exposure member 130 from the post-exposure position (P2) to the pre-exposure position (P1) by a user's force. The traction unit 170 is disposed on one side of the lower housing 111. Referring to FIG. 6, the traction unit 170 may include a lever 171, a locking member 173, an elastic member 175, and a first string (S1), and a second string (S2).

The lever 171 is slidably engaged with a guide shaft 172 disposed along one side of the lower housing 111. In this case, a part 171a of the lever 171 is exposed to outside as illustrated in FIG. 2 so as to allow a users manipulation.

The locking member 173 may include a locking release button 173a, a stopping unit 173b for locking the lever 171, an elastic member 173c for elastically supporting the locking release button 173a.

The locking release button 173a penetrates the fourth portion 113d of the upper housing 113 and is exposed to outside the portable image-forming device 100 so as to allow a user's manipulation. The locking release button 173a operates the stopping unit 173b extended from the locking release button 173a with reference to a hinge shaft 173d to release a locking state of the lever 171. The elastic member 173c supports the locking release button 173a elastically such that the stopping unit 173b maintains the locking state of the lever 171.

The elastic member 175 has one end fixed to one lateral side 171b of the lever 171 and the other end fixed to a first fixing pin 176 formed on the lower housing 111 such that the lever 171 is pulled in an opposite direction of the instant film discharging hole 113f.

Accordingly, in response to the locking state of the lever 171 being released as the user presses the locking release button 173a in a state where the locking operation has been performed by the locking member 173, the lever 171 moves in a direction away from a locking position by the elastic member 175. At the same time, the exposure member 130 moves from the pre-exposure position (P1) to the post-exposure position (P2).

One end of each of the first string (S1) and the second string (S2) is fixed to the other lateral side 171c of the lever 171, and the other end of each of the first string (S1) and the second string (S2) is fixed to the first loop 133a and the second loop 133b. In this case, the first and second strings (S1, S2) are mounted in a plurality of first fixing pins 178a, 178b and a plurality of second fixing pins 178c, 178d fixed to the lower housing 111. Accordingly, the first and second strings (S1, S2) remain being strained such that the exposure member 130 is operated immediately in response to the level 171 being moved.

Referring to FIGS. 5 and 10, the developing agent-spreading member 180 may include a couple of pressure rollers 181, 183, a slave gear 185, a main gear 187, and a rotation knob 189.

The couple of pressure rollers 181, 183 are rotatably disposed on a mounting space 111b (refer to FIG. 10) of the lower housing 111. In this case, it is preferred that the couple of pressure rollers 181, 183 maintain a certain distance with respect to each other so as to feed the instant film 140 in a pressurized state.

The couple of pressure rollers 181, 183 include gears 181a, 183a on one side thereof, respectively. The gears 181a, 183a are meshed so as to be operated with other. Accordingly, in response to one of the gears 181a,183a rotating, the couple of pressure rollers 181, 183 rotate simultaneously.

The slave gear 185 is rotatably engaged with one side of the lower housing 111 and meshed with any one of the gears 181a, 183a of the couple of pressure rollers 181, 183. Accordingly, the slave gear 185 may transmit a torque of the main gear 187.

The main gear 187 is rotatably engaged with one side of the lower housing 111 and meshed with the slave gear 185. In this case, an engagement unit 187a for being engaged with the rotation knob 189 is extended from the main gear 187. The engagement unit 187a penetrates a through hole 188a of a guide panel 188 and a through hole 115a and the lateral housing 115.

The rotation knob 189 is engaged with the engagement unit 187a of the main gear 187 and exposed to outside the lateral housing 115. The rotation knob 189 is rotated by a users manipulation and rotates the main gear 187.

As described above, the developing agent-spreading member 180 pressurizes and feeds the instant film 140 introduced by the instant film setting unit 190 and discharges the instant film 140 through the instant film discharging hole 113f. In this case, the couple of pressure rollers 181, 183 spread a liquid developing agent 145 (refer to FIG. 24) provided in an inside of the front end of the instant film 140 over the entire instant film 140 gradually while feeding the instant film 140.

Figure 18:
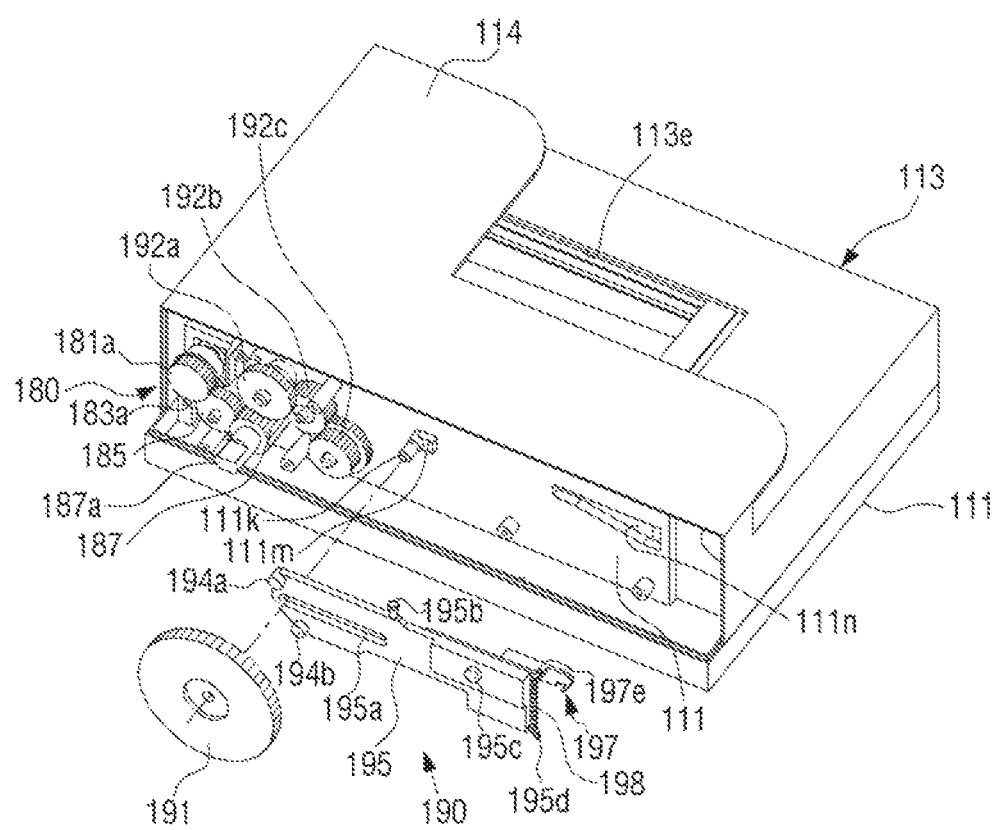
FIG. 18 is a perspective view illustrating a state where a movable member and a movable gear of the instant film setting unit of FIG. 4 are detached from one side of a lower housing.

FIG. 18 is a perspective view illustrating a state where a movable member and a movable gear of the instant film setting unit of FIG. 4 are detached from one side of the lower housing.

The instant film setting unit 190 introduces a front end 140a (refer to FIG. 24) of the instant film 140 into the couple of pressure rollers 181, 183 in association with the main gear 187 which is rotated by an operation of the rotation knob 189 on one side of the lower housing 111 in which the main gear 187 is disposed. Referring to FIG. 18, the instant film setting unit 190 may include a movable gear 191, a movable member 195, and a pusher 197.

The movable gear 191 is rotatably engaged with a shaft protrusion 111k protruding from one side of the lower housing 111. In this case, the movable gear 191 is rotated by being supplied with the torque of the main gear 187 through the plurality of slave gears 192a, 192b, 192c which are rotatably disposed on one side of the lower housing 111 and meshed with each other.

The movable gear 191 drives a movable member 195 toward the couple of pressure rollers 181, 183 through a cam structure formed between the movable gear 191 and the movable member 195.

The cam structure may include a cam protrusion 193 (refer to FIG. 22A) formed as a single body with the movable gear 191 on one side of the movable gear 191 which faces the movable member 195 and first and second cam followers 194a, 194b formed on one side of the movable member 195 so as to come into com-contact with the cam protrusion 193.

The cam protrusion 193 has a contact surface 193a (refer to FIG. 22A) for coming into contact with the first and second cam followers 194a, 194b. The contact surface 193a is curved with curvature greater than curvature of the movable gear 191 from a point adjacent to a center of the movable gear 191 to a point adjacent to an outer circumference of the movable gear 191.

Figure 22A:
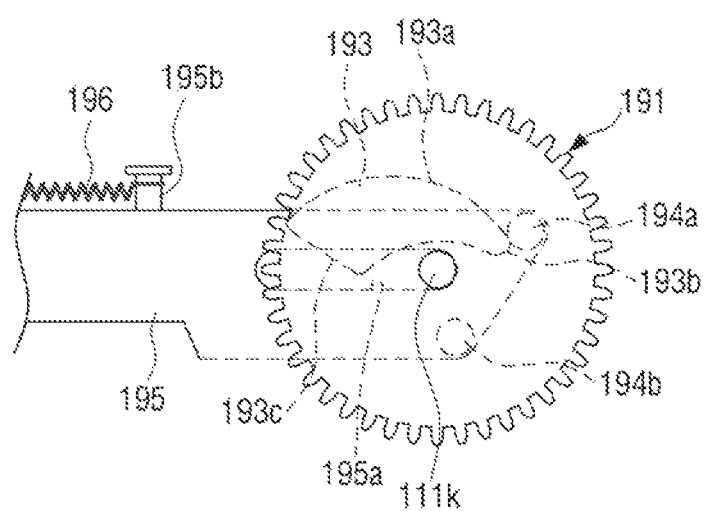
FIGS. 22A to 22C are views sequentially illustrating a process of operating an instant film setting unit.

Referring to FIG. 22A, the cam protrusion 193 has the other end 193c broader than one end 193b. Accordingly, upon the movable gear 191 rotating counterclockwise, the movable gear 191 is not rotated by being interrupted by the second cam follower 194b, and thus, the movable gear 191 rotates only in one direction (clockwise).

The movable member 195 moves in a direction parallel to the conveying direction of the instant film 140 in association with the rotation of the movable gear 187 so as to push the front end 140a of the instant film 140 to a location in which the front end 140a is meshed with the couple of pressure rollers 181, 183 by means of the pusher 197 engaged with the movable member 195.

The movable member 195 has an elongated hole 195a through which the shaft protrusion 111k passes and in which a guide protrusion 111m is slidably inserted. The movable member 195 is elastically supported by the elastic member 196 (refer to FIG. 5) with respect to the lower housing 111. In this case, the elastic member 196 has one end fixed to a stopping protrusion 195b of the movable member 195 and the other end fixed to a stopping protrusion 111p of the lower housing 111. Accordingly, the movable member 195 introduces the instant film 140 into the couple of pressure rollers 181, 183 through the cam structure according to the rotation of the movable gear 191. In response to the com-contact being released, the instant film 140 returns to an original position by the elastic member 196.

The movable member 195 is provided with a guide protrusion 195c on one surface thereof. The guide protrusion 195c is slidably inserted into an elongated hole (not shown) formed on a certain location of an inner circumference of a guide panel 188. The guide protrusion 195c guides a linear movement of the movable member 195 along with the guide protrusion 111m of the lower housing 111.

Figure 19:
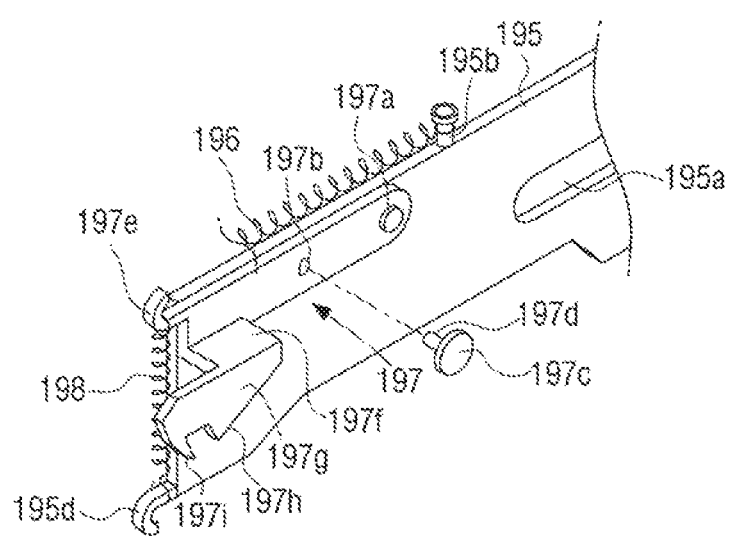
FIG. 19 is a perspective view illustrating a rear end of the movable member of FIG. 18.

FIG. 19 is a perspective view illustrating a rear end of the movable member of FIG. 18.

As illustrated in FIG. 19, the pusher 197 is disposed on one surface at a rear end of the movable member 195. One end of the pusher 197 is hinge-engaged with the movable member 195 by means of a hinge pin 197a. The pusher 197 is provided with a limiting hole 197b, roughly on a center thereof.

An engaging protrusion 197d of a fixing means 197c is engaged with the liming hole 197b in a penetrating manner. In this case, the limiting hole 197b is formed in a shape of a rough elongated hole such that the pusher 197 may move vertically, which is to minimize an interruption of the hook 197g with respect to the instant film 140 upon the pusher 197 moving to the original position along with the movable member 195 thereby smoothly moving the movable member 195.

The pusher 197 is provided with a fixing protrusion 197e for fixing one end of the elastic member 198 on the other end thereof. In this case, the other end of the elastic member 198 is fixed to a fixing protrusion 195d formed on the rear end of the movable member 195. Accordingly, the pusher 197 is pulled downwardly by the elastic member 198, and a downward movement is limited by the engaging protrusion 197d of the fixing means 197c.

The pusher 197 has a connecting protrusion 197f protruding from one surface of the rear end of the movable member 195 toward the instant film 140. The hook 197g is extended from one end of the connecting protrusion 197f.

The hook 197g is inserted into the through hole 111n formed on the lower housing 111 and disposed at a position in which the hook 197g is inserted along the through groove 125 (refer to FIG. 9) of the instant film cassette 120.

The hook 197g has an incline unit 197h where the pusher 197 slides a surface of the instant film 140 upon the pusher 197 moves toward the instant film 140 and a stopping unit 197i for being hung on the rear end 140b of the instant film 140 so as to push the instant film 140.

Hereinafter, the operations of the portable image-forming device 100 according to an embodiment will be described sequentially with reference to FIGS. 20 to 24.

Figure 20:
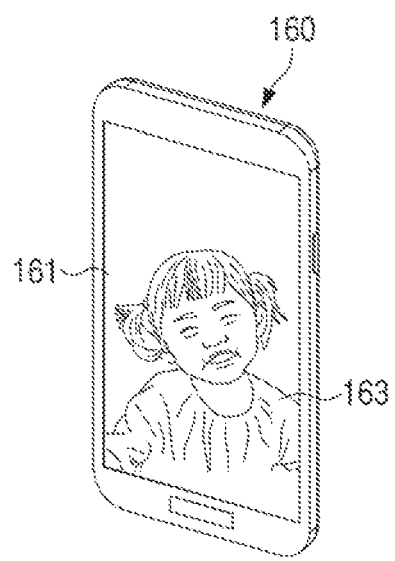
FIG. 20 is a perspective view illustrating a common mobile phone.
Figure 21:
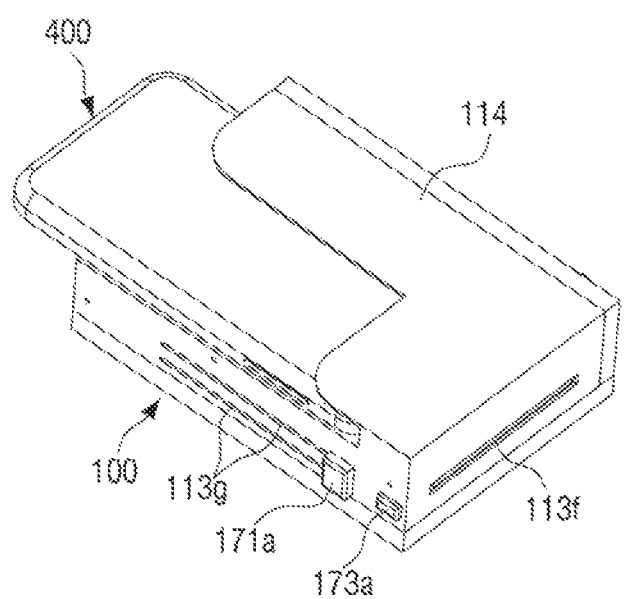
FIG. 21 is a perspective view illustrating a state where the mobile phone of FIG. 20 is inserted into an inserting space formed by a fixing unit of the portable image-forming device.
Figure 22B:
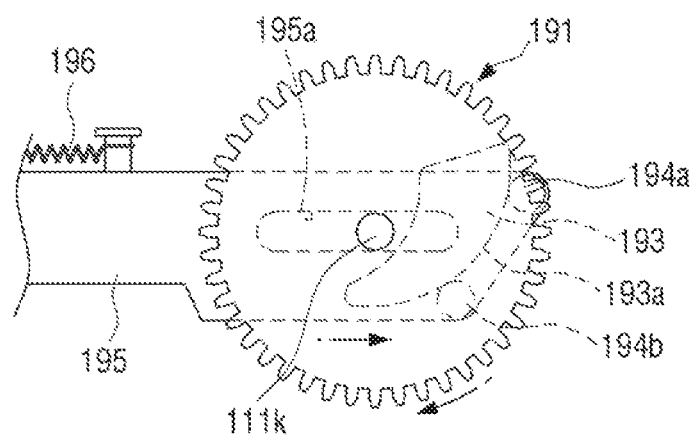
Figure 22C:
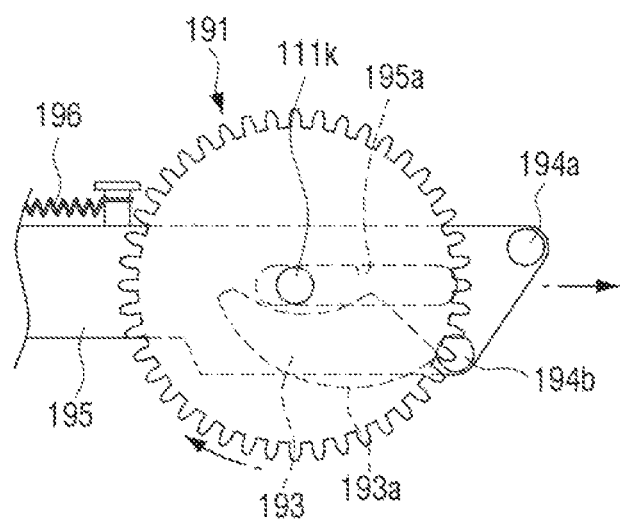
Figure 23A:
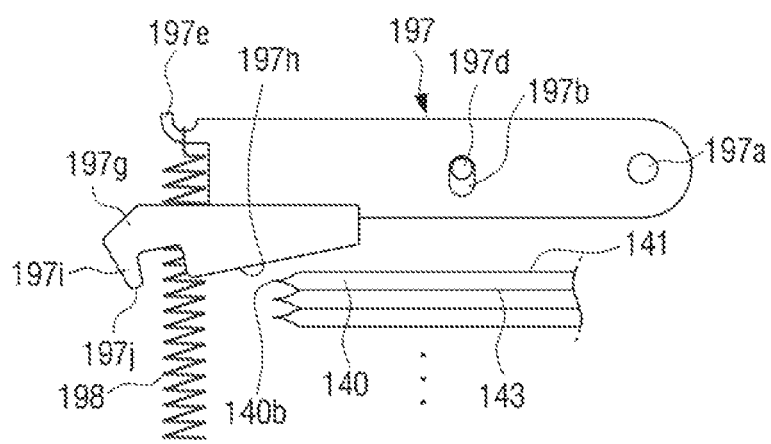
FIGS. 23A to 23C are view sequentially illustrating an operation of pushing an instant film by a pusher of the instant film setting unit.
Figure 23B:
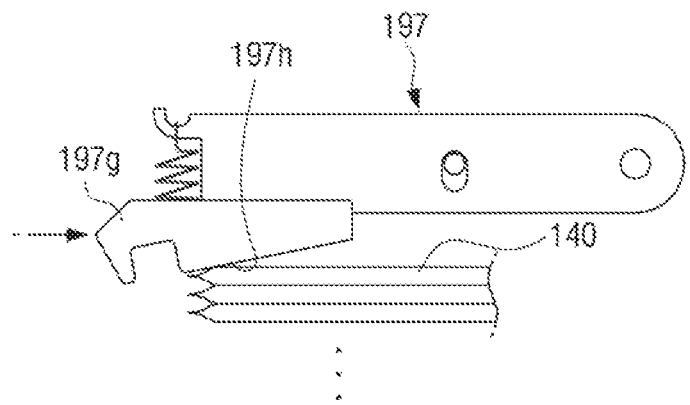
Figure 23C:
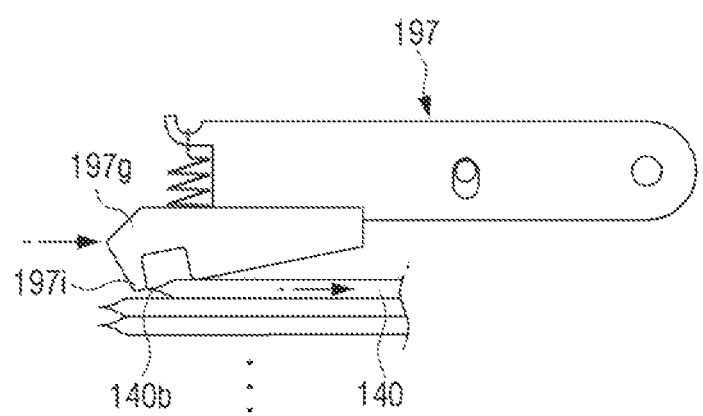
Figure 24:
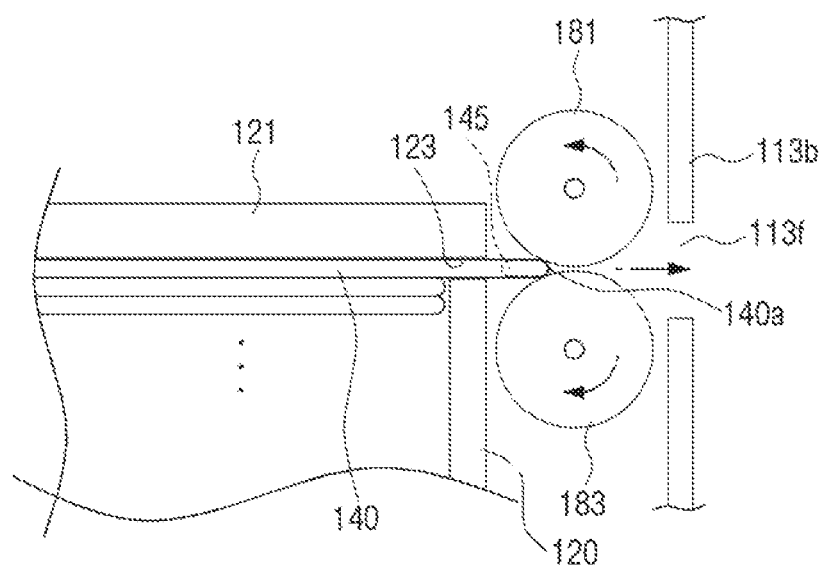
FIG. 24 is a schematic sectional view illustrating a state where an instant film is pushed by a pusher and introduced into a developing agent-spreading member.

FIG. 20 is a perspective view illustrating a common mobile phone, FIG. 21 is a perspective view illustrating a state where the mobile phone of FIG. 20 is inserted into an inserting space formed by a fixing unit of the portable image-forming device, FIGS. 22A to 22C are views sequentially illustrating a process of operating an instant film-setting unit, FIGS. 23A to 23C are views sequentially illustrating an operation of pushing an instant film by a pusher of the instant film-setting unit, and FIG. 24 is a schematic sectional view illustrating a state where an instant film is pushed by a pusher and introduced into a developing agent-spreading member.

As illustrated in FIG. 4, the instant film cassette 120 in which the instant film 140 is charged is mounted in the inside of the housing 110.

Subsequently, as illustrated in FIG. 20, an image 403 to be printed is displayed in the screen 401 of the display device 400. The display device 400 is inserted into the inserting space 114a (refer to FIG. 4) formed between the upper housing 113 and the fixing unit 114, such that the screen 401 of the display device 400 faces the incident window 113e (refer to FIG. 2).

In this state, as illustrated in FIG. 21, the part 171a of the lever 171 is pulled toward the locking release button 173a such that the traction unit 170 is locked by the locking member 173. In this case, the lever 171 is moved by a user's manual operation.

The exposure member 130 moves from the post-exposure position (P2, refer to FIG. 10) to the pre-exposure position (P1, refer to FIG. 10) in association with the movement of the lever 171. In response to the movement of the exposure member 130, the lens array 131 is closed by the shutter 135 as illustrated in FIG. 13. Accordingly, the photosensitive surface 141 of the instant film 140 is not exposed to the light radiating from the screen 401 of the display device 400 by the shutter 135 and the shading member 150.

In response to the locking release button 173a being pressed by the user, the locking state by the locking member 173 is released, and the lever 171 moves to the original position by the elastic force of the elastic member 175 (refer to FIG. 6).

The exposure member 130 moves from the pre-exposure position (P1) to the post-exposure position (P2) in association with the movement of the lever 171. In response to the movement of the exposure member 130, the lens array 131 is opened as the light through hole 135i of the shutter 133 corresponds to the lens array 131. Accordingly, the light radiating from the screen 401 of the display device 400 upon the screen 401 displaying the image 403 is irradiated along the instant film 140 through the lens array 131 and exposes the photosensitive surface 141 of the instant film 140.

In this case, a moving speed at which the exposure member 130 moves towards the post-exposure position (P2) is reduced by at least one of the damping units 155, 156, 157, and a proper degree of exposure is applied to the photosensitive surface 141 of the instant film 140.

Subsequently, a liquid developing agent is spread inside the instant film 140. At the same time, the rotation knob 189 is rotated in order to discharge the instant film 140 through the instant film discharging hole 113f.

Accordingly, the torque of the main gear 187 is transmitted to the movable gear 191 through the plurality of slave gears 192a, 192b, 192c. As illustrated in FIGS. 22A to 22C, the first and second cam followers 194a, 194b come into contact with the contact surface 193a sequentially as the cam protrusion 193 is rotated, and the movable member 195 moves linearly toward the couple of pressure rollers 181, 183.

At the same time, as illustrated in FIGS. 23A to 23C, the pusher 197 moves toward the rear end of the instant film 140. Consequently, the hook 197g is inserted into the through groove 125 (refer to FIG. 9) of the instant film cassette 120 and then pushes the instant film 140 toward the couple of pressure rollers 181, 183 while the stopping unit 197i of the hook 197g is hung on the rear end 140b of the instant film 140.

Accordingly, as illustrated in FIG. 24, the instant film 140 is introduced such that the front end 140a of the instant film 140 is meshed between the couple of pressure rollers 181, 183. In this case, in response to the cam-contact being released, the movable member 183 returns to a position for pushing a rear end of the next instant film 140.

The couple of pressure rollers 181, 183 insert the front end 140a of the instant film 140 into the couple of pressure rollers 181, 183 by means of the torque transmitted from the main gear 187 according to the rotation of the rotation knob 189 and feed the front end 140b toward the instant film discharging hole 113f.

In this case, the liquid developing agent in the instant film 140 is pressurized by the couple of pressure rollers 181, 183, and a liquid developing agent 145 is spread over the instant film 140 gradually. Accordingly, the liquid developing agent 145 is absorbed in three layers of emulsion (not shown) disposed inside the instant film 140, and a developing operation is performed.

The instant film 140 is discharged to outside the portable image-forming device 100 through the instant film discharging hole 113f by the couple of pressure rollers 181, 183. After approximately a few minutes, an image is displayed on a photographic surface of the instant film 140.

As described above, the portable image-forming device 100 according to an embodiment does not require a power supply structure, for example, a battery or a power supply equipment. That is, the portable image-forming device 100 does not need to be equipped with a power supply structure, thereby reducing a weight thereof. Accordingly, the portability and the ease of maintenance of the portable image-forming device 100 may be enhanced.

Hereinafter, a structure of a portable image-forming device according to an embodiment will be described with reference to FIGS. 25 to 30.

Figure 25:
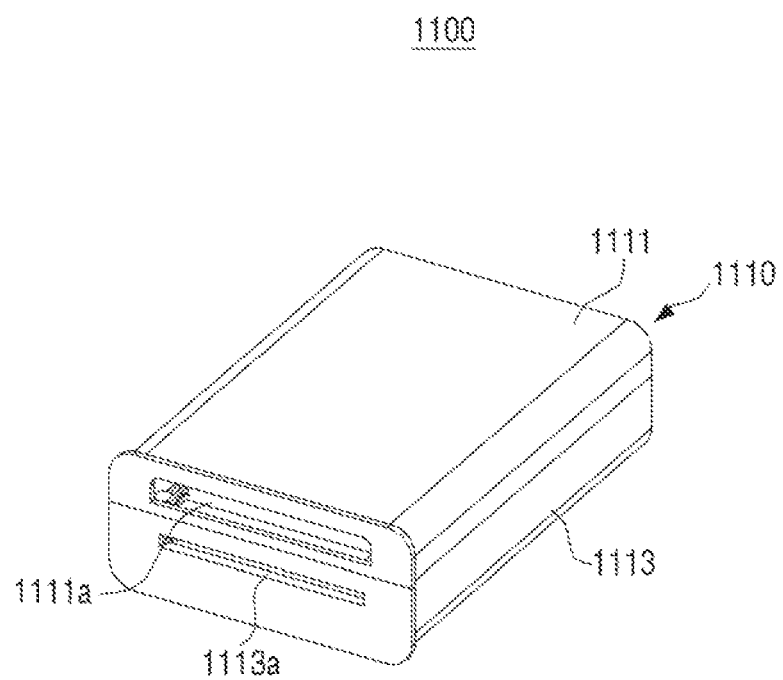
FIG. 25 is a perspective view illustrating an image-forming device according to an embodiment of the disclosure.
Figure 26:
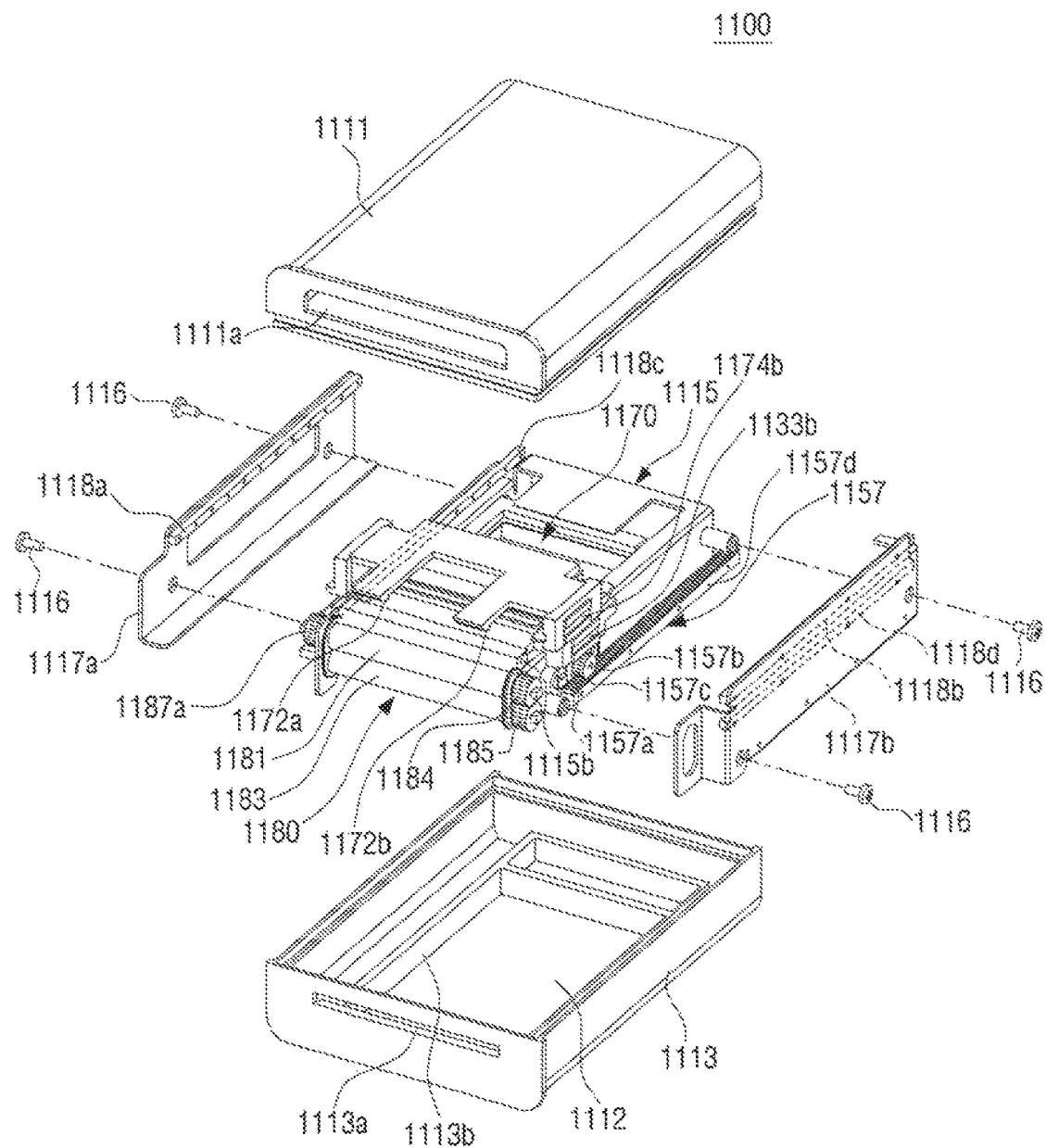
FIG. 26 is an exploded perspective view illustrating the image-forming device according to an embodiment of the disclosure.
Figure 27A:
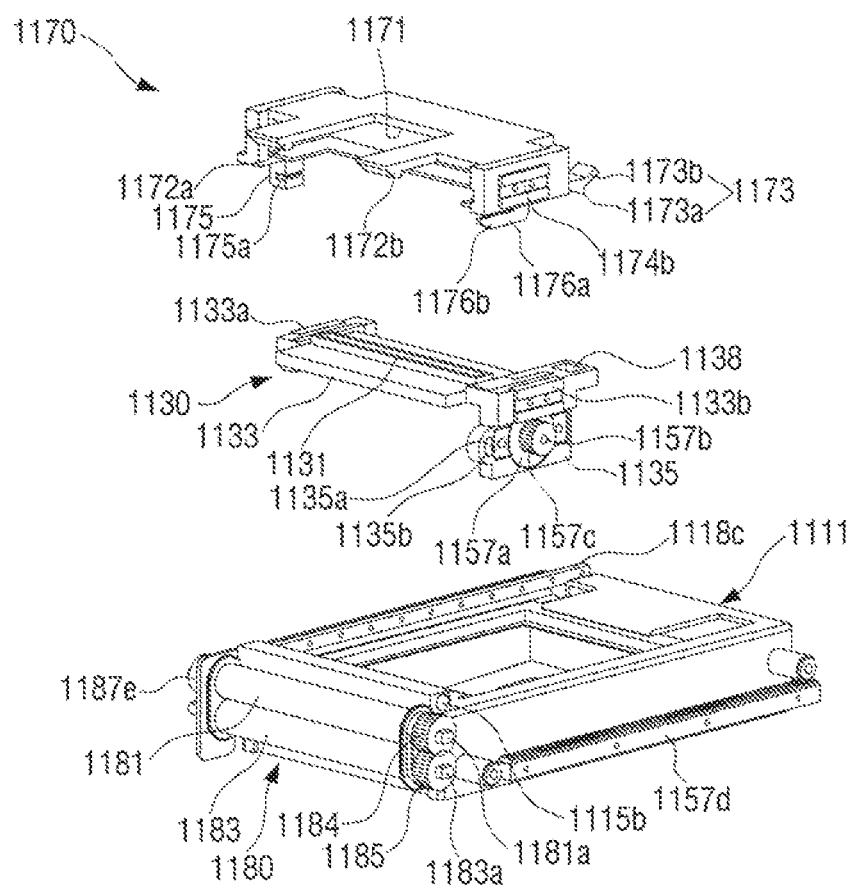
FIGS. 27A and 27B are perspective views illustrating an inner housing, an exposure member, and a traction unit of FIG. 26.
Figure 27B:
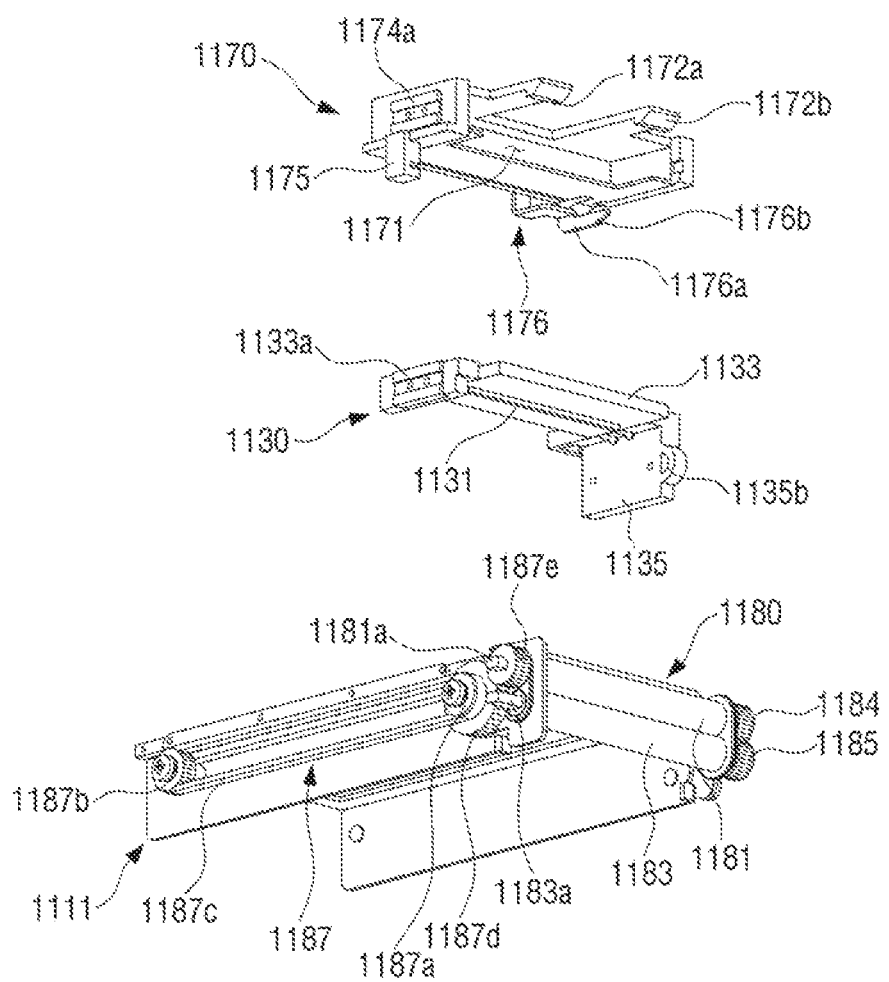
Figure 28:
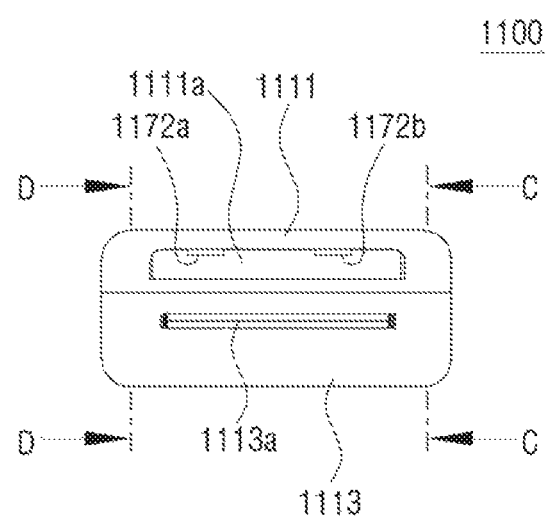
FIG. 28 is a front view illustrating the image-forming device according to an embodiment of the disclosure.
Figure 29:
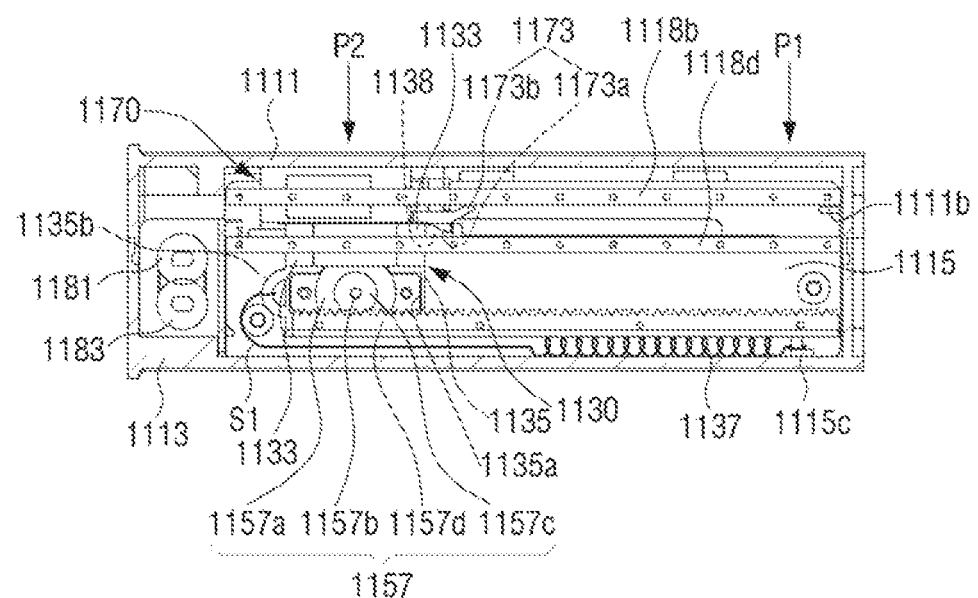
FIG. 29 is a sectional view taken along Line C-C of FIG. 28.
Figure 30:
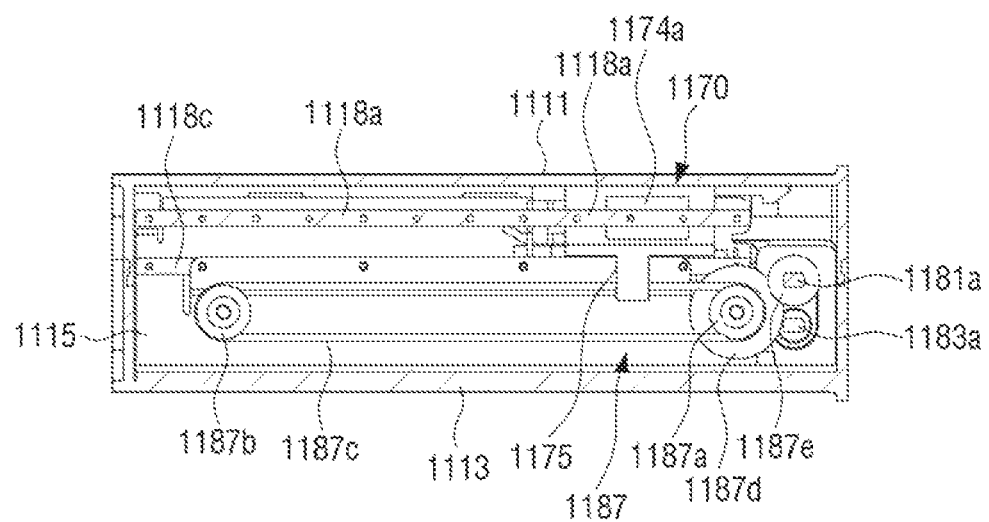
FIG. 30 is a sectional view taken along Line D-D of FIG. 28.

FIG. 25 is a perspective view illustrating an image-forming device according to an embodiment of the disclosure, FIG. 26 is an exploded perspective view illustrating the image-forming device according to an embodiment of the disclosure, FIGS. 27A and 27B are perspective views illustrating an inner housing, an exposure member, and a traction unit of FIG. 26, FIG. 28 is a front view illustrating the image-forming device according to an embodiment of the disclosure, FIG. 29 is a sectional view taken along Line C-C of FIG. 28, and FIG. 30 is a sectional view taken along Line D-D of FIG. 28.

An image-forming device 1100 according to an embodiment may include a housing 1110, an exposure member 1130, a shading member 1150, a damping unit 1157, a traction unit 1170, a developing agent-spreading member 1180, and an instant film setting unit 1190.

The housing 1110 may include a first outer housing 1111, a second outer housing 1113, and an inner housing 1115 disposed inside the first and second outer housings 1111, 1113.

Referring to FIGS. 25 and 26, the first outer housing 1111 covers an upper side of the inner housing 1115. The first outer housing 1111 is provided with an inserting hole 1111a in which a portable display device 400 is inserted is formed on a front end thereof. The inserting hole 1111a may include a common holder-type variable structure (not shown) which varies to correspond to a size of the portable display device 400. Accordingly, the portable display device 400 having various sizes (width and thickness) according to a model may be inserted into the inserting hole 1111a, needless to say.

The second outer housing 1113 covers a lower side of the inner housing 1115. The second outer housing 1113 is provided with a discharging hole 1113a for discharging an instant film 1140 on a front end thereof (the same surface in which the inserting hole 1111a of the first outer housing 1111 is formed).

A mounting hole 1113b for mounting an instant film cassette 1120 in a space unit 1115a of the inner housing 1115 is formed on a lower side of the second outer housing 1113. The second outer housing 1113 may include a door 1112 for opening or closing the mounting hole 1113b.

In the image-forming device 1100 according to an embodiment, upon the portable display device 400 inserted into the inserting hole 1111a of the first outer housing 1111 being ejected, the instant film 140 is discharged through the discharging hole 1113a of the second outer housing 1113. This operation of the image-forming device 1100 according to an embodiment will be described below in greater detail.

Referring to FIGS. 27A and 27B, the space unit 1115a in which the instant film cassette 1120 is inserted is formed inside the inner housing 1115, and a developing agent-spreading member 1180 is disposed on the front end of the inner housing 1115. In addition, a driving unit 1187 for driving the developing agent-spreading member 1180 is disposed on one side of the inner housing 1115.

The inner housing 1115 is provided with a first cylindrical groove 1115b on a front end of an upper side thereof. The other end 1151b of a first shading film 1151 of the shading member 1150 is inserted into the first cylindrical groove 1115b in a state of being rolled in a circle.

In addition, the inner housing 1115 is provided with a first bracket 1117a and a second bracket 1117b on one end and the other end thereof. The first bracket 1117a and the second bracket 1117b are fixed to one end and the other end of the inner housing 1115, respectively, with a certain distance by a plurality of engaging means 1116.

A first guide rail 1118a for guiding a linear movement of the traction unit 1170 is disposed along an inner surface of the first bracket 1117a. In this case, a third guide rail 118c for guiding a linear movement of the exposure member 1130 is disposed on an inner surface of one side of the inner housing 1115.

A second guide rail 1118b for guiding a linear movement of the traction unit 1170 and a fourth guide rail for guiding the linear movement of the exposure member 1130 are disposed along an inner surface of the second bracket 1117b in parallel to each other with a certain distance.

The exposure member 1130 exposes a photosensitive surface of the instant film 1140 disposed inside the housing 1110 to a light radiating from the screen 401 of the portable display device 400 while moving along the inner housing 1115.

The exposure member 1130 may include a lens array 1131, a frame 1133, a mounting unit 1135, and an elastic member 1137.

The lens array 1131 refers to a small lens group which is engaged with the frame 1133 and uses a difference of a refractive index in a glass fiber. The lens array 1131 is a common lens array which is employed when a distance between an object to be scanned and a reader is narrow, for example, a scanner.

The frame 1133 moves the lens array 1131 to reciprocate between a pre-exposure position (P1, refer to FIG. 29) and a post-exposure position (P2, refer to FIG. 29). In addition, the frame 1133 is provided with first and second guide blocks 1133 which are slidably engaged with the first and second guide rails 1118a, 1118b on both sides thereof. Accordingly, the frame 1133 reciprocates linearly in a longitudinal direction of the portable image-forming device 1100.

The mounting unit 1135 is extended to the other side of the inner housing 1115. The mounting unit 1135 is provided with a mounting groove 1135a in which a rotary damper 1157a is mounted. The mounting unit 1135 also may include a loop 1135b for fixing one end of a first string (S1).

Referring to FIG. 29, the other end of the first string (S1) is fixed to one end of the elastic member 1137, and the other end of the elastic member 1137 is fixed to a fixing protrusion 1115c of the inner housing 1115. Accordingly, the exposure member 1130 may be pulled from the post-exposure position (P2) to the pre-exposure position (P1) by the traction unit 1170. In response to a connection between the exposure member 1130 and the traction unit 1170 being released, the exposure unit 1130 may return to the post-exposure position (P2) by using the elastic force of the elastic member 1137.

The frame 1133 is provided with a stopping hole 1138 on a part thereof. The stopping hole 1138 is an element to which a stopping protrusion 1173a of the traction unit 1170 is slidably engaged. In this case, upon the stopping protrusion 1173a of the traction unit 1170 maintaining a state of being engaged with the stopping hole 1138 of the frame 1133, the traction unit 1170 may pull the exposure member 1130 from the post-exposure position (P2) to the pre-exposure position (P1). In response to the stopping protrusion 1173a of the traction unit 1170 being detached from the stopping hole 1138 at the pre-exposure position (P1), the connection between the traction unit 1170 and the exposure member 1130 is released, and the exposure member 1130 returns to the post-exposure position (P2) by the elastic force of the elastic member 1137, as described above.

The shading member 1150 may be made of an opaque film having an intrinsic elastic force. As illustrated in FIG. 34B, the shading member 1150 may include a first shading film 1151 and a second shading film 1153.

The first shading film 1151 is inserted into a first cylindrical groove 1115b in a state where one end 1151a of the first shading film 1151 is fixed to a front end 1134a of the frame 1133, and the other end 1151b is rolled in a circle. In this case, the other end 1151b of the first shading film 1151 is unrolled and spread in response to the traction unit 1170 moving to the pre-exposure position (P1) along with the exposure member 1130. In response to the exposure member 1130 returning to the post-exposure position (P2), the other end 1151b of the first shading film 1151 is rolled again by the intrinsic elastic force.

The second shading film 1153 is inserted into a second cylindrical groove 1179 (refer to FIG. 34B) of the traction unit 1170 in a state where one end 1153a of the second shading film 1153 is fixed to a rear end 1134b of the frame 1133, and the other end 1153b is rolled in a circle. In this case, the other end 1153b of the second shading film 1153 is unrolled and spread in response to the exposure member 1130 returning to the post-exposure position (P2) while the traction unit 1170 stays at the pre-exposure position (P1). In response to the traction unit 1170 returning to the post-exposure position (P2) at which the exposure member 1130 is located, the other end 1153b of the second shading film 1153 is rolled again by the intrinsic elastic force.

The portable image-forming device 1100 may control an exposure amount by properly adjusting a moving speed at which the exposure member 1130 having the lens array 1131 moves from the pre-exposure position (P1) to the post-exposure position (P2) such that an image printed on the instant film 1140 is shown clearly. For doing this, the portable image-forming device 1100 may include a damping unit 1157 as illustrated in FIG. 29.

Referring to FIGS. 27A and 29, the damping unit 1157 may include a common rotary damper 1157a, a pinion 1157c, and a rack 1157d.

The rotary damper 1157a is inserted fixed in the mounting groove 1135a, and a rotary shaft 1157b of the rotary damper 1157a is engaged with the pinion 1157c. The pinion 1157c is engaged with the rotary shaft 1157b of the rotary damper 1157a. Accordingly, the pinion 1157c rotates in association with the rotary shaft 1157b and is meshed with the rack 1157d fixed to the other side of the inner housing 1115.

Upon the exposure member 1130 moving from the pre-exposure position (P1) to the post-exposure position (P2) by the elastic force of the elastic member 1137, the damping unit 1157 may reduce the moving speed of the exposure member 1130 by means of the rotary damper 1157a such that the proper exposure is applied to the instant film 1140 through the lens array 1131.

In this case, the rotary damper 1157a of the damping unit 1157 may be replaced with a common mechanical vibrator (not shown), needless to say.

In response to the display device 400 being inserted into the inserting hole 1111a and then being pushed in an inserting direction by a user's force, the traction unit 1170 is engaged with the exposure member 1130 and pulls the exposure member 1130 from the post-exposure position (P2) to the pre-exposure position (P1).

Referring to FIGS. 27A and 27B, an inserting groove 1171 in which one end of the display device 400 is inserted is formed inside the traction unit 1170.

In addition, the traction unit 1170 is provided with a couple of hooks 1173a, 1173b on the front end thereof. The couple of hooks 1173a, 1173b are detachably engaged with a couple of inserting holes 421a, 421b of a traction cover 420 (refer to FIG. 32) being engaged with the display device 400.

Figure 34A:
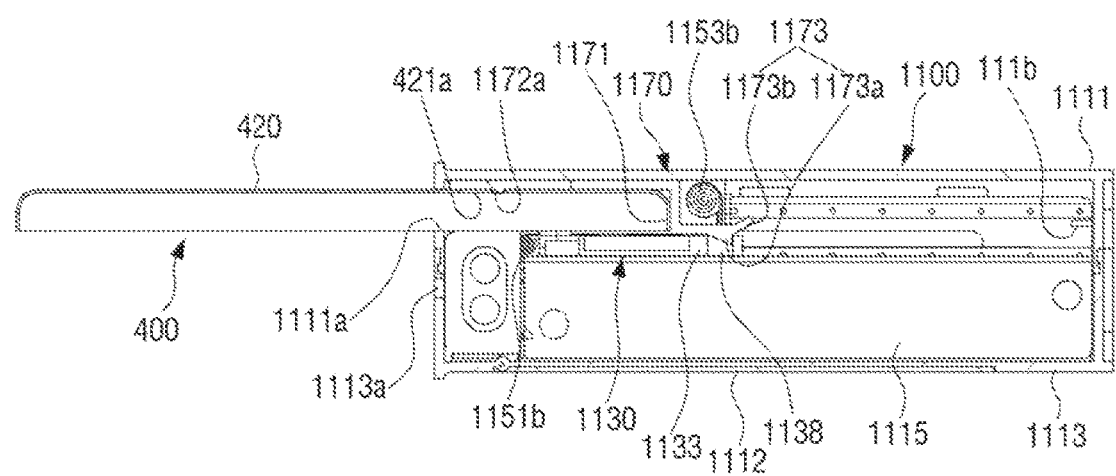
FIG. 34A is a sectional view taken along Line E-E of FIG. 33.
Figure 34B:
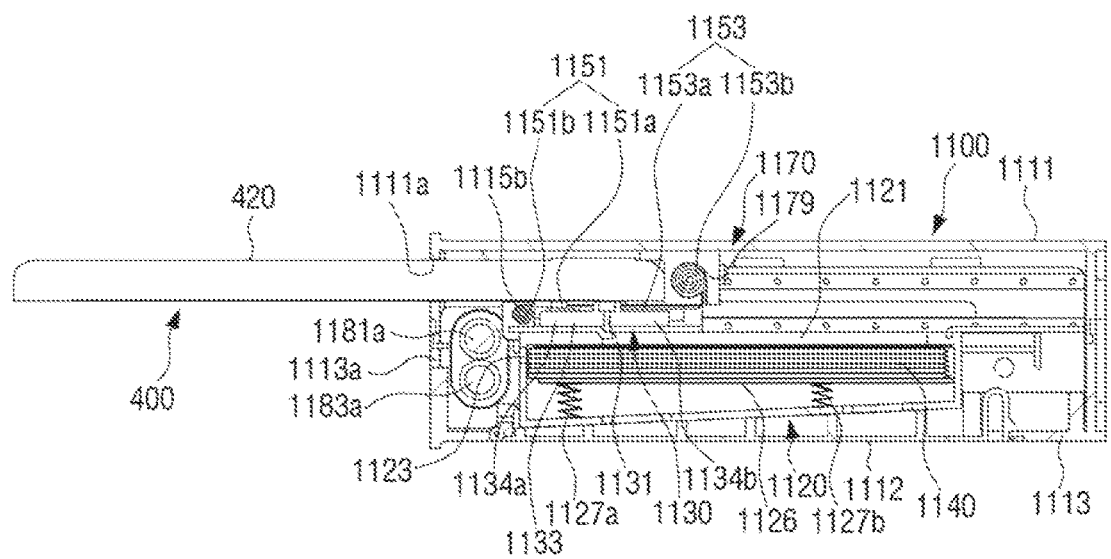
FIG. 34B is a sectional view taken along Line F-F of FIG. 33.

In this case, as illustrated in FIG. 34A, in response to one end of the display device 400 engaged with the traction cover 420 being inserted into the inserting groove 1171 of the traction unit 1170 through the inserting hole 1111a, the couple of hooks 1173a, 1173b are inserted into the couple of inserting holes 421a, 421b of the traction cover 420.

Accordingly, in response to the display device 400 being pushed such that the traction unit 1170 moves from the post-exposure position (P2) to the pre-exposure position (P1) and then the display device 400 being pulled in an opposite direction of the inserting direction, the couple of hooks 1173a, 1173b remain being hung on the couple of inserting holes 421a, 421b of the traction cover 420, and the traction unit 1170 may move to the post-exposure position (P2).

The traction unit 1170 is provided with a stopping member 1173 extended from one side of the rear end of the traction unit 1170. The stopping member 1173 may include the stopping protrusion 1173a and the stop-releasing protrusion 1173b.

The stopping protrusion 1173a is detachably inserted into the stopping hole 1138 of the exposure member 1130. In this case, the stopping protrusion 1173a remains being engaged with the stopping hole 1138 while the traction unit 1170 moves from the post-exposure position (P2) to the pre-exposure position (P1). Accordingly, the exposure member 1130 may be pulled from the post-exposure position (P2) to the pre-exposure position (P1) as the traction unit 1170 moves.

Figure 35:
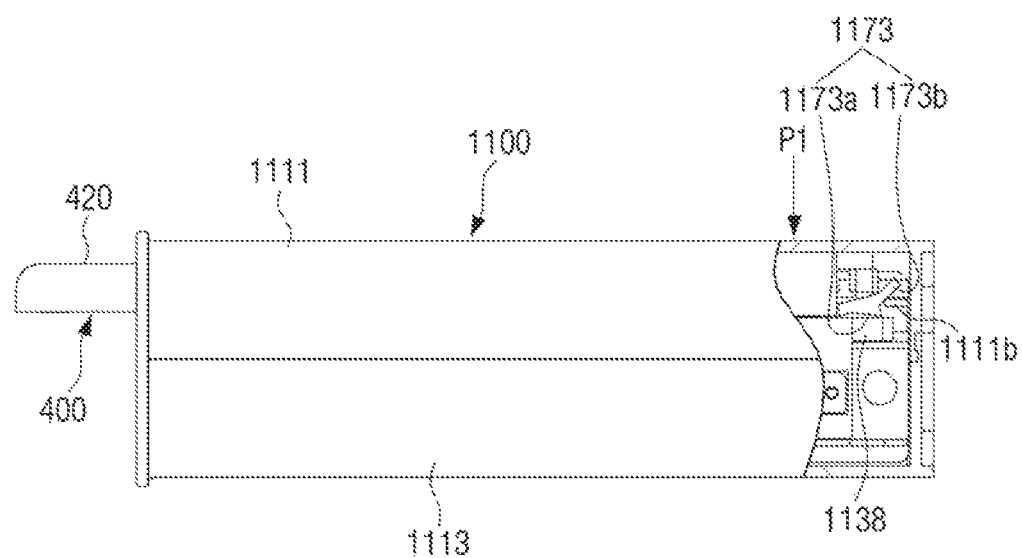
FIG. 35 is a partially-cut sectional view illustrating a state where a portable display device is pressurized in an inserting direction and inserted into an image-forming device.

The stop-releasing protrusion 1173b is formed in an upwardly inclined manner in a backward direction on an upper side of the stopping protrusion 1173a. In response to the traction unit 1170 moving to the pre-exposure position (P1), the stop-releasing protrusion 1173b climbs up a protrusion 1111b protruding from an inside of a rear end of the first outer housing 1111, as illustrated in FIG. 35. Accordingly, the stopping protrusion 1173a which has been inserted into the stopping hole 1138 is detached from the stopping hole 1138, and the connection between the exposure member 1130 and the traction unit 1170 is released. Consequently, the exposure member 1130 moves to the post-exposure position (P2) by the elastic force of the elastic member 1137.

Meanwhile, the traction unit 1170 has a third guide block 1174a and a fourth guide block 1174b on both sides. The third guide block 1174a and the fourth guide block 1174b are slidably engaged with a third guide rail 1118c and a fourth guide rail 1118d. Accordingly, the traction unit 1170 reciprocates linearly in a longitudinal direction of the portable image-forming device 1100.

In addition, the traction unit 1170 has an arm 1175 formed toward a driving unit 1187 in a downwardly inclined manner. The arm 1175 may include a holding groove 1175a for holding a part of a driving belt 1187a of the driving unit 1187. Accordingly, in response to the traction unit 1170 moving from a pre-printing position (P1) to a post-printing position (P1), the arm 1175 drives the driving unit 1187.

Meanwhile, an instant film setting member 1176 is detachably engaged with the rear end of the traction unit 1170. The instant film setting member 1176 has a push bar 1176a extended from one side thereof.

In response to the traction unit 1170 moving from the pre-exposure position (P1) to the post-exposure position (P2), the push bar 1176a pushes the rear end of the instant film 1140 to an introduction part for being meshed with the couple of pressure rollers 1181, 1182 such that the front end of the instant film 1140 is meshed with the couple of pressure rollers 1181, 1183 of the developing agent-spreading member 1180 and discharged through the discharging hole 1113a. The push bar 1176a has an inserting groove 1176b in which the rear end of the instant film 1140 is inserted on the front end thereof such that the instant film 1140 is pushed stably.

The developing agent-spreading member 1180 may include the couple of pressure rollers 1181, 1183, a couple of slave gears 1184, 1185, and the driving unit 1187.

The couple of pressure rollers 1181, 1183 are rotatably disposed on the front end of the inner housing 1115 and maintain a certain distance with respect to each other so as to feed the instant film 1140 in a pressurized state.

The couple of slave gears 1184, 1185 are engaged with one side of rotary shafts 1181*a*, 1183*a* of the couple of pressure rollers 1181, 1183, respectively. The couple of slaves gears 1184, 1185 are meshed so as to operate with each other. Accordingly, in response to one of the couple of slaves gears 1184, 1185 being rotated, the couple of pressure rollers 1181, 1183 rotate simultaneously.

The driving unit 1187 may include first and second gear pulleys 1187*a*, 1187*b* which are rotatably disposed on a front end and a rear end of one side of the inner housing 1115, the driving belt 1187*c* connected to each of the gear pulleys 1187*a*, 1187*b*, and first and second power transmission gear 1187*d*, 1187*e*.

The first power transmission gear 1187*d* is fixed to the same rotary shaft with the first gear pulley 1187*a*, and thus, rotates along with the first gear pulley 1187*a*.

Hereinafter, the operations of the portable image-forming device 1100 according to an embodiment will be described with reference to FIGS. 31 to 37.

Figure 31:
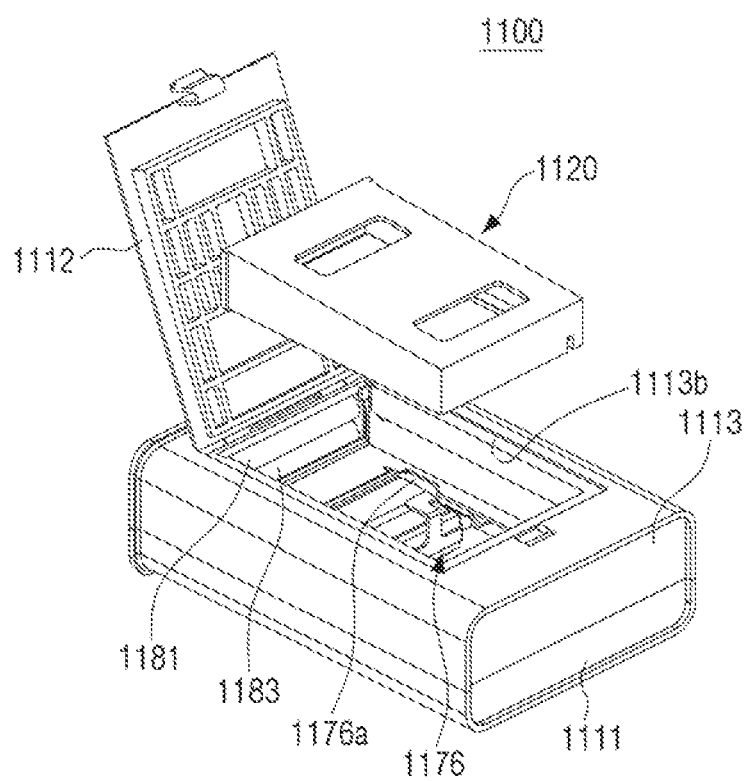
FIG. 31 is a perspective view illustrating a state where a film cassette is mounted in the image-forming device according to an embodiment of the disclosure.
Figure 32:
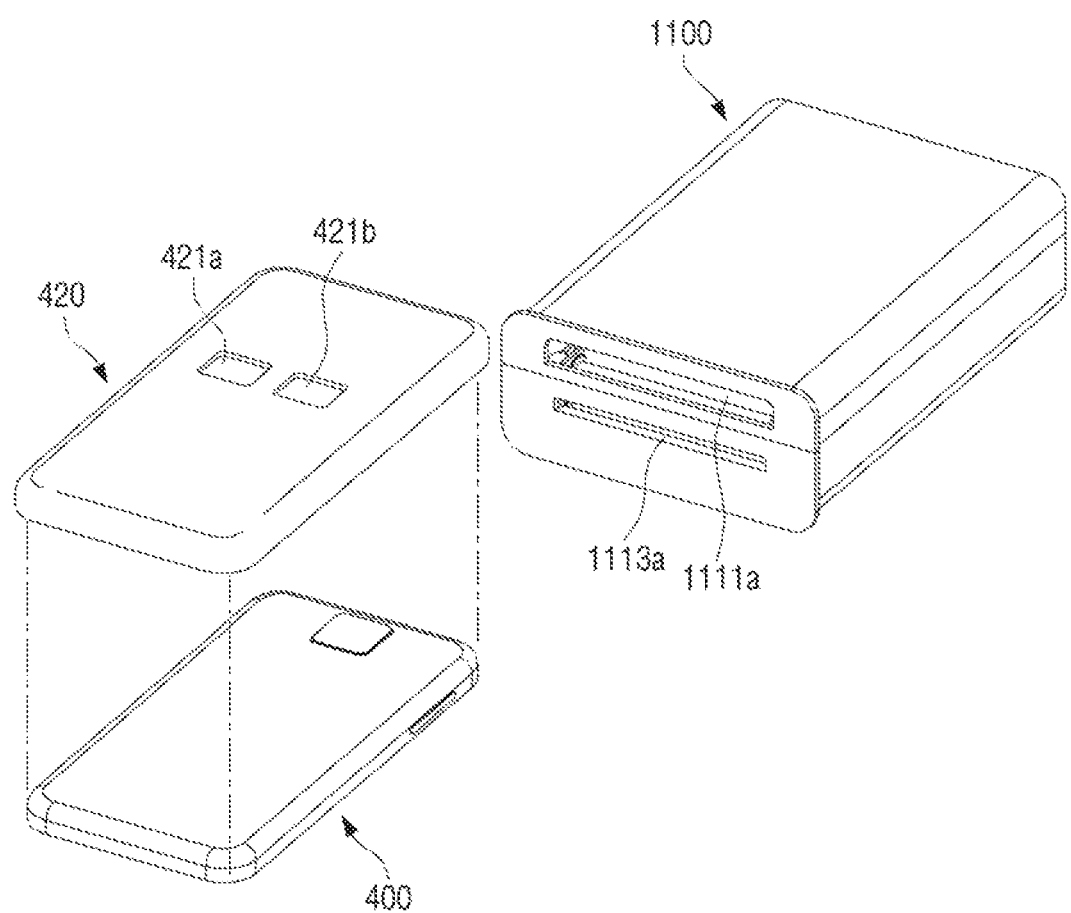
FIG. 32 is a perspective view illustrating a state where a rear side of a portable display device is covered with an auxiliary cover before the portable display device is inserted into an inserting hole of the image-forming device according to an of the disclosure.
Figure 33:
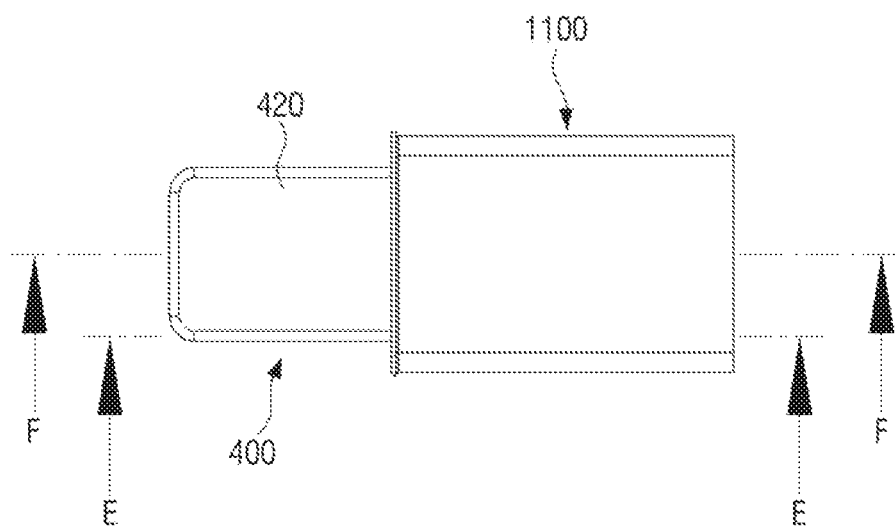
FIG. 33 is an elevation view illustrating a state where the portable display device is inserted into the image-forming device according to an embodiment of the disclosure.
Figure 36:
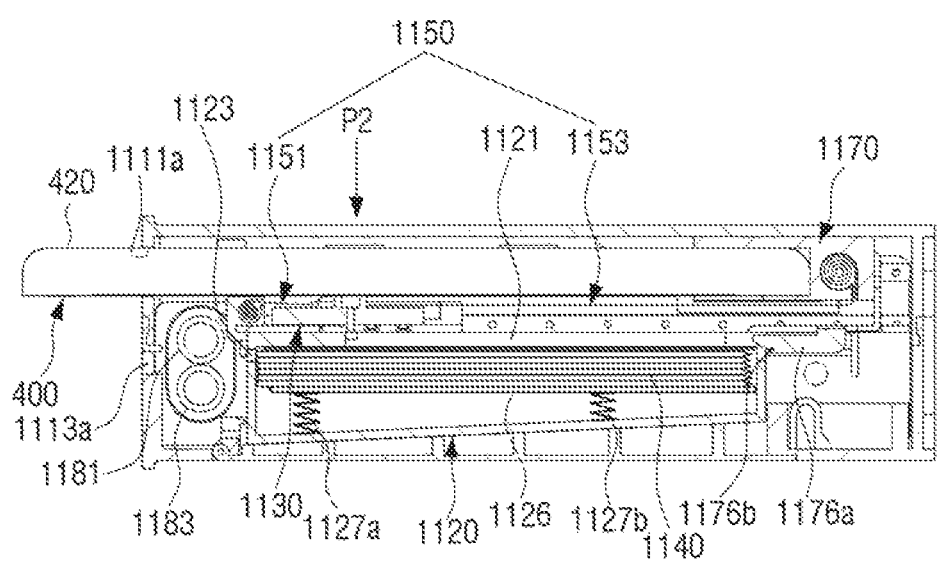
FIG. 36 is a sectional view illustrating a state where an exposure member returns to a pre-exposure position from a post-exposure position.
Figure 37:
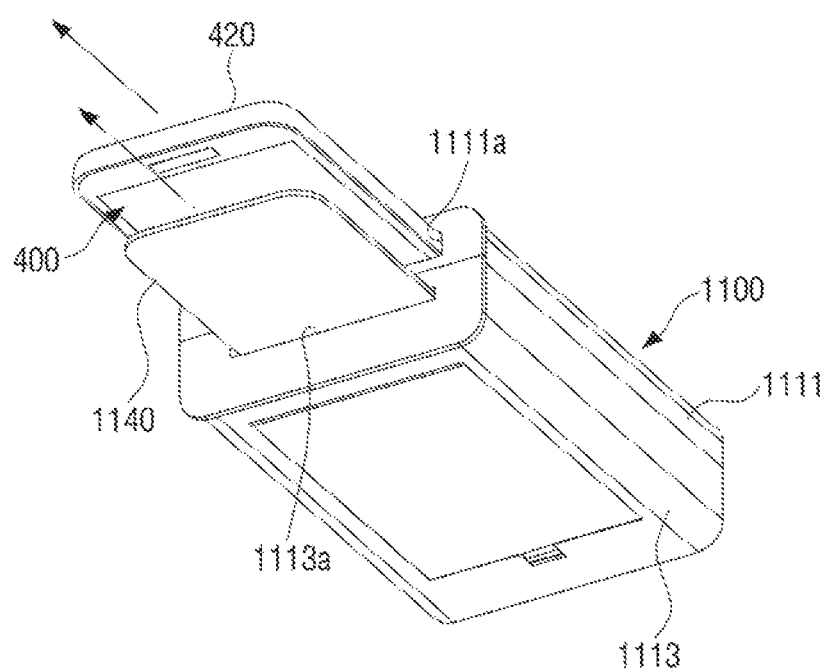
FIG. 37 is a perspective view illustrating a state where a traction unit returns to an original position as a portable display device is pulled and drives a developing agent-spreading member so as to discharge and instant film.

FIG. 31 is a perspective view illustrating a state where a film cassette is mounted in the image-forming device according to an embodiment of the disclosure, FIG. 32 is a perspective view illustrating a state where a rear side of a portable display device is covered with an auxiliary cover before the portable display device is inserted into an inserting hole of the image-forming device according to an embodiment of the disclosure, FIG. 33 is an elevation view illustrating a state where the portable display device is inserted into the image-forming device according to an embodiment of the disclosure, FIG. 34Aa is a sectional view taken along Line E-E of FIG. 33, FIG. 34B is a sectional view taken along Line F-F of FIG. 33, FIG. 35 is a partially-cut sectional view illustrating a state where a portable display device is pressurized in an inserting direction and inserted into an image-forming device, FIG. 36 is a sectional view illustrating a state where an exposure member returns to a pre-exposure position from a post-exposure position, and FIG. 37 is a perspective view illustrating a state where a traction unit returns to an original position as a portable display device is pulled and drives a developing agent-spreading member so as to discharge and instant film.

As illustrated in FIG. 31, the instant film cassette 1120 is mounted inside the inner housing 1115.

Subsequently, as illustrated in FIG. 32, the traction cover 420 is engaged with the rear side of the display device 400, and the screen 401 (refer to FIG. 20) of the display device 400 is set so as to face the instant film 1140 in a state where a certain image 403 to be printed (refer to FIG. 20) has been displayed in the screen 401. As illustrated FIG. 33, one end of the display device 400 is inserted into an inserting space 1171 of the traction unit 1170 through the inserting hole 1111*a*.

In this case, as illustrated in FIG. 34A, the couple of hooks 1172*a*, 1172*b* of the traction unit 1170 are snap-engaged with the inserting holes 421*a*, 421*b* of the traction cover 420, respectively. The stopping protrusion 1173*a* of the traction unit 1170 is snap-engaged with the stopping hole 1138 of the exposure member 1130.

In this state, the lens array 1131 of the exposure member 1130 is disposed at a position deviating from the screen 401 of the display device 400. Accordingly, the instant film 1140 is not exposed to the light radiating from the screen 401 while the exposure member 1130 is moved from the post-exposure position (P2) to the pre-exposure position (P1) by the traction unit 1170.

In response to the display device 400 being pushed in an inserting direction while one end of the display device 400 is inserted into the inserting space 1171 of the traction unit 1170, the exposure member 1130 is moved to the pre-exposure position (P1) by the stopping protrusion 1173*a* along with the traction unit 1170.

Referring to FIG. 35, in response to the traction unit 1170 reaching the pre-exposure position (P1) and the stop-releasing protrusion 1173*b* moving upwardly by climbing up the protrusion 1173*b*, the stopping protrusion 1173*a* is detached from the stopping hole 1138 of the exposure member 1130.

Accordingly, the connection between the exposure member 1130 and the traction unit 1170 is released, and the exposure member 1130 is moved to the post-exposure position (P2) by the elastic force of the elastic member 1137, as illustrated in FIG. 36. In this case, the light radiating from the screen 401 of the display device 400 as the screen 401 displays the image 403 is irradiated along the instant film 1140 through the lens array 1131, and the exposure is applied to the photosensitive surface of the instant film 1140.

In this case, a moving speed at which the exposure member 130 moves toward the post-exposure position (P2) is reduced by the damping unit 1157, and the proper degree of exposure is applied to the photosensitive surface of the instant film 1140.

In response to the display device 400 being pulled in an opposite direction of the inserting direction by the user, the traction unit 1170 moves to the post-exposure position (P2), and the push bar 1176*a* of the instant film setting member 1176 pushes the rear end of the instant film 1140 such that the front end of the instant film 1140 is introduced to a position where the front end of the instant film 1140 is meshed with the couple of pressure rollers 1181, 1183 of the developing agent-spreading member 1180.

At the same time, the couple of pressure rollers 1181, 1183 are rotated by the driving unit 1187 operating in association with the traction unit 1170 and feed the front end 140*a* of the instant film 140 toward the discharging hole 1113*a*.

In this case, a liquid developing agent in the instant film 1140 is pressurized by the couple of pressure rollers 1181, 1183, and the liquid developing agent 145 (refer to FIG. 24) is spread over the instant film 1140 gradually. Accordingly, the liquid developing agent 145 is absorbed in the three layers of emulsion (not shown) disposed inside the instant film 140, and the developing operation is performed.

The instant film 1140 is discharged to outside the portable image-forming device 1100 through the discharging hole 1113*a* by the couple of pressure rollers 1181, 1183. After approximately few minutes, an image is displayed on an photographic surface of the instant film 1140.

Figure 38:
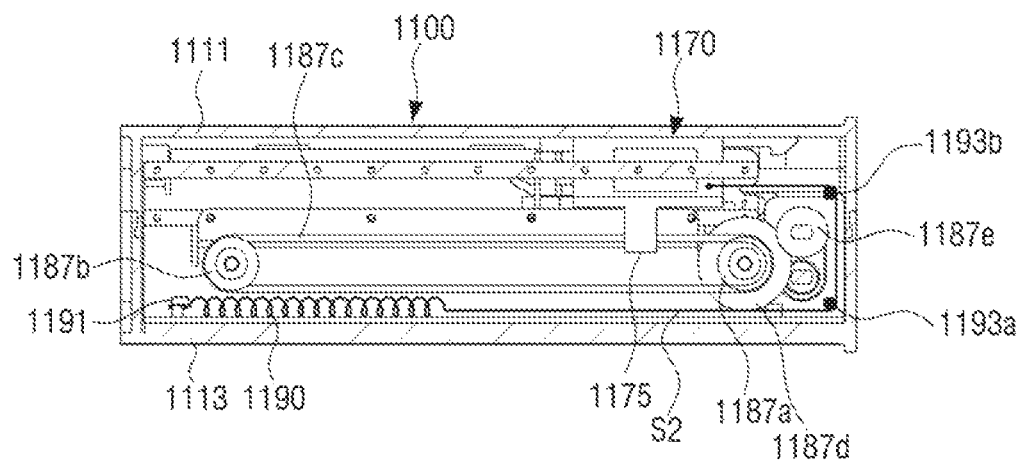
FIG. 38 is a schematic view provided to describe an example where an elastic member is connected to the other side of an exposure member such that a developing agent-spreading member of the portable image-forming device according to an embodiment is driven by an elastic force.

As described above, the portable image-forming device 1100 according to an embodiment has a structure where the traction unit 1170 moves from the pre-exposure position (P1) to the post-exposure position (P2) as the user pulls the display device 400 in an opposite direction of the inserting direction, but not limited thereto. That is, as illustrated in FIG. 38, the traction unit 1170 may move from the pre-exposure position (P1) to the post-exposure position (P2) by using the elastic force of the elastic member 1190 connected to the one side of the traction unit 1170 by means of the second string (S2).

In this case, one end of the elastic member 1190 is fixed to a fixing protrusion 1191 formed on the second outer housing 1113, and the other end of the elastic member 1190 is connected to one end of the second string (S2). The second string (S2) is hung on the couple of holding protrusion 1193a, 1193b formed on the inner housing 1115.

As the other end of the second sting (S2) is connected to one side of the traction unit 1170, the elastic force of the elastic member 1190 increases while the traction unit 1170 moves from the post-exposure position (P2) to the pre-exposure position (P1).

Accordingly, in response to a pressurizing force applied to the display device 400 in the inserting direction being removed by the user after the connection between the exposure member 1130 and the traction unit 117 is released at the pre-exposure position (P1), and the exposure member 1130 moves to the post-exposure position (P2), the traction unit 1170 moves to the post-exposure position (P2) by the elastic force of the elastic member 1190 and drives the driving unit 1187 so as to drive a developing agent-spreading device 1180.

As described above, in case of employing the elastic member 1190, the traction cover 420 engaged with the display device 400 and the couple of hooks 1172a, 1172b of the traction unit 1170 may be omitted.

In FIGS. 34B and 36, reference numeral 1121 without description refers to an exposing hole, reference numeral 1123 refers to a discharging hole of the instant film cassette 1120 for discharging the instant film, reference numeral 1126 refers to a supporting plate for storing the instant film 1140, and reference numerals 1127a and 1127b refer to a plurality of coil springs for elastically supporting the supporting plate 1126 in a direction of the exposing hole 1121.

Figure 39:
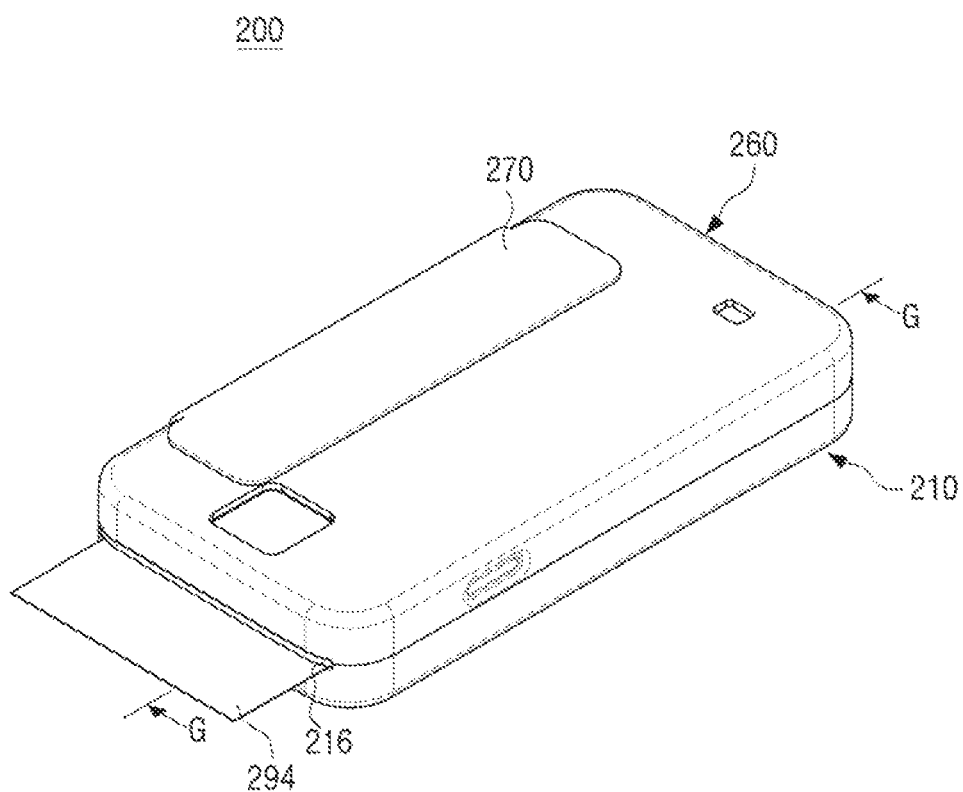
FIG. 39 is a perspective view illustrating a portable image-forming device according to an embodiment of the disclosure.
Figure 40:
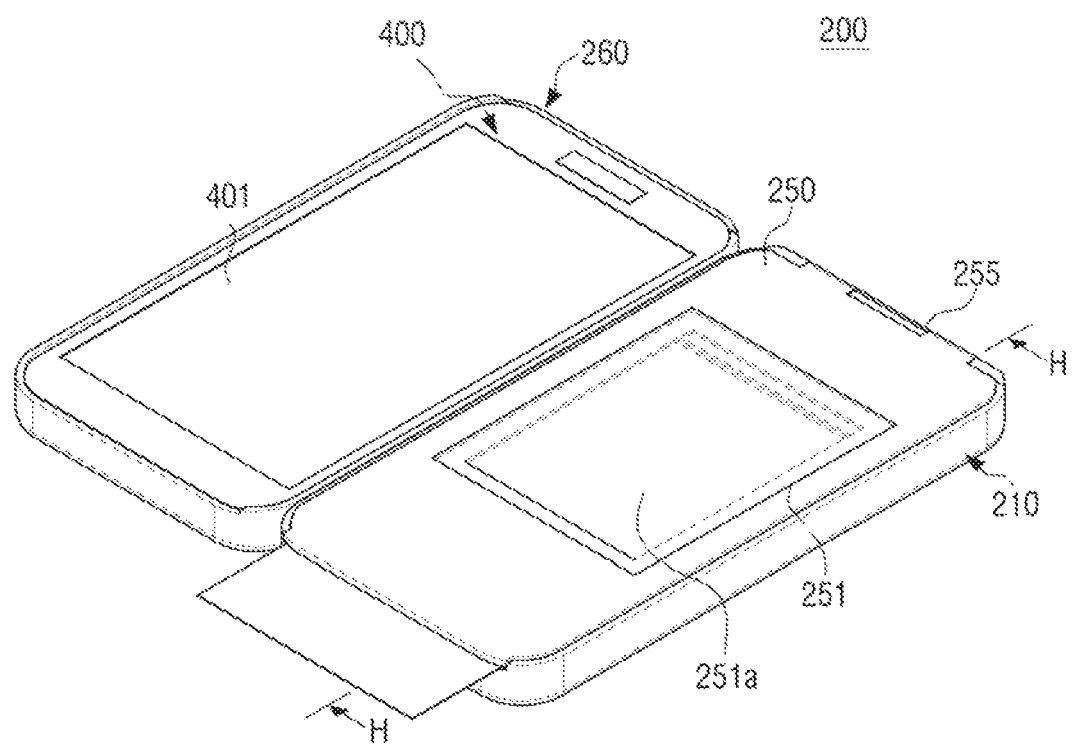
FIG. 40 is a perspective view illustrating a state where a display fixing unit is opened toward a housing in the portable image-forming device according to an embodiment of the disclosure.
Figure 41:
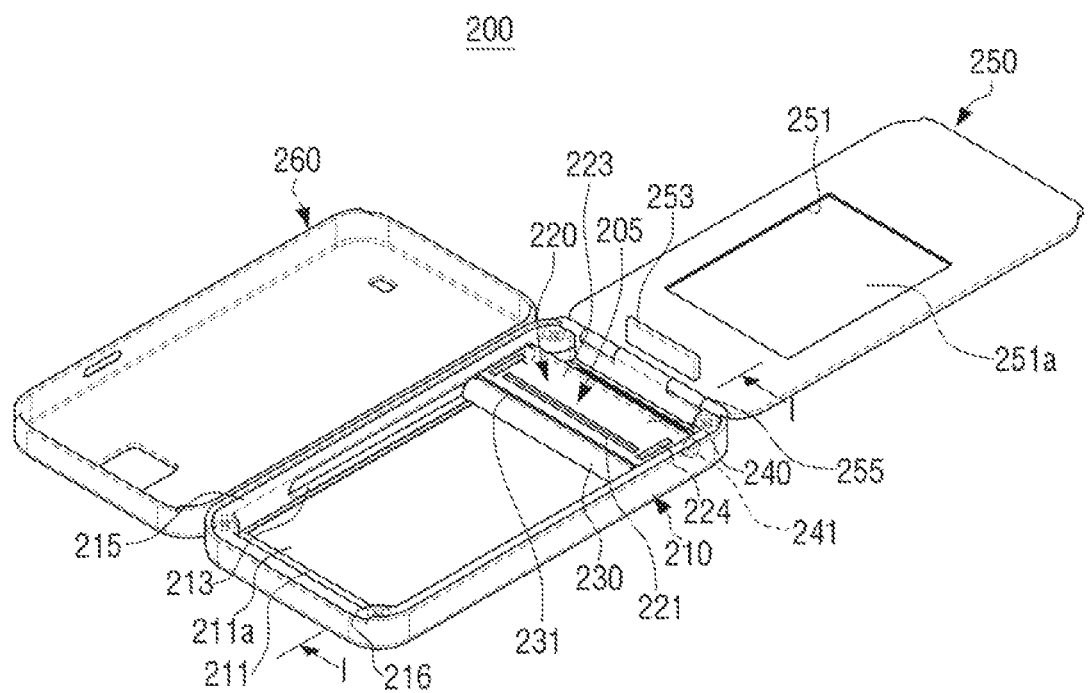
FIG. 41 is a perspective view illustrating a state where an instant film and a display device are not mounted in the portable image-forming device according to an embodiment of the disclosure.
Figure 42:
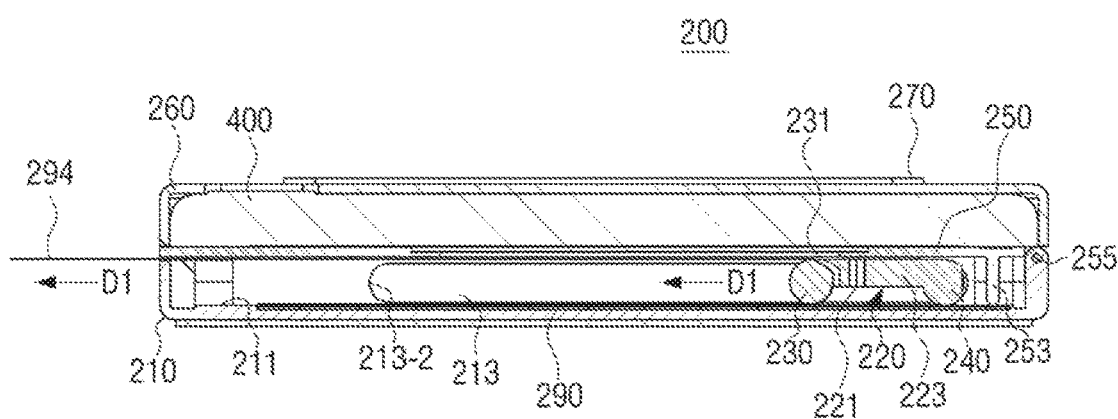
FIG. 42 is a sectional view of the portable image-forming device of FIG. 39, taken along Line G-G.
Figure 43:
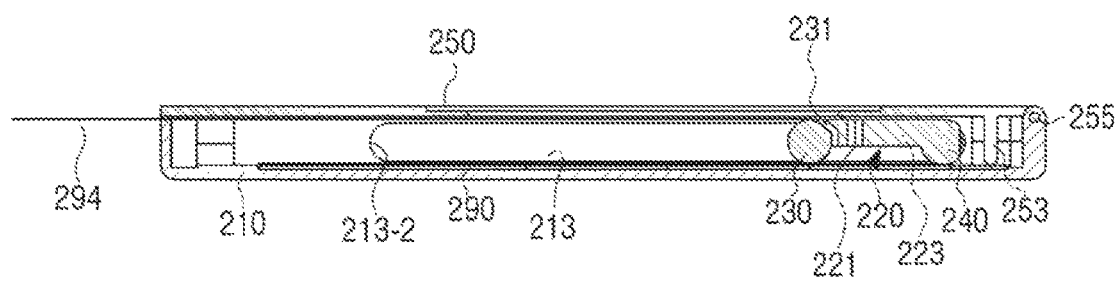
FIG. 43 is a sectional view of the portable image-forming device of FIG. 40, taken along Line H-H.
Figure 44:
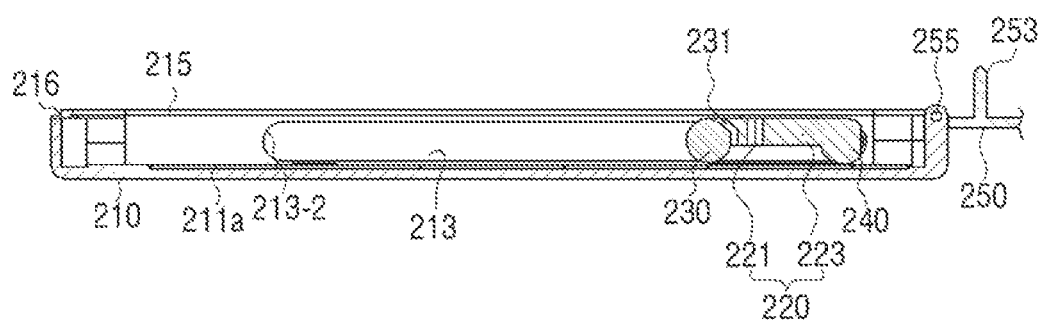
FIG. 44 is a sectional view of the portable image-forming device of FIG. 41, taken along Line I-I.

FIG. 39 is a perspective view illustrating a portable image-forming device according to an embodiment of the disclosure, FIG. 40 is a perspective view illustrating a state where a display fixing unit is opened toward a housing in the portable image-forming device according to an embodiment of the disclosure, FIG. 41 is a perspective view illustrating a state where an instant film and a display device are not mounted in the portable image-forming device according to an embodiment of the disclosure, FIG. 42 is a sectional view of the portable image-forming device of FIG. 39, taken along Line G-G, FIG. 43 is a sectional view of the portable image-forming device of FIG. 40, taken along Line H-H, and FIG. 44 is a sectional view of the portable image-forming device of FIG. 41, taken along Line I-I.

Referring to FIGS. 39 to 44, a portable image-forming device 200 according to an embodiment may include a housing 210, an exposure member 220, a moving member 230, and a pressure member 240.

The housing 210 is formed in a rough rectangular shape to correspond to the screen 401 of the display device 400, for example, a smart phone. The housing 210 is provided with a film mounting groove 211a for mounting an instant film 290 on a bottom surface 211 thereof. In addition, the housing 210 has a couple of guide grooves 213 on both inner surfaces in a longitudinal direction of the housing 210. On an upper end of the housing 210, a supporting unit 225 for accommodating a middle plate 250 is provided in a certain depth along a circumference of the housing 210. A detailed description on the middle plate 250 will be provided below. A depth from the upper end of the housing 210 to the supporting unit 225 may be set as a size corresponding to a thickness of the middle plate 250. The upper end of the housing 210 protruding the supporting unit 225 is removed from one end in the longitudinal direction of the housing 210. The partially-removed part 216 of the housing 210 forms a gap for exposing a shading cover extending unit 294 of the instant film 290 fixed to the bottom surface 211 of the housing 210 to outside the housing 210.

The exposure member 220 is disposed inside the housing 210 so as to move along the instant film 290 mounted on the bottom surface 211 of the housing 210. The exposure member 220 forms an image displayed in the screen 401 of the display device 400 on the instant film 290. That is, the exposure member 220 forms the light radiating from the screen 401 of the display device 400 on the instant film 290 so as to expose the instant film 290. The exposure member 220 may include a lens array 221 and a lens supporting unit 223 for supporting the lens array 221.

The lens array 221 forms an image displayed in the screen 401 of the display device 400 on the instant film 290. The lens array 221 may employ a lens which forms an image according to a difference of a refractive index in a glass fiber, and the lens array in this structure is used in a common scanner. The lens array 221 may be formed in a length corresponding to a width of the screen 401 of the display device 400. An upper end of the lens array 221 is spaced a certain distance apart from the screen 401 of the display device 400, and a lower end of the lens array 221 is spaced a certain distance apart from the instant film 290 mounted on the bottom surface 211 of the housing 210. The distance between the upper end of the lens array 221 and the screen 401 of the display device 400 and the distance between the lower end of the lens array 221 and the instant film 290 may be set to be the same or to be different according to a specification of the lens array 221.

Figure 45:
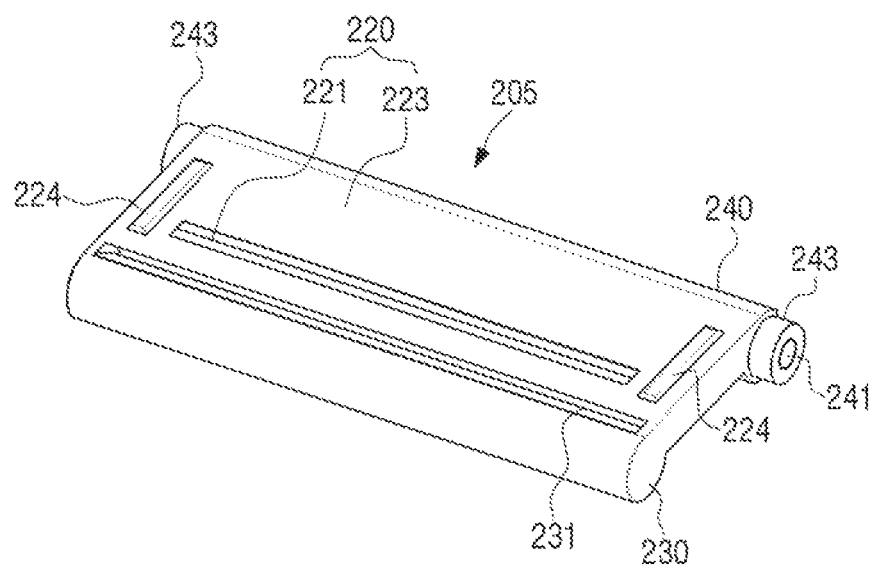
FIG. 45 is a perspective view illustrating an exposure member of the portable image-forming device of FIG. 41.

The lens supporting unit 223 fixes the lens array 221 and enables the lens array 221 to move in the longitudinal direction of the housing 210. The lens supporting unit 223 is provided with a friction protrusion 224 on an upper surface thereof so as to minimize a friction between the lens supporting unit 223 and the middle plate 250 while the lens supporting unit 223 moves. The friction protrusion 224 is formed so as to minimize a contact surface between the lens supporting unit 223 and the middle plate 250 and maintain a constant distance. Referring to FIGS. 41 and 45, in this embodiment, a couple of friction protrusions 224 are formed on both sides of the lens array 221 in parallel. On a front surface and a rear surface of the lens supporting unit 223, a pressure member 240 and a moving member 230 are formed in parallel. FIG. 45 is a perspective view illustrating an example of the exposure member of the portable image-forming device of FIG. 41. Referring to FIG. 45, the pressure member 240 and the moving member 230 may be formed as a single body with the exposure member 220.

The pressure member 240 is formed in a rough cylindrical shape and engaged with the rear surface of the lens supporting unit 221 so as to be a single body with the exposure member 220. In addition, the pressure member 240 is formed in a shape protruding from the lens supporting unit 223. The pressure member 240 has a couple of guide protrusions 241 on both ends thereof, and a guide ring 243 is inserted in each of the couple of guide protrusions 241. Accordingly, upon the pressure member 240 being disposed inside the housing 210 and the couple of guide protrusions 241 of the pressure member 240 being located on the couple of guide grooves 213 of the housing 210, the guide ring 243 is located between the guide protrusions 241 and the guide grooves 213. The guide ring 243 enables the pressure member 240 to move along the guide grooves 213 stably without wobble. In this embodiment, the pressure member 240 has a cylindrical shape, but not limited thereto. The pressure member 240 may be formed in any shape or form if a developing agent in the instant film 290 may develop an exposed part of the instant film 290 by pressurizing the upper surface of the instant film 290.

In FIG. 45, the guide ring 243 is inserted into the guide protrusions 241 on both ends of the pressure member 240, which is only an example, and not limited thereto. As another example, the guide protrusions 241 on both ends of the pressure member 240 may be guided by the guide grooves 213 of the housing 210 without the guide ring 243. The pressure member 240 pressurizes the upper surface of the instant film 290 mount on the bottom surface 211 of the housing 210 upon the exposure member 220 moving such that the developing agent in the instant film 290 is spread over the entire instant film 290, and a part exposed by the lens array 221 is developed.

The moving member 230 is provided so as to move the exposure member 220 and the pressure member 240 toward the housing 210. That is, the moving member 230 is formed so that the user moves the exposure member 220 and the pressure member 240 manually. Hereinafter, a single body consisting of the exposure member 220, the pressure member 240, and the moving member 230 is referred to as 'exposure member assembly 205' (refer to FIG. 45) according to the need. Referring to FIG. 45, the moving member 230 has a rough cylindrical shape and is formed as a single body with the lens supporting unit 223 of the exposure member 220 on an opposite side of the pressure member 240, that is, a front surface of the exposure member 220, with reference to the lens array 221. The moving member 230 is formed so as to protrude from a lower surface of the lens supporting unit 223 in a height which is roughly the same as a height of the pressure member 240. To be specific, the moving member 230 may be formed to be lower than the pressure member 240 by an amount of a thickness of a shading cover 293 of the instant film 290.

Figure 47:
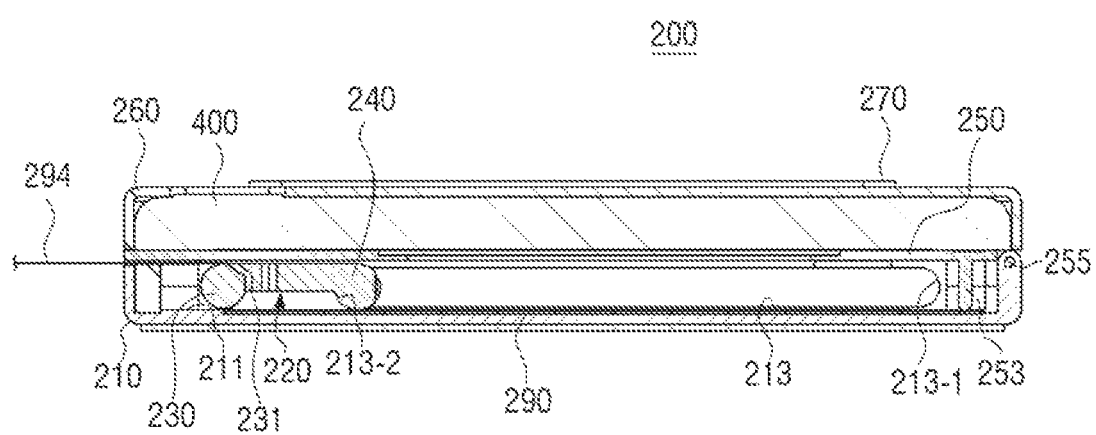
FIG. 47 is a sectional view illustrating a state where a printing operation of a screen of a display device is completed in the portable image-forming device of FIG. 42.

In addition, an opening 231 may be formed between the moving member 230 and the lens supporting unit 223 of the exposure member 220. The opening 231 has a length corresponding to a width of the instant film 290, more particularly, to a width of the shading cover extending unit 294 of the instant film 290. The width of the opening 231 is formed to be broader than the thickness of the shading cover extending unit 294 of the instant film 290. The shading cover extending unit 294 of the instant film 290 mounted on the bottom surface 211 of the housing 210 may pass through the opening 231 of the moving member 230. Accordingly, a front end of the shading cover extending unit 294 may be inserted into the opening 231 of the moving member 230 and then protrude to the outside through the gap 216 of the housing 210, as illustrated in FIGS. 42, 43, and 47.

In this embodiment of FIG. 45, on both ends of the pressure member 240, the couple of guide protrusions 241 are disposed, and a couple of guide protrusions are not disposed. However, although not depicted, a couple of guide protrusions may be disposed on both ends of the moving member 230 in the same manner as or in the similar manner to the guide protrusions 241 disposed on both ends of the pressure member 240, as another embodiment.

The instant film 290 may be fixed to the upper end of the housing 210. The middle plate 250 may be disposed so as to maintain a constant distance between the lens array 221 of the exposure member 220 and the screen 401 of the display device 400. As illustrated in FIGS. 40 and 41, the middle plate 250 may be disposed by means of a hinge 255 so as to rotate on one end of the housing 210. The middle plate 250 is supported by the supporting unit 225 disposed on the upper end of the housing 210. Accordingly, a thickness of the middle plate 250 corresponds to a depth of the supporting unit 225 of the housing 210. To be specific, the middle plate 250 may have the thickness which is the same as or greater than the depth of the supporting unit 225 of the housing 210.

The middle plate 250 is provided with an input window 251 for transmitting the light radiating from the screen 401 of the display device 400 on a center thereof. The input unit 251 may include a transparent glass 251a. As another example, the input window 251 may remain being empty without the transparent glass 251a. A size of the input window 251 may vary properly depending upon a size of the screen 401 of the display device 400 and a size of the instant film 290. Referring to FIG. 41, a fixing protrusion 253 for fixing the instant film 290 to the housing 210 is disposed on a part adjacent to one end of the middle plate 250, that is, the hinge 255. Accordingly, as illustrated in FIG. 42, the fixing protrusion 253 presses the instant film 290 towards the bottom surface 211 of the housing 210 so as to be fixed the middle plate 250 covers the housing 210.

In order to print an image displayed in the display device 400, the display device 400 needs to be fixed to the housing 210. In order to fix the display device 400 to the housing 210, a display fixing unit 260 may be provided on the upper side of the middle plate 250 in an upward direction of the housing 210. Referring to FIGS. 39 to 41, according to an embodiment, the display fixing unit 260 for fixing the display device 400 has a shape and size corresponding to the housing 210. To be specific, the display fixing unit 260 is formed in a shape of a rectangular container corresponding to the housing 210, and the display device 400 may be inserted into the display fixing unit 260. The display fixing unit 260 may be rotatably engaged with the housing 210. According to this embodiment, as illustrated in FIG. 39, the display fixing unit 260 is engaged with the housing 210 by means of a flexible plate 270. Accordingly, as illustrated in FIG. 40, the display fixing unit 260 may be open to the housing 210.

In this embodiment, the display fixing unit 260 for fixing the display device 400 is formed in a rectangular shape in which the display device 400 is inserted to correspond to the housing 210, but a method for fixing the display device 400 to the housing 210 is not limited thereto. Although not depicted, the display device 400 may be fixed to the upper side of the housing 210, that is, to the upper surface of the middle plate 250 by using a fixing means or with a user's hand.

Figure 46:
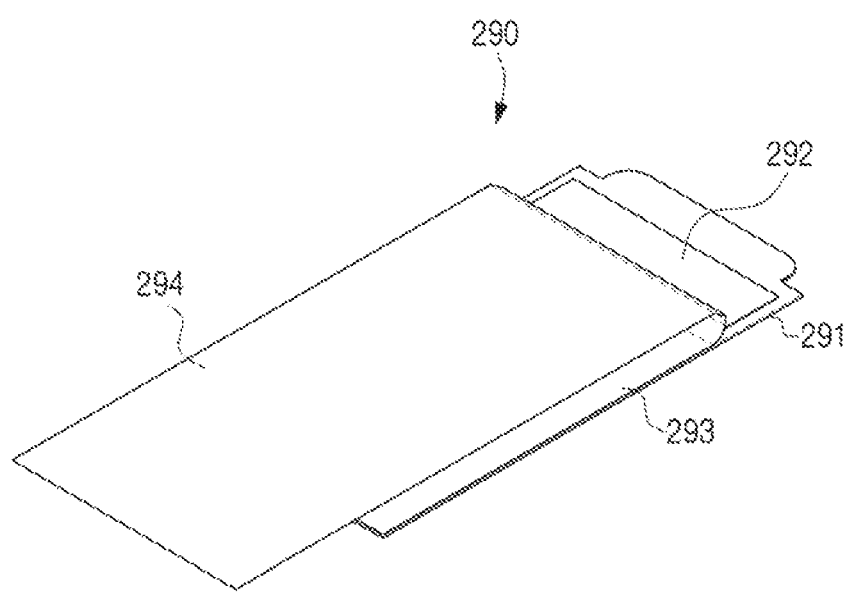
FIG. 46 is a perspective view provided to describe an example of an instant film used for the portable image-forming device according to an embodiment of the disclosure.

FIG. 46 is a perspective view provided to describe the instant film 290 used for the portable image-forming device 200 according to the third embodiment of the disclosure. FIG. 46 illustrates an example where a part of the shading cover 293 is partially uncovered, and a part of an instant film member 292 is exposed.

The instant film 290 may include a protecting plate 291, the instant film member 292, the shading cover 293, and the shading cover extending unit 294. The protecting plate 291 is placed on the bottom surface 211 of the housing 210 and formed in a shape corresponding to the film mounting groove 211a disposed on the bottom surface 211 of the housing 210. The instant film member 292 refers to a part which is exposed by the lens array 221 of the exposure member 220 and printed by a developing agent. The instant film member 292 is disposed on an upper surface of the protecting plate 291. The developing agent may be accommodated in an exposed part of the instant film member 292 of FIG. 46. The shading cover 293 prevents an external light from exposing the instant film member 292 and is disposed on the protecting plate 291 so as to cover the instant film member 292. The shading cover extending unit 294 is extended from one end of the shading cover 293.

The shading cover extending unit 294 performs a role of a handle for moving the moving member 230, and thus, has a length longer than a length of the protecting plate 291. Accordingly, in response to the shading cover extending unit 294 passing through the opening 231 of the moving member 230 and then the instant film 290 being mounted in the film mounting groove 211a of the housing 210, a front end of the shading cover extending unit 294 is exposed to outside through the gap 216 of the housing 210. In response to the exposed front end of the shading cover extending unit 294 being pulled by the user, the moving member 230 is moved by the shading cover extending unit 294, and at the same time, the shading cover 293 is detached from the protecting plate 291, and the instant film member 292 is exposed. In response to the shading cover extending unit 294 continuously being pulled by the user, the shading cover 293 detached from the protecting plate 291 moves the moving member 230 while moving toward the gap 216 of the housing 210 through the opening 231 of the moving member 230. In response to the moving member 230 being moved by the shading cover extending unit 294 and the shading cover 293, the exposure member 220 and the pressure member 240 which are formed as the single body with the moving member 230 also move to expose and print the exposed instant film member 292.

Hereinafter, a method for printing an image displayed in the screen 401 of the display device 400 by using the portable image-forming device 200 according to an embodiment will be described.

The user mounts the instant film 290 in the housing 210. To be specific, the user rotates the display fixing unit 260 with respect to the housing 210 such that the upper end of the housing 210 is opened and then rotates the middle plate 250 such that the exposure member assembly 205 is exposed as illustrated in FIG. 41.

In this state, the user mounts the instant film 290 in the film fixing groove 211a on the bottom surface 211 of the housing 210 and inserts the front end of the shading cover extending unit 294 of the instant film 290 into the exposure member assembly 205, more particularly, into the opening 231 of the moving member 230. In response to the shading cover extending unit 294 of the instant film 290 entirely being pulled out through the opening 231 of the exposure member assembly 205, the front end of the shading cover extending unit 294 is exposed to outside the housing 210. Subsequently, in response to the middle plate 250 being closed so as to be located on the supporting unit 215 of the housing 210, the front end of the shading cover extending unit 294 is exposed to outside the housing 210 and the middle plate 250, as illustrated in FIGS. 40 and 43.

Subsequently, the user manipulates the display device 400 to display an image to be printed in the screen 401.

As illustrated in FIG. 40, the display device 400 is mounted in the display fixing unit 260 such that the screen 401 of the display device 400 faces an upper side, and the upper side of the housing 210 is covered with the display fixing unit 260. Consequently, the portable image-forming device 200 according to an embodiment is set to be in the state illustrated in FIGS. 39 and 47. In this state, the screen 401 of the display device 400 in which the image is displayed faces the input window 251 of the middle plate 250.

In this state, the user holds the housing 210 and the display fixing unit 260 with one hand and pulls the front end of the shading cover extending unit 294 expose to outside the housing 210 in a direction of Arrow D1 of FIG. 42 with the other hand.

The exposure member assembly 205 is moved in the direction of Arrow D1 along the couple of guide grooves 213 of the housing 210 by the users pulling force, in the same manner as the shading cover extending unit 294. Consequently, the shading cover 293 is detached from the protecting plate 291, and the instant film member 292 located under the shading cover 293 becomes exposed.

In response to the shading cover extending unit 294 continuously being pulled by the user, the light radiating from the screen 401 of the display device 400 according to the movement of the exposure member assembly 205 exposes the instant film member 292 though the lens array 221 of the exposure member assembly 205. In response to the exposure member assembly 205 moving in the direction of Arrow D1, the pressure member 240 disposed behind the lens array 221 presses the developing agent in the instant film 290, and the developing agent develops the exposed part of the instant film member 292.

In response to the guide protrusions 241 of the exposure member assembly 205 being located at dead-end 213-2 of the guide groove 213 of the housing 210, the exposure member assembly 205 does not move any more even though the user pulls the shading cover extending unit 294. In addition, in response to the exposure member assembly 205 being located at a the dead-end 213-2 of the guide groove 213 of the housing 210, the shading cover 293 is entirely uncovered, and the instant film member 292 is entirely exposed. Accordingly, the image displayed in the screen 401 of the display device 400 is entirely exposed and developed on the instant film member 292.

In response to the display fixing unit 260 being opened and then the middle plate 250 being opened by the user in this state, the instant film 290 mounted on the bottom surface 211 of the housing 210 may be detached. Accordingly, the user may obtain a printout of the image displayed in the screen 401 of the display device 400.

Figure 48:
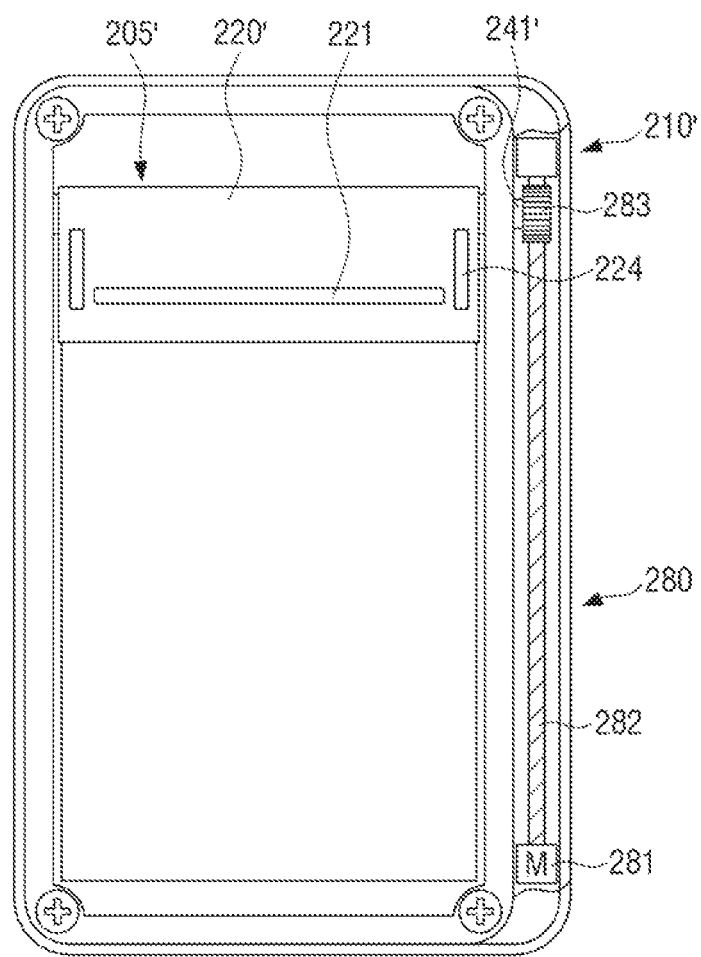
FIG. 48 is a partial elevation view provided to describe an example of transformation of the portable image-forming device according to an embodiment of the disclosure.

In the above embodiment, the exposure member assembly may include the exposure member, the pressure member, and the moving member and may be moved manually by the user, but this is only an example, and a method for moving the exposure member assembly is not limited to the manual type. According to the need, the exposure member assembly may be realized so as to be moved automatically by means of a motor. FIG. 48 is a view provided to describe an example of a structure for automatically moving the exposure member assembly. FIG. 48 is a partial elevation view illustrating only the housing out of the portable image-forming device of FIG. 41. Accordingly, in the similar manner to FIG. 41, a housing 210' of FIG. 48 may be engaged with the middle plate 250 and the display fixing unit 260.

Referring to FIG. 48, a driving unit 280 for driving an exposure member assembly 205' is disposed on one side of the housing 210'. The driving unit 280 may include a pinion 283, a screw 282, and a motor 281. The pinion 283 is fixed to a guide protrusion 241' on one end of the exposure member assembly 205'. The screw 282 is disposed so as to rotate in parallel to the housing 210' and to be meshed with the pinion 283. The motor 281 is engaged with one end of the screw 282 and rotates the screw 282. Accordingly, in response to the motor 281 being operated the screw 282 rotates, and the pinion 283 moves along the housing 210' according to the rotation of the screw 282. Consequently, the exposure member assembly 205' including the pinion 283 is moved along the housing 210'. In this embodiment, the exposure member assembly 205' is moved by means of the pinion 283 and the screw 282, but the driving unit may be realized with various means for changing a rotary motion of a motor to a linear motion, for example, a ball screw.

Hereinafter, a detailed description on a portable image-forming device according to an embodiment will be provided with reference to FIGS. 49 to 57.

Figure 49:
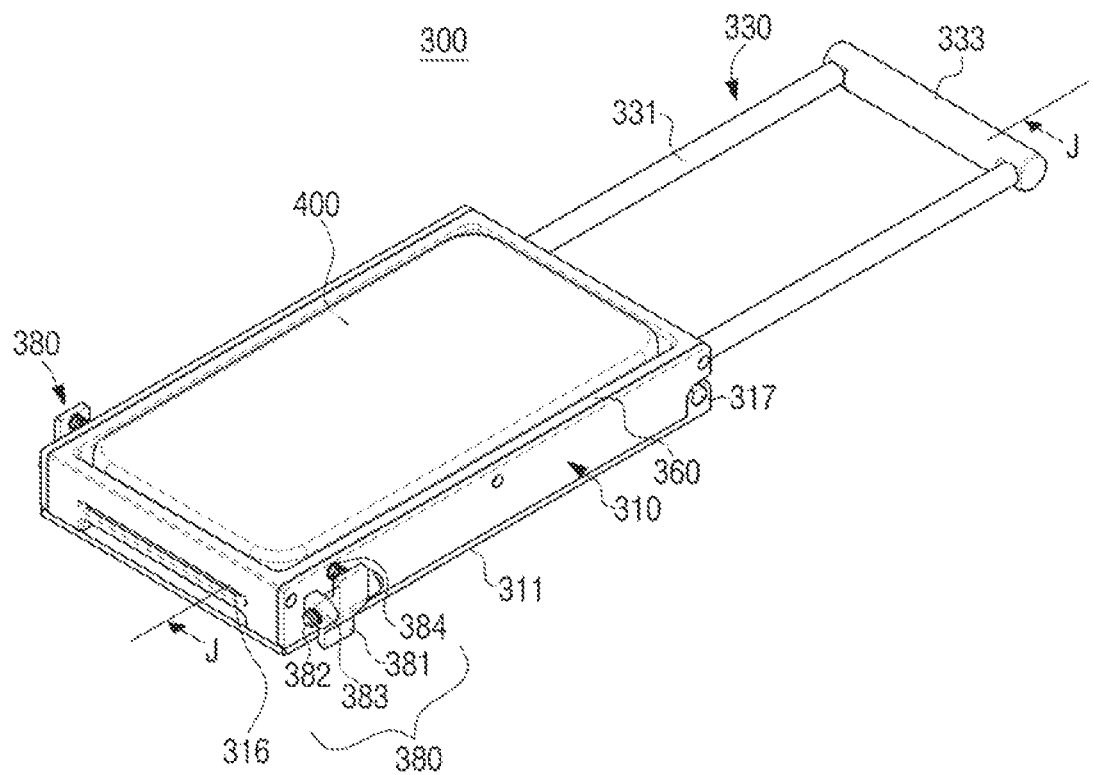
FIG. 49 is a perspective view illustrating a portable image-forming device according to an embodiment of the disclosure.
Figure 50:
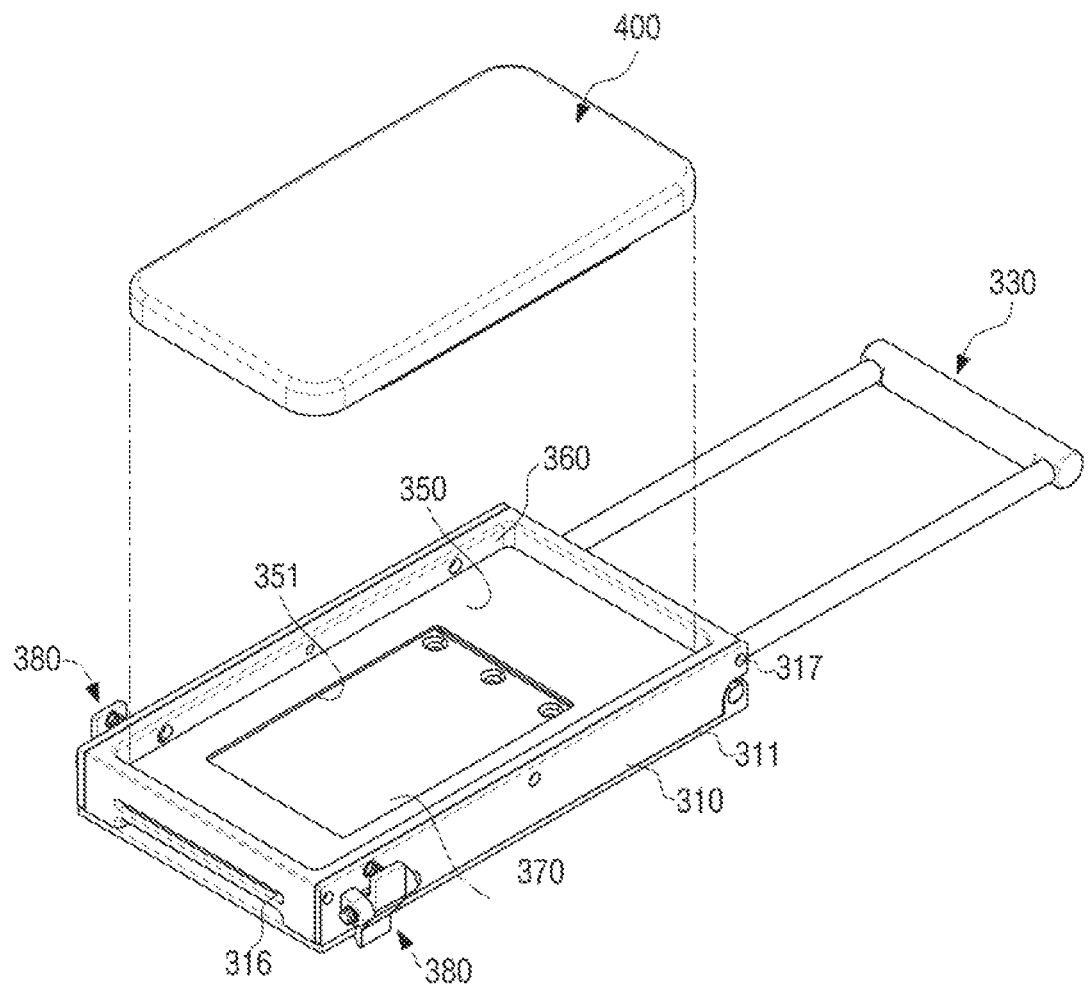
FIG. 50 is a perspective view illustrating a state where a display device is detached from the portable image-forming device of FIG. 49.
Figure 51:
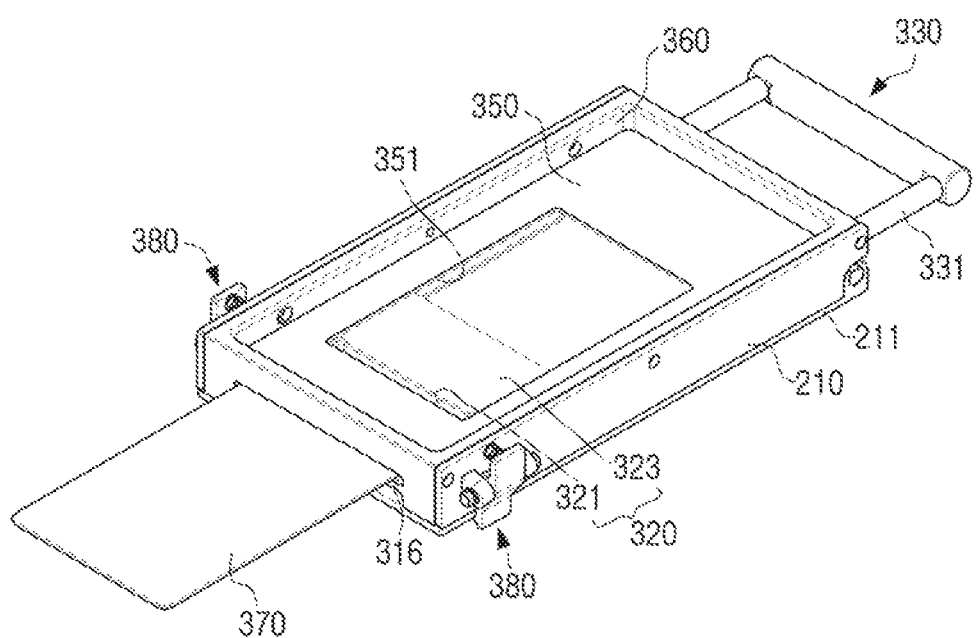
FIG. 51 is a perspective view illustrating a state where a handle is pushed to the maximum in the portable image-forming device of FIG. 49.
Figure 52:
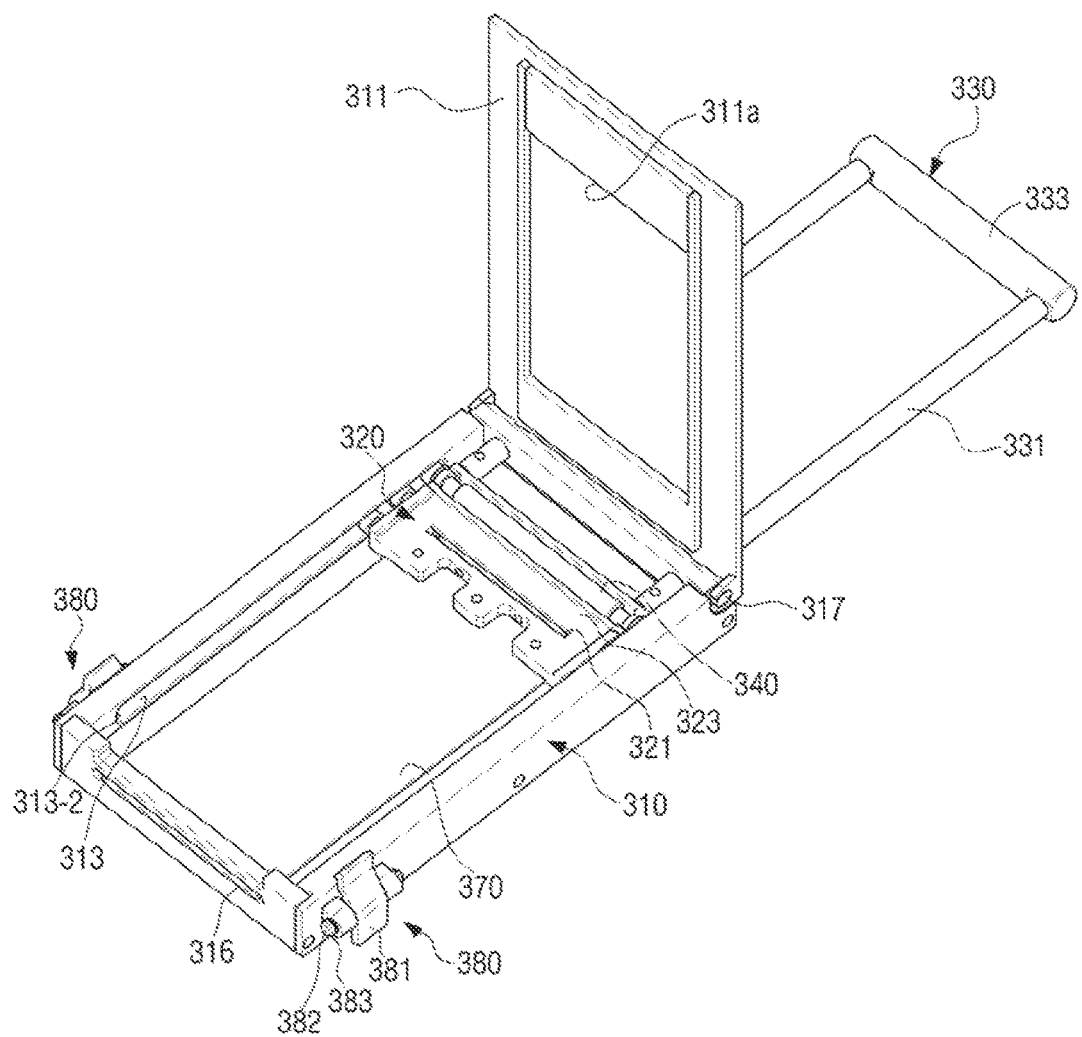
FIG. 52 is a perspective view illustrating a state where a bottom plate of a housing is opened in the portable image-forming device according to an embodiment of the disclosure.
Figure 53:
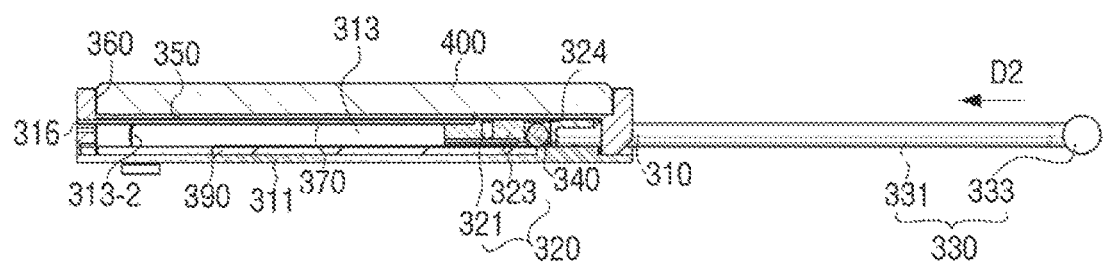
FIG. 53 is a sectional view of the portable image-forming device of FIG. 49, taken along Line J-J.
Figure 54:
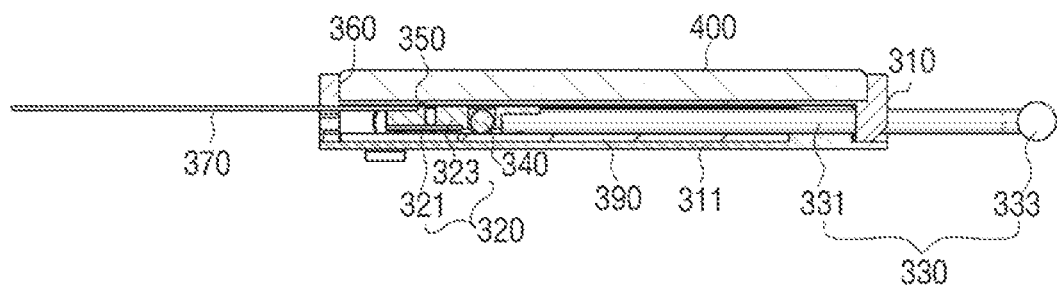
FIG. 54 is a sectional view illustrating a state where a handle of the portable image-forming device of FIG. 49 is pushed to the maximum.
Figure 55:
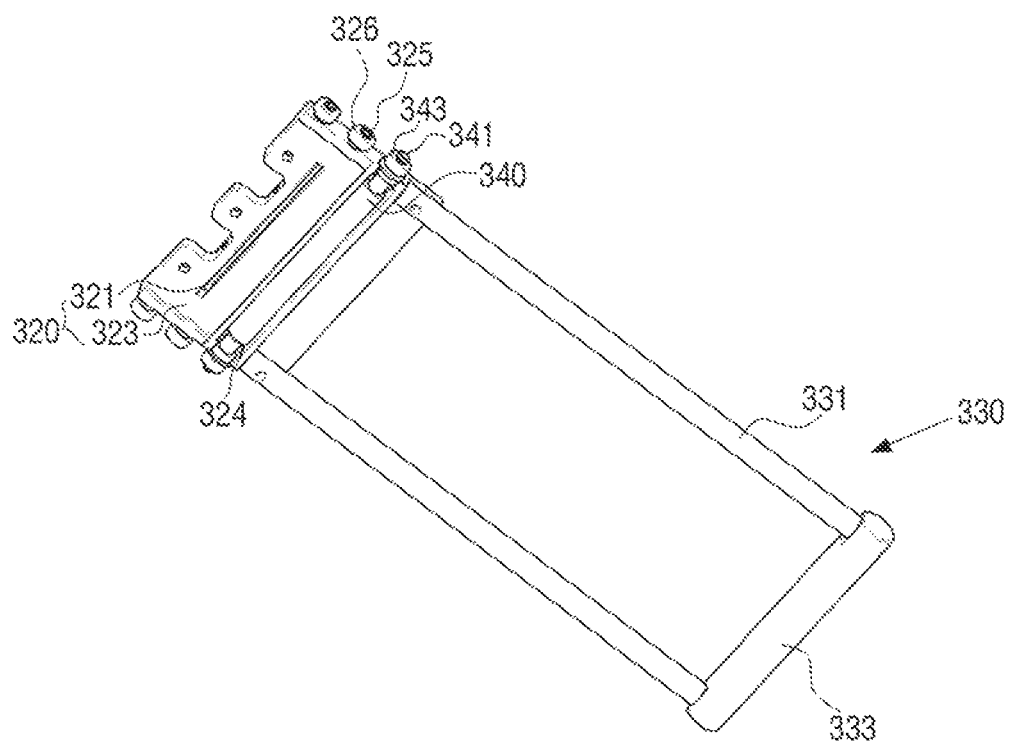
FIG. 55 is a perspective view illustrating an assembly of an exposure member and a moving member of the portable image-forming device of FIG. 49.

FIG. 49 is a perspective view illustrating a portable image-forming device according to an embodiment of the disclosure, FIG. 50 is a perspective view illustrating a state where a display device is detached from the portable image-forming device of FIG. 49, FIG. 51 is a perspective view illustrating a state where a handle is pushed to the maximum in the portable image-forming device of FIG. 49, FIG. 52 is a perspective view illustrating a state where a bottom plate of a housing is opened in the portable image-forming device according to an embodiment of the disclosure, FIG. 53 is a sectional view of the portable image-forming device of FIG. 49, taken along Line J-J, FIG. 54 is a sectional view illustrating a state where a handle of the portable image-forming device of FIG. 49 is pushed to the maximum into the housing, and FIG. 55 is a perspective view illustrating an assembly of an exposure member and a moving member of the portable image-forming device of FIG. 49.

Referring to FIGS. 49 to 55, a portable image-forming device 300 according to an embodiment may include a housing 310, an exposure member 320, a moving member 330, and a pressure member 340.

The housing 310 is formed in a rough rectangular shape to correspond to the screen 401 of the display device 400, for example, a smart phone. The entire circumference of an upper end of the housing 310 is extended upwardly so as to form a display fixing unit 360 in a certain depth. That is, according to this embodiment, the display fixing unit 360 and the housing 310 are formed as a single body, unlike the portable image-forming device 200 described previously. A fixing plate 350 for supporting the display device 400 is disposed between the display fixing unit 360 and the housing 310. Accordingly, the display device 400 is accommodated in an upper side of the fixing plate 350, and the exposure member 320 and an instant film 390 are accommodated under the fixing plate 350. The fixing plate 350 is provided with an input window 351 corresponding to the screen 401 of the display device 400. The housing 310 has a couple of guide grooves 313 on both inner surfaces thereof under the fixing plate 350, in a longitudinal direction of the housing 310. FIG. 52 illustrates only one guide groove 313, but the same guide groove is formed on the opposite inner surface of the housing which is not depicted.

According to this embodiment, the bottom surface of the housing 310 is formed to be opened or closed with respect to the housing 310, unlike the portable image-forming device 200 discussed previously. Referring to FIG. 52, a bottom plate 311 forming the bottom surface of the housing 310 is engaged with a rear surface of the housing 310 by means of a hinge 317 so as to rotate. The housing 310 has a slit 316 through which a shading plate 370 passes on the front surface thereof. A detailed description on the shading plate 370 will be provided below. A film mounting groove 311a in which an instant film 390 is mounted is disposed on the bottom plate 311.

The housing 310 is provided with a couple of fixing units 380 for fixing the bottom plate 311 on both surfaces thereof. The fixing units 380 may include a clamp 381, a rotary shaft 382 protruding from both ends of the clamp 381, a couple of supporting protrusions 383 for supporting the rotary shaft 382 so as to rotate, and an elastic member 384 for elastically supporting one end of the clamp 381. The supporting protrusions 383A may include a rotation hole in which the rotary shaft 382 is inserted. The elastic member 384 is disposed between a lateral surface of the housing 310 and one end of the clamp 381 such that the other end of the clamp 381 pressurizes a lateral surface of the bottom plate 311 all the time. Accordingly, in response to one end of the clamp 381 on the couple of fixing units 380 being pressed by the user, the elastic member 384 is compressed, and the other end of the clamp 381 is spaced apart from the lateral surface of the bottom plate 311. Accordingly, the bottom plate 311 may be opened at a lower end of the housing 310. A compressive coil spring may be used as the elastic member 384.

The exposure member 320 is disposed inside the housing 310 so as to move in a longitudinal direction of the housing 310, that is, along the couple of guide grooves 313. That is, the exposure member 320 is disposed so as to move along an upper surface of the instant film 390 mounted on the bottom plate 311 of the housing 310. The exposure member 320 forms an image displayed in the screen 401 of the display device 400 on the instant film 390. That is, the exposure member 320 forms the light radiating from the screen 401 of the display device 400 on the instant film 390 so as to expose the instant film 390. The exposure member 320 may include a lens array 321, a lens supporting unit 323, and the shading plate 370.

The lens array 321 forms the image displayed in the screen 401 of the display device 400 on the instant film 390. The lens array 321 may be realized with the same lens of the lens array 221 of the portable image-forming device according to an embodiment. That is, a lens which forms an image according to a difference of a refractive index in a glass fiber may be used as the lens array 321. The lens array 321 may be formed in a length corresponding to the width of the screen 401 of the display device 400. An upper end of the lens array 321 is spaced a certain distance apart from the screen 401 of the display device 400, and a lower end of the lens array 321 is spaced a certain distance apart from the instant film 390 mounted on the bottom surface 311 of the housing 310. The distance between the upper end of the lens array 321 and the screen 401 of the display device 400 and the distance between the lower end of the lens array 321 and the instant film 390 may be set to be different or to be the same according to a specification of the lens array 321.

The lens supporting unit 323 fixes the lens array 321 and enables the lens array 321 to move in the longitudinal direction of the housing 310. Referring to FIG. 55, at least a couple of guide protrusions 325 are formed on both surfaces of the lens supporting unit 323. According to this embodiment, two couples of guide protrusions 325 are disposed on both surfaces of the lens supporting unit 323, and a guide ring 326 is inserted into each of the guide protrusions 325. Accordingly, in response to the exposure member 320 being disposed inside the housing and at least one couple of guide protrusions 325 of the exposure member 320 being located on the couple of guide grooves 313 of the housing 310, the guide ring 326 is located between the protrusions 325 and the guide grooves 313. The guide ring 326 enables the exposure member 320 to move along the guide groove 313 stably without wobble.

In FIG. 55, the guide ring 326 is inserted into the guide protrusions 325 on both ends of the exposure member 320, but not limited thereto. As another example, although not depicted, the guide protrusions 325 on both ends of the exposure member 320 may be realized so as to be guided by the guide groove 313 of the housing 310 without the guide ring 326. In addition, the number of the guide protrusions 325 on both surfaces of the lens supporting unit 323 illustrated in FIG. 55 is only an example. That is, one guide protrusion or three or more guide protrusions 325 may be disposed on one surface of the lens supporting unit 323.

The lens supporting unit 323 may include a pressure member 340 for pressurizing the instant film 390 mounted on the bottom plate 311 while moving along the exposure member 320. The pressure member 340 may be realized as a cylindrical pressure roller. The lens supporting unit 323 is provided with a roller groove 324 on a lower surface thereof. The roller groove 324 is an element in which the pressure roller 340 is rotatably disposed. The pressure roller 340A may include a couple of guide protrusions 341 inserted into the guide grooves 313 of the housing 310 on both ends thereof. The guide ring 343 may be inserted into each of the couple of guide protrusions 341. In response to the lens supporting unit 323 including the pressure roller 340 being disposed between the couple of guide grooves 313 in the housing 310, the pressure roller 340 protrudes from the lower surface of the lens supporting unit 323. Accordingly, upon the exposure member 320 moving, the pressure roller 340 disposed in the lens supporting unit 323 of the exposure member 320 pressurizes the upper surface of the instant film 390 mounted on the bottom plate 311 of the housing 310 such that the developing agent in the instant film 390 is spread over the entire instant film 390 and the part exposed by the lens array 321 is developed.

The shading plate 370 and the moving member 330 are disposed on the front surface and the rear surface of the lens supporting unit 323. The shading plate 370 is disposed on the front surface of the lens supporting unit 323 adjacent to the lens array 321, and the moving member 330 is disposed on an opposite side of the shading plate 370, that is, the rear surface of the lens supporting unit 323 adjacent to the roller groove 324.

The shading cover 370 covers the instant film 390 mounted on the bottom plate 311 of the housing 310 so as to prevent the light radiating from the screen 401 of the display device 400 from exposing the instant film 390. Accordingly, the shading plate 390 may be made of a material for blocking out light and may be realized in a black color for absorbing light.

Figure 56:
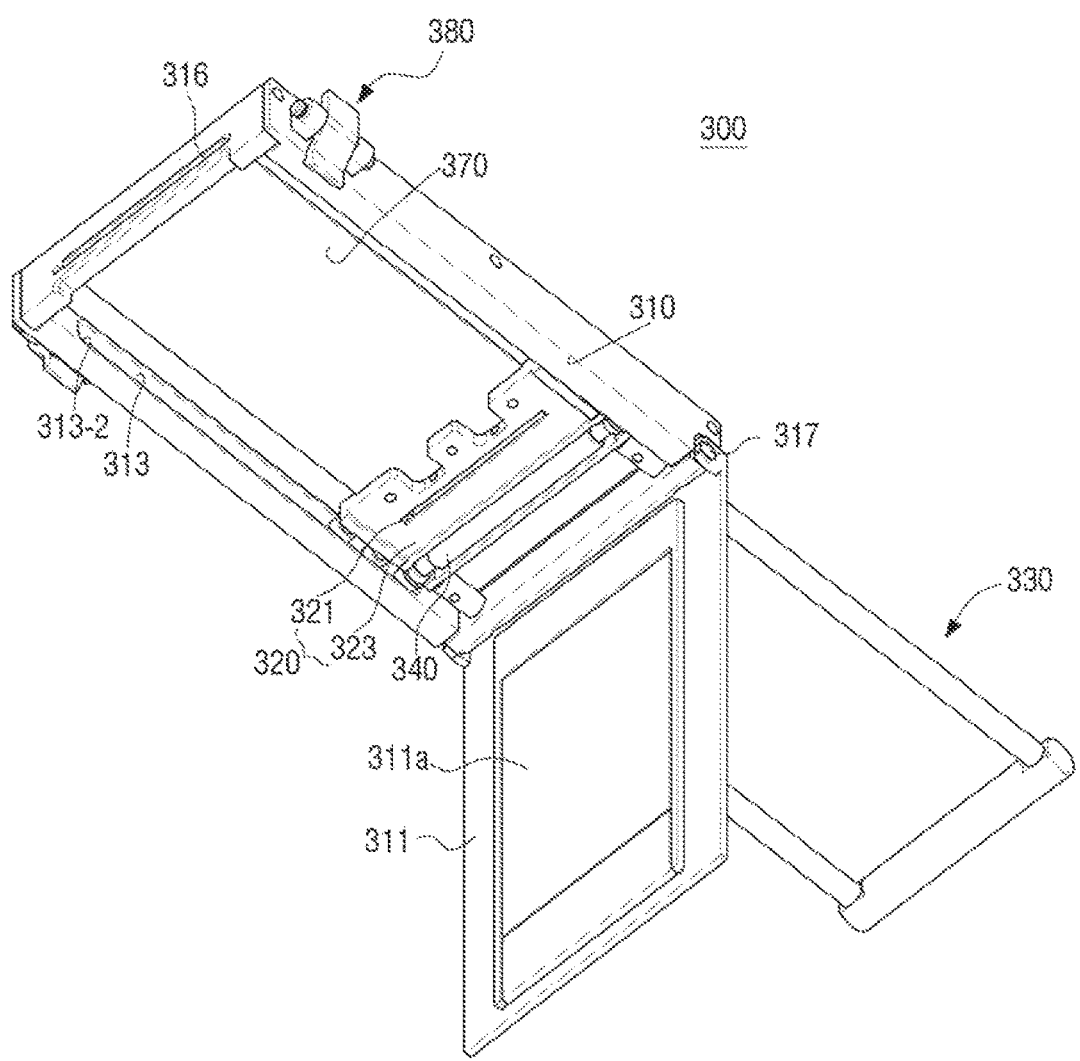
FIG. 56 is a perspective view illustrating a state where the bottom plate is opened to mount an instant film in the portable image-forming device of FIG. 49.

The moving member 330 is an element for enabling the user to manually move the exposure member 320. The moving member 330 may be realized as a handle. Referring to FIGS. 55 and 56, the handle 330 may include a couple of arms 331 and a horizontal rod 333 for connecting both ends of the couple of arms 331. The couple of arms 331 are disposed so as to penetrate the rear surface of the housing in parallel. One end of each of the couple of arms 331 is fixed to be spaced apart from a rear surface adjacent to the roller groove 324 on the lens supporting unit 323 of the exposure member 320. A distance between the couple of the of arms 331 is formed to be broader than the width of the instant film 390 mounted on the bottom plate 311 of the housing 310. Accordingly, upon the exposure member 320 being moved by means of the handle 330, the handle 330 does not interrupt the instant film 390. In addition, the couple of arms 331 have a length corresponding to a length of the shading plate 370. For example, the length of the couple of arms 331 may be longer than the length of the shading plate 370.

Hereinafter, a method of printing an image displayed in the screen of the display device 400 by using the portable image-forming device 300 according to an embodiment will be described.

The user mounts the instant film 390 in the housing 310. To be specific, as illustrated in FIG. 56, the user opens the bottom plate 311 of the housing 310 and mounts the instant film 390 on the film mounting groove 311a on the bottom plate 311. In this case, in order to open the bottom plate 31, the user pressurizes the clamp 381 of the couple of fixing units 380 and spaces one end of the clamp 381 apart from the lateral surface of the bottom plate 311. The instant film 390 may be the same as the instant film 290 discussed previously.

Figure 58:
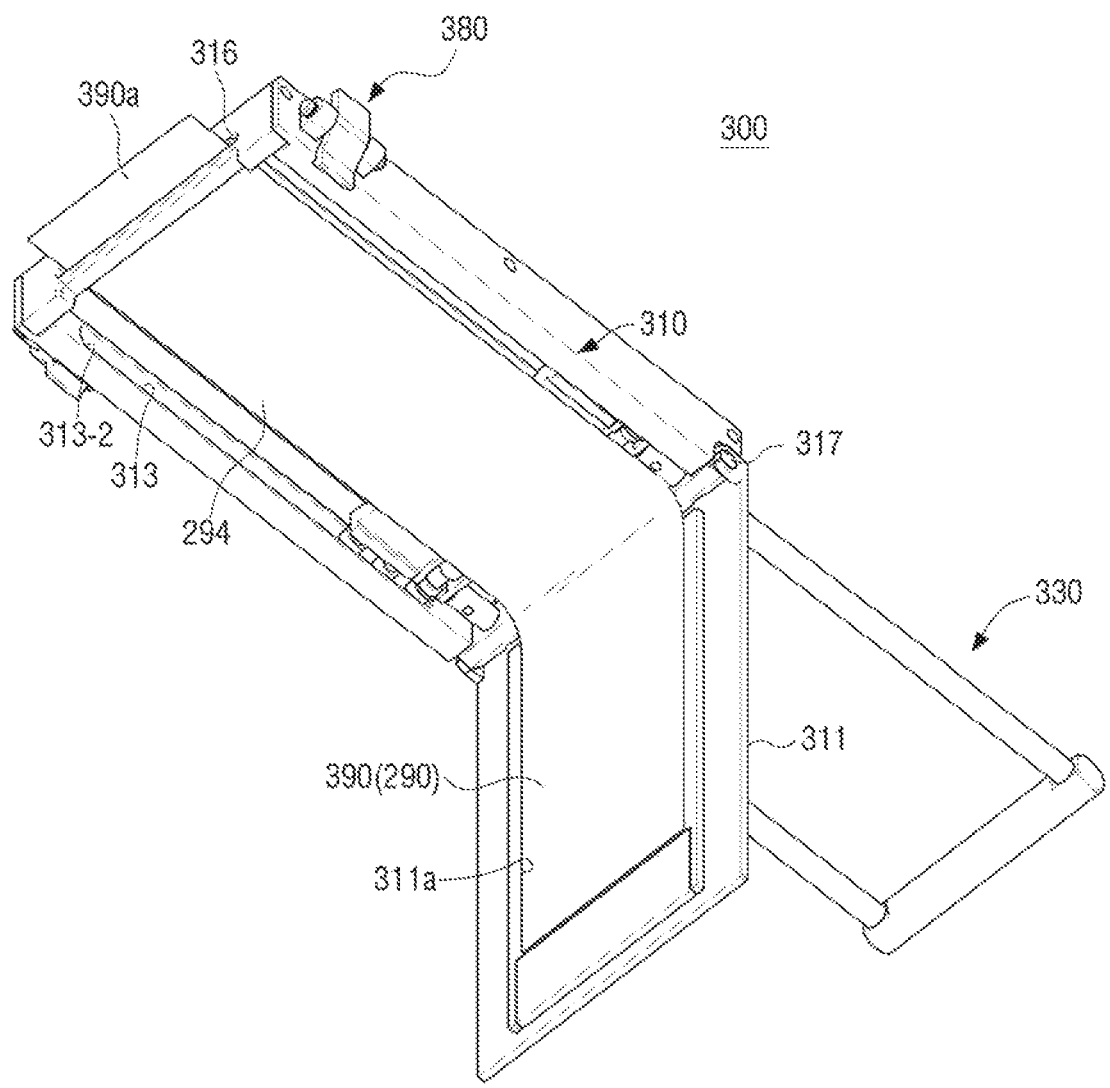
FIG. 58 is a perspective view illustrating a state where an instant film is mounted in the portable image-forming device of FIG. 56.

Subsequently, as illustrated in FIG. 58, the user mounts the instant film 390 on the film mounting groove 311a and inserts a front end 390a of the shading cover extending unit 294 into the slit 316 of the housing 310 such that the front end 390a protrudes to outside the housing 310.

Figure 59:
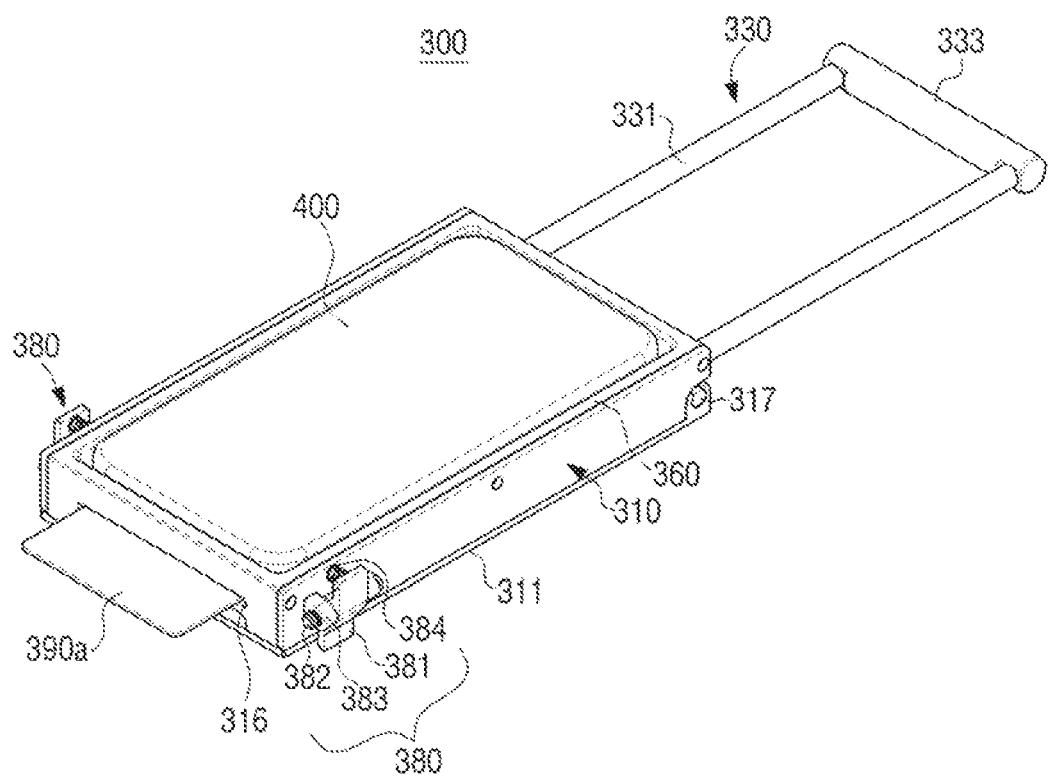
FIG. 59 is a perspective view illustrating a state where the bottom plate of the portable image-forming device of FIG. 58 is closed.

The user rotates the bottom plate 311 and cover the lower end of the housing 310. Consequently, the bottom plate 311 is fixed between a couple of clamps 381 by the elastic force of the couple of fixing units 380 disposed on both lateral surfaces of the housing 310 and is set to be in the state illustrated in FIG. 59. In this case, the front end 390a of the shading cover extending unit 294 of the instant film 390 also protrudes to outside the housing 310. Accordingly, in response to the protruding front end 390a of the shading cover extending unit 294 of the instant film 390 being pulled by the user, the shading cover 293 (refer to FIG. 46) is detached from the protecting plate 291 (refer to FIG. 46), and the instant film member 292 (refer to FIG. 46) is exposed so as to be exposed to the light. However, the shading plate 370 on the upper side of the instant film 390 blocks out the external light in this state, and thus, the instant film member 292 is not exposed to the light.

Subsequently, the user manipulates the display device 400 so as to display the image to be printed in the screen 401.

The user mounts the display device 400 in the display fixing unit 360 such that the screen 401 of the display device 400 faces the input window 351 of the fixing plate 350. Consequently, the portable image-forming device 300 according to an embodiment 300 is set to be in the states illustrated in FIGS. 49 and 53. In this state, the screen 401 of the display device 400 in which the image has been displayed faces the input window 351 of the fixing plate 350, and the input window 351 is blocked out by the shading plate 370 disposed under the fixing plate 350. Accordingly, the image displayed in the screen 401 of the display device 400 is unable to expose the instant film 390 mounted on the bottom plate 311.

In this state, the user holds the housing 310 and the display fixing unit 360 with one hand and pushes the handle 330 toward the housing 310 by holding the horizontal rod 333 of the handle 330 protruding to outside the housing 310 with the other hand.

Accordingly, the exposure member 320 is moved in a direction of Arrow D2 of FIG. 53 along the guide groove 313 of the housing 310 by the users force of pushing the handle 330, and the lens array 321 of the exposure member 320 is located under the screen of the display device 400. Consequently, the instant film 390 mounted on the bottom plate 311 starts to be exposed to the light radiating from the screen of the display device 400.

In response to the handle 330 continuously being pushed by the user, the exposure member 320 is moved, and the light radiating from the screen of the display device 400 exposes the instant film 390 continuously through the lens array 321 of the exposure member 320. In addition, in response to the exposure member 320 being moved in the direction of Arrow D2, the pressure roller 340 disposed behind the lens array 321 presses the developing agent in the instant film 390. Consequently, the developing agent develops the exposed part of the instant film 390.

Figure 57:
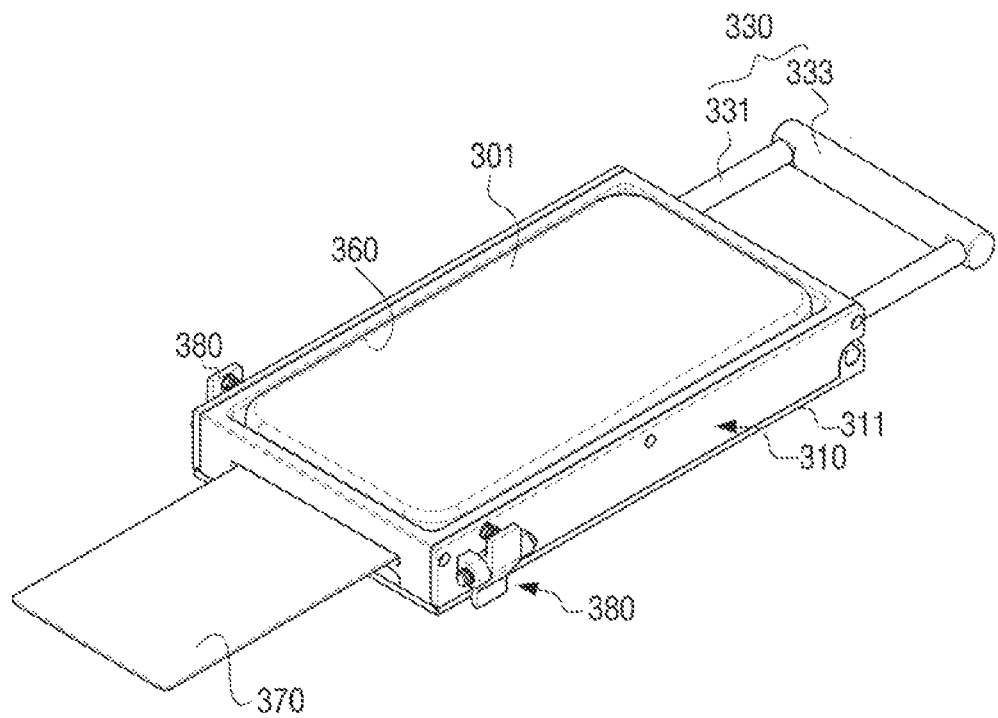
FIG. 57 is a perspective view illustrating a state where a printing operation of a screen of a display device is completed in the portable image-forming device of FIG. 49.

In response to the exposure member 320 being located on a dead-end 313-2 of the guide groove 313 of the housing 321, the exposure member 320 does not move any more even though the user pushes the handle 330. FIGS. 54 and 57 are views provided to describe a state where the exposure member 320 is located on the dead-end 313-2 of the guide groove 313 of the housing 321. As illustrated in FIGS. 54 and 57, in response to the exposure member 320 being located on the dead-end 313-2 of the guide groove 313 of the housing 321, the shading plate 370 is entirely exposed to outside the housing 310, and the image displayed in the screen of the display device 400 is entirely exposed and developed on the instant film 390.

In this state, in response to the bottom plate 311 of the housing 310 being opened as the user presses the couple of fixing units 380, the instant film 390 mounted on the bottom plate 311 of the housing 310 may be detached. Accordingly, the user may obtain a printout of the image displayed in the screen of the display device 400.

As described above, the portable image-forming device according to an embodiment enables the user to move the exposure member manually without a driving source, thereby printing an image displayed in a liquid crystal screen of a display device on an instant film.

In addition, the portable image-forming device according to an embodiment has a simple structure since the portable image-forming device does not require a driving source, such as, a motor, and a power transmission device. Accordingly, the portable image-forming device may reduce the manufacturing costs and may be easily miniaturized.

In addition, the portable image-forming device according to an embodiment enables the user to print an image manually, and thus, does not require power supply unlike other portable image-forming devices using the driving source. Accordingly, the portable image-forming device according to an embodiment has further enhanced portability than other portable image-forming devices using the driving source.

Figure 60:
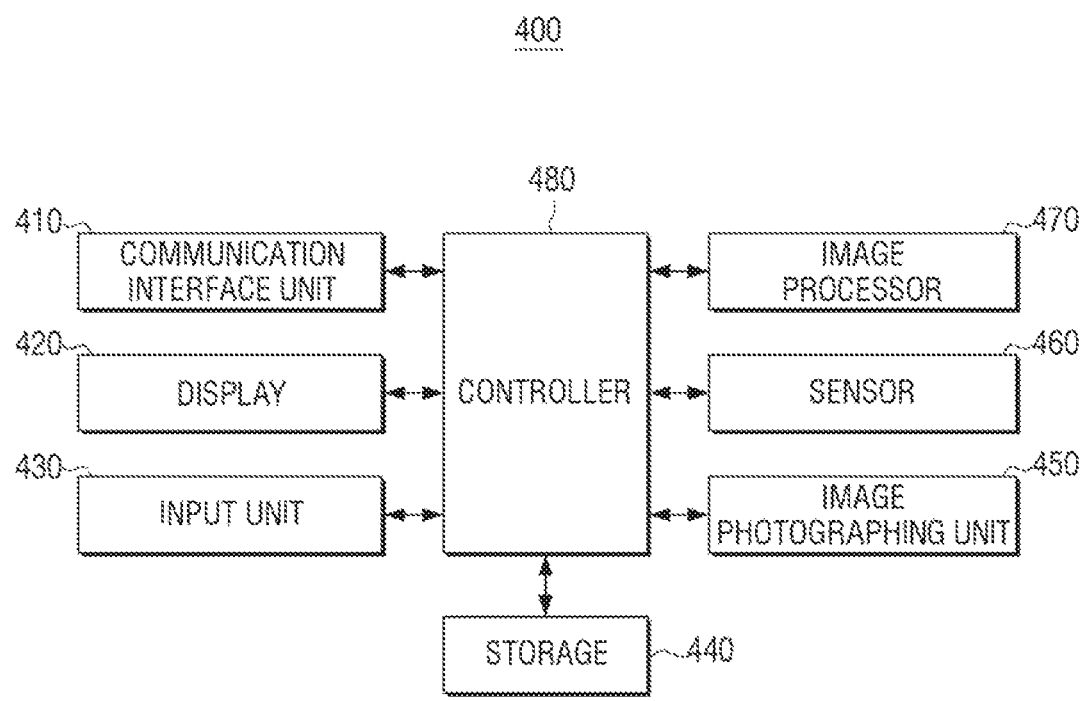
FIG. 60 is a block diagram illustrating a structure of a display device according to an embodiment of the disclosure.

FIG. 60 is a block diagram illustrating a structure of a display device according to an embodiment of the disclosure.

Referring to FIG. 60, the display device 400 according to this embodiment may include a communication interface 410, a display 420, an input unit 430, a storage 440, an image photographing unit 450, a sensor 460, an image processor 470, and a controller 480. In this case, the display device 400 may be a laptop computer, a tablet Personal Computer (PC), a mobile phone, a smart phone, a Portable Multimedia Player (PMP), an MP3 Player, a smart watch, a monitor, or a television (TV) having a display device.

The communication interface 410 connects the display device 400 with an external device (not shown). The communication interface 410 may access the external device through a wireless communication method (for example, General System/Standard for Mobile Communication (GSM), Universal Mobile Telephone System (UMTS), Long Term Evolution (LTE), Wireless Broadband Internet (Wi-Bro), and the like), as well as Local Area Network (LAN) and an Internet network.

The communication interface 410 may communicate with the external device (not shown). To be specific, the communication interface 410 may communicate with a Near Field Communication (NFC) tag attached to the portable image-forming device 100 and receive information on the portable image-forming device 100 from the NFC tag. In this case, the information on the portable image-forming device may be information on a type (or size) of an instant film used for the portable image-forming device 100, an exposure speed, a required brightness value, the number of remaining instant films, and so on.

The communication interface 410 may receive a content from the external device (not shown). The received content may be an image and may be stored in the storage 440. A detailed description on the storage 440 will be provided below.

The communication interface 410 may transmit a content stored in the display device 400 to an external cloud server (not shown) through the Internet network and may transmit/receive information for ordering necessary consumables to/from the portable image-forming device 100.

The display 420 displays an image. To be specific, the display 420 may display an image in predetermined brightness and a predetermined refresh rate. The display 420 may display an image being image-processed by the image processor 470 and may display the image by adjusting the predetermined brightness and the predetermined refresh rate according to control of the controller 480. A detailed description on the image processor 470 and the controller 480 will be provided below. The display 420 may be realized as a display device, such as, Active Matrix Organic Light Emitting Diodes (AMOLED), a Liquid Crystal Display (LCD), and so on. An example of a screen displayed in the display 420 will be described below with reference to FIGS. 61 and 62.

The input unit 430 may include a plurality of function keys for enabling a user to set or select diverse functions of the display device 400. To be specific, the input unit 430 may receive an image print command from the user or receive a print command for a displayed image. Meanwhile, in the illustrated example, the display 420 and the input unit 430 are separate components, but the display 420 and the input unit 430 may be realized as a device of simultaneously performing an input and output in the implementation, for example, a touch screen. In addition, in the implementation, the display device 400 may further include a touch screen and a physical key.

The input unit 430 may receive a selection of an application (or program) for a printing operation using the portable image-forming device 100. In addition, the input unit 430 may receive a selection of an image (or content) to be printed while the application is being operated. Meanwhile, in this embodiment, the image is selected after the application is selected. However, in the implementation, an image is selected by a user, and then an application may be operated in response to a user's print command.

Herein, the portable image-forming device may refer to a printing device which exposes an instant film to a light radiating from a screen of the display 420. The portable image-forming device may be an instant printing device having the structure described above in connection with FIG. 2, an instant printing device according to an embodiment described above in connection with FIG. 25, an instant printing device according to an embodiment described above in connection with FIG. 39, and an instant printing device according to an embodiment described above in connection with FIG. 49. In addition, the portable image-forming device may be a device which exposes an instant film by means of the exposure member 130 which is operated manually, on top of a device having the above-described structures.

The input unit 430 may receive a print command for a selected image. In case of the input unit 430 being realized as a touch screen, the print command may be inputted as a print command in response to receiving a touch corresponding to an arrangement of a plurality of touch sensors disposed on the portable image-forming device 100.

The input unit 430 may receive a printing option of the image. In this case, the printing option may include brightness, exposure, chroma, and so on. The input unit 430 may receive a selection of other printing options.

The storage 440 stores a program for operating the display device 400. To be specific, the storage 440 may store a program that is a set of various commands necessary for operating the display device 400. In this case, the program may include an application for providing a particular service and an operating program for operating the application. The application may be an application for the printing operation using the portable image-forming device.

The storage 440 may include a content. To be specific, the storage 440 may store a content generated in the image photographing unit 450 (for example, a picture image or a moving image) and a content received through the communication interface 410. A detailed description on the image photographing unit 450 will be provided below.

The storage 440 may store the exposure speed sensed by the sensor 460. A detailed description on the sensor 460 will be provided below. In addition, the storage 440 may store information received from an NFC patch attached to the portable image-forming device 100 through the communication interface 410. The storage 440 may store information on a refresh rate corresponding to the portable image-forming device.

The storage 440 may be realized as a recording medium in the display device 400 and an external recording medium, for example, a removable disk including a universal serial bus (USB) memory, a Web server through a network, and the like.

The image photographing unit 450 photographs an image. To be specific, the image photographing unit 450 may photograph an exposure position of the portable image-forming device. A photographed output may be transmitted to the sensor 460.

The sensor 460 senses an exposure area of the portable image-forming device 100. To be specific, the sensor 460 may sense the exposure area according to a location of a plurality of touch sensors of the portable image-forming device on the touch screen. In this case, the exposure speed refers to a moving speed of the exposure member of the portable image-forming device 100 and may be called 'scanning speed' of the portable image-forming device 100. A detailed description on the sensing method will be provided below with reference to FIG. 63. The sensor 460 may sense an arrangement direction of the portable image-forming device and the display device by using the plurality of touch sensors on the touch screen.

The sensor 460 senses the exposure speed of the portable image-forming device 100. To be specific, the sensor 460 may sense the exposure speed according to the location of the touch sensor of the portable image-forming device on the touch screen. A detailed description on the sensing method will be provided below with reference to FIG. 64. In addition, the sensor 460 may sense the exposure speed according to the exposure position photographed by the image photographing unit 450. The sensed exposure speed may be stored in the storage 440.

The image processor 470 adjusts a size of an image to be displayed in the display 420. To be specific, the image processor 470 may adjust a size and a location such that the image is displayed in an area of the display 420 corresponding to the exposure area of the portable image-forming device.

The image processor 470 adjusts the brightness of the image displayed in the display 420. To be specific, the image processor 470 adjusts a brightness value of the image such that the same light quantity is provided to the instant film according to an exposure position of the portable image-forming device.

More particularly, the portable image-forming device according to this embodiment uses the exposure member 130 which is operated manually. In this regard, the moving speed of the exposure member 130 in the exposing operation may be not constant. Accordingly, in order to correct a deviation of the exposure speed, the display device 400 according to this embodiment senses the moving speed of the exposure member 130 (that is, the exposure speed) by using the sensor 460 and adjusts the brightness of the image so as to have a brightness value corresponding to the sensed exposure speed with respect to a direction of the image corresponding to an exposure direction.

For example, when the entire image has the same brightness value, and the moving speed of the exposure member 130 is fast, the exposure at a corresponding section may be insufficient as compared with the other area. By contrast, when the moving speed of the exposure member 130 is slow, the exposure at the corresponding section may be excessive as compared with the other area.

Accordingly, the image processor 470 according to this embodiment may adjust the image brightness corresponding to the moving speed of an image area for each of a plurality of image areas corresponding to the exposure section. For example, when an image is divided into area A, area B, and area C, a moving speed of area A is the fastest, area B has an average moving speed, and a moving speed of area C is the slowest, the image processor 470 may correct a brightness value of area A to be higher than a brightness value of area B and a brightness value of area C to be lower than the brightness value of area B, while correcting the entire image to have a brightness value corresponding to the moving speed of area B. Meanwhile, in this embodiment, an image is divided into three areas to correct the image brightness, which is for convenience in explanation. However, in the implementation, the image may be divided into three or more areas, or an area of the image may be divided by the number of pixels corresponding to the exposure direction.

In addition, in this embodiment, the image processor 470 divides an image into a plurality of areas and adjusts the brightness value of each of the plurality of divided areas, which is an example for a case where the exposure speed is sensed before a print command is received. That is, when an operation of sensing the exposure speed and an operation of correcting the brightness value according to the sensed exposure speed are performed in real time, the brightness of the entire image may be corrected to correspond to the sensed exposure speed.

The controller 480 controls the components of the display device 420. To be specific, in response to a print command being received from the user, the controller 480 may control the display 420, the sensor 460, and the image processor 470 such that the portable image-forming device performs a printing operation for an image which is currently displayed.

In response to the print command being received, the controller 480 may control the display 420 to display an image in a display area of the display 420 corresponding to the sensed exposure area.

In addition, in response to the print command being received, the controller 480 may control the image processor 470 to adjust the brightness of the display 420 to be higher than predetermined brightness and adjust the brightness of the image on the adjusted brightness of the display 420. This operation may be performed in the display 420 realized as the AMOLED.

In addition, in response to the print command being received, the controller 480 may control the display 420 to display the image at a refresh rate which is different from a predetermined first value (a value in a normal operational state). To be specific, the controller 480 may control the display 420 to display the image at a refresh rate corresponding to the exposure speed of the portable image-forming device.

More particularly, in displaying an image, a common display device displays an image at a predetermined refresh rate. However, upon the moving speed of the exposure member 130 being fast, a black line illustrated in a left image (a) of FIG. 65 may be generated due to an intersection between the moving speed of the exposure member 130 and the refresh rate. Accordingly, a manufacturer of the display device 400 or a manufacturer of the portable image-forming device may preset a refresh rate value which does not cause the black line according to various moving speeds of the exposure member 130, through diverse experiments. Accordingly, the controller 480 may control the display 420 to display the image at a refresh rate corresponding to information which is pre-stored in the storage 440 or a sensed speed of the exposure member 130 (exposure speed). Meanwhile, when the image is displayed at the refresh rate of '0' by the display 420, the above-described black line is not generated. In this regard, the controller 480 may control the display 420 to display the image at the refresh rate of '0'.

In response to the print command being received and a predetermined time elapsing, the controller 480 may change the changed refresh rate to an original value. Meanwhile, in the above embodiment, the refresh rate is changed in response to the predetermined time elapsing. However, in the implementation, the refresh rate may be changed in response to a touch corresponding to the arrangement of the plurality of touch sensors not being sensed any more. That is, the refresh rate may be changed to the original value in response to sensing that the portable image-forming device and the display device are spaced apart from each other.

As described above, the display device 400 according to this embodiment may perform a correcting operation including correcting the image quality, in the printing operation using the portable image-forming device which exposes the instant film by means of the exposure member which is operated manually. Specially, the display device 400 according to this embodiment may correct the degradation of image quality which may occur according to the manual operation of the exposure member. In addition, the display device 400 may correct the degradation of image quality due to the intersection of the exposure speed of the exposure member and the refresh line.

Figure 61:
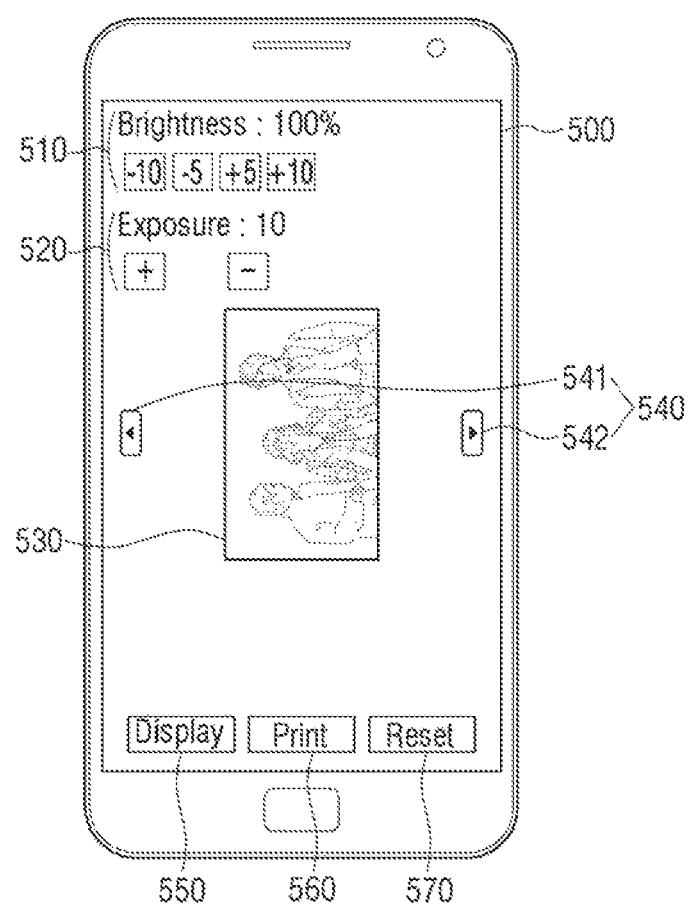
FIGS. 61 and 62 are views provided to describe examples of a user interface window which may be displayed in a display of FIG. 60.
Figure 62:
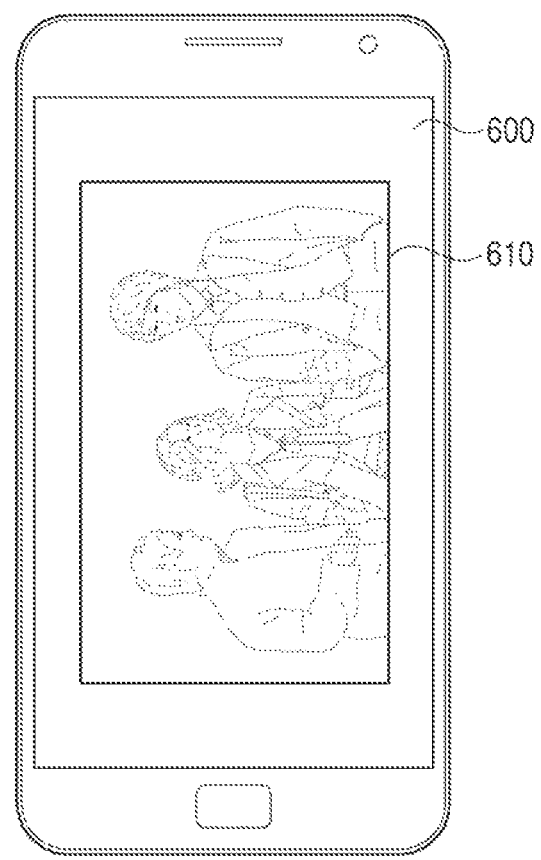

FIGS. 61 and 62 are views provided to describe examples of a user interface window which may be displayed in a display of FIG. 60.

Referring to FIG. 61, a user interface window 500 may include a brightness adjusting area 510, an exposure adjusting area 510, an image displaying area 530, an image selecting area 530, a displaying area 550, a printing area 560, and a resetting area 570.

The brightness adjusting area 510 is an area for receiving a selection of brightness to be applied to a selected image from a user. In response to the brightness adjusting area 510 being selected by the user, the brightness of a displayed image may be adjusted by reflecting the received brightness value.

The exposure adjusting area 510 is an area for receiving a selection of a duration time of a display operation for printing the selected image, that is, a selection as for how many seconds the display operation for printing the selected image will be continued. For example, in response to an image of FIG. 62 being displayed according to the users print command and a time which is preset by the user elapsing, a screen may return to a screen of FIG. 61.

The image selecting area 530 is an area for displaying an image which is currently selected.

The image selecting area 530 is an area for receiving a selection of an image before the currently displayed image or an image next to the currently displayed image among images stored in the storage 440.

The displaying area 550 is an area for receiving a user's command for displaying a list of images which may be printed.

The printing area 560 is an area for receiving a print command for the image selected in the image selecting area 530. In response to the printing area 560 being selected by the user, the image selected in the image selecting area 530 is adjusted so as to be printed in the portable image-forming device without the degradation of image quality and displayed as illustrated in FIG. 62.

The resetting area 570 is an area for receiving a command for initializing a user's preset option.

Figure 63:
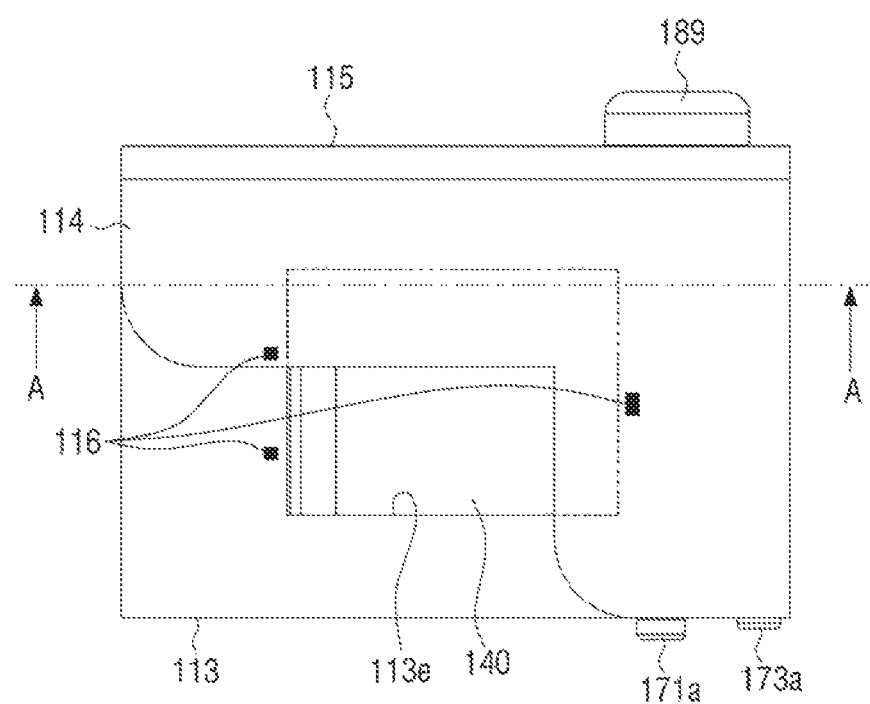
FIG. 63 is a view illustrating a shape of a portable image-forming device according to an embodiment of the disclosure.

FIG. 63 is a view illustrating a shape of a portable image-forming device according to an embodiment of the disclosure.

Referring to FIG. 63, a portable image-forming device 100' according to an embodiment further may include a plurality of touch sensors 116 on top of the components of the portable image-forming device 100 discussed previously. The portable image-forming device 100' may include the same components as the portable image-forming device 100 discussed previously except for the plurality of touch sensors 116, and thus, a repeated description is omitted.

The plurality of touch sensors 116 are disposed around the incident window 113e. Accordingly, in response to the portable image-forming device 100' and the display device 400 being attached for the printing operation as illustrated in FIG. 21, the touch screen of the display device 400 may sense a location of the plurality of touch sensors 116 and sense a size of the incident window 113e based on the sensed location of the plurality of touch sensors 116. For example, in response to the display device 400 recognizing that the touch sensors are spaced 5 mm apart from the incident window 113e, the display device 400 may determine the size of the incident window 113e by subtracting 10 mm from the distance of the sensed two locations. In addition, in response to the plurality of touch sensors being disposed in an area in which a location of the incident window 113e may be recognized (for example, a vertex of the incident window), the display device 400 may determine the location of the incident window based on the sensed location.

The plurality of touch sensors 116 may be arranged in a form for determining a disposing direction of the display device with respect to an instant printing device. For example, in response to the display device being attached as illustrated in FIG. 21, one touch is sensed on an upper side of the display device 400, and two touches are sensed on a lower side of the display device 400. In response to the upper side and the lower side of the display device being reversed and coming into contact with each other, two touches may be sensed on the upper side of the display device 400, and one touch may be sensed on the lower side of the display device 400. Accordingly, the display device 400 may recognize an attached form of the display device 400 and the portable image-forming device 100' based on the arrangement of the touch sensors 116. In response to determining that the arrangement of the touch sensors 116 not being in accord with an intention of the manufacturer, the display device 400 may output an error message (voice) or output the displayed image by rotating 180 degrees.

The plurality of touch sensors 116 may be used to determine whether the display device is disposed accurately on the instant printing device. For example, in response to determining that a touched point on the upper side is not located at a particular coordinate at which the touched point is supposed to be located when two devices come into contact with each other accurately, the display device may output that the devices are not located accurately. In response to determining that the display device is disposed on an accurate position, the display device may notify that the display device has been disposed accurately.

Figure 64:
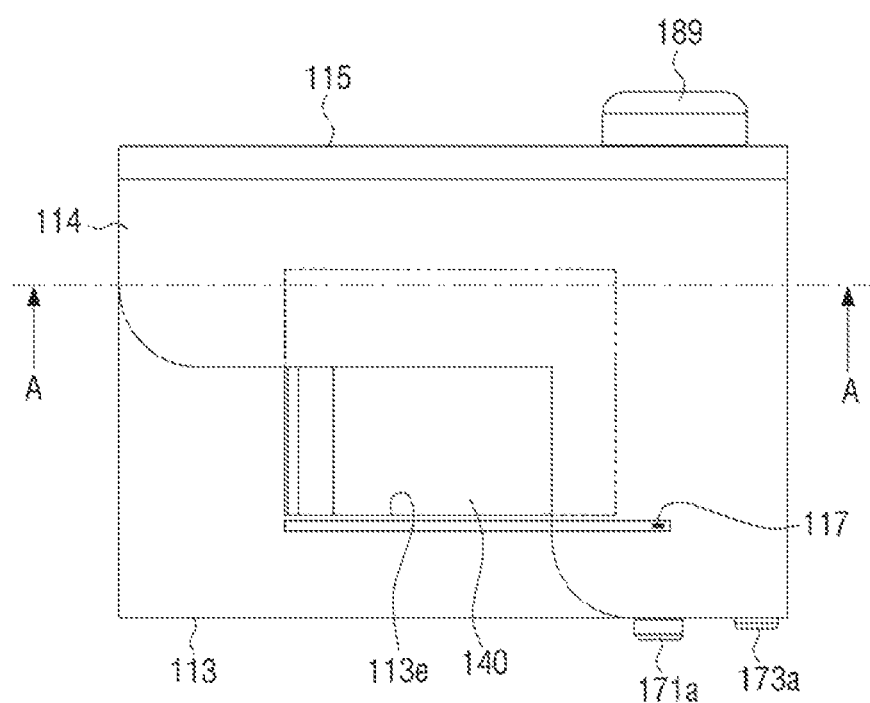
FIG. 64 is a view illustrating a shape of a portable image-forming device according to an embodiment of the disclosure.

FIG. 64 is a view illustrating a shape of a portable image-forming device according to an embodiment of the disclosure.

Referring to FIG. 64, a portable image-forming device 100'' according to an embodiment further may include a touch sensor 117 which moves to correspond to the movement of the exposure member 130, on top of the components of the portable image-forming device 100 discussed previously. The portable image-forming device 100'' may include the same components as the portable image-forming device 100 discussed previously except for the touch sensor 117, and thus, a repeated description is omitted.

The touch sensor 117 is disposed around the incident window 113e and moves to correspond to the movement of the exposure member 130. Accordingly, in response to the portable image-forming device 100'' and the display device 400 being attached for the printing operation as illustrated in FIG. 21, the touch screen of the display device 400 may sense a location of the touch sensor 117. In response to the exposure member 130 being operated manually by the user, the display device 400 may sense a movement of the touch sensor 117 and sense the moving speed of the exposure member 130 (exposure speed) based on the sensed location.

Figure 65:
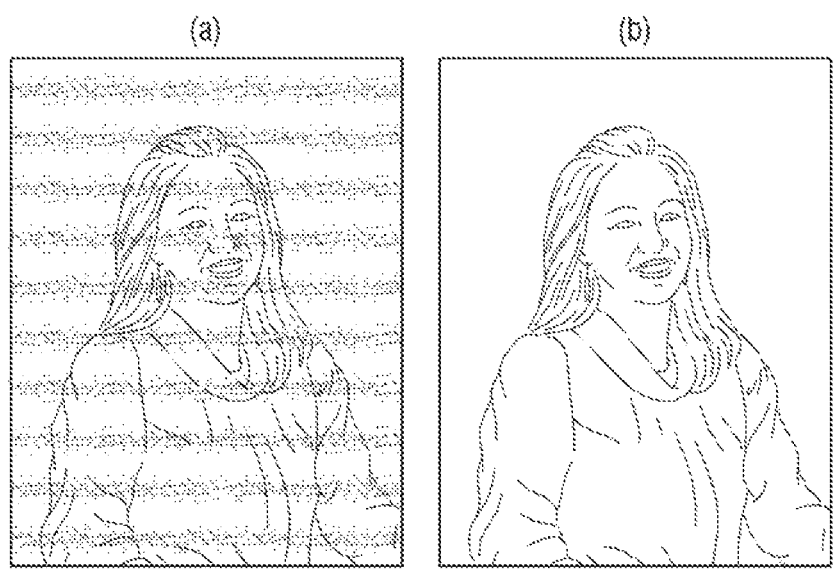
FIG. 65 is a view illustrating a printed state of an instant film according to brightness of a display.
Figure 66:
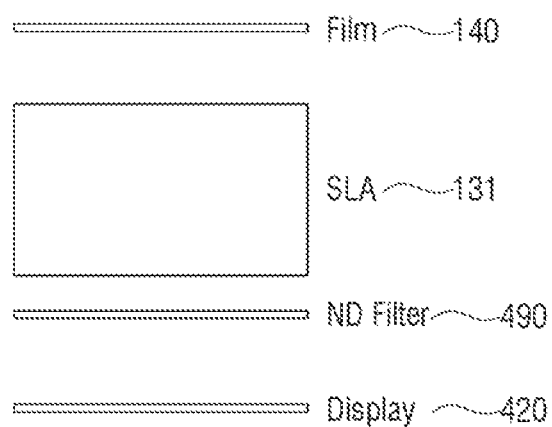
FIG. 66 is a view provided to describe an example of adjusting brightness of a display.

FIG. 65 is a view illustrating a printed state of an instant film according to a brightness value of a display when the display 420 is realized as the AMOLED. To be specific, a left image (a) of FIG. 65 shows a printed image when the brightness of the AMOLED is set to be 71%, and a right image (b) of FIG. 65 shows a printed image when the brightness of the AMOLED is set to be 72%.

The AMOLED is operated linearly with respect to luminance brightness in a high-luminance area and is operated by applying an AMOLED Impulsive Driving (AID) function in a medium luminance area and a low luminance area. The AMOLED realizes brightness variation by applying an AID constant section (off Duty 40%) in the medium luminance area and by applying a variable AID section (off Duty variation) in the low luminance area (below 110 cd).

As described above, the AMOLED has different operating manners for each luminance section. In this regard, in order to perform the printing operation in the portable image-forming device, it is preferred to control the display 420 such that the AMOLED is operated in the high-luminance area, that is, operated in the brightness value greater than 72%.

However, as the brightness value of the display device 420 increases, the bright value of a printout increases correspondingly. Accordingly, in order to resolve such problem, an ND filter may be disposed between the exposure member 130 and the display 420 as illustrated in FIG. 49 so as to reduce the light quantity transferred to the portable image-forming device 100.

Alternatively, the brightness of the image may be image-processed to be dark to correspond to the adjusted brightness of the display 420 while maintaining the light quantity of the portable image-forming device 100 to be constant.

Figure 67:
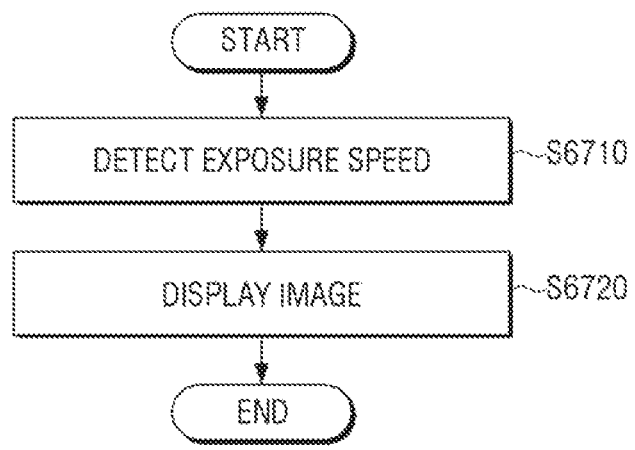
FIG. 67 is a flowchart provided to describe a method for controlling a printing operation according to an embodiment of the disclosure.

FIG. 67 is a flowchart provided to describe a method for controlling a printing operation according to an embodiment of the disclosure.

Referring to FIG. 67, an exposure speed of the portable image-forming device which exposes an instant film to a light radiating from a screen of a display is sensed in operation S6710. To be specific, the exposure speed may be sensed according to a location of a touch sensor on a touch screen of the portable image-forming device. The sensing method was described above in connection with FIG. 64, and thus, a repeated description is omitted. In the implementation, the exposure speed may be sensed by photographing an exposure position and sensing variation of the exposure position in a photographed image. In this case, the portable image-forming device refers to a printing device which exposes an instant film to the light radiating from the screen of the display 420.

Subsequently, brightness of an image to be displayed in the display is adjusted according to the sensed exposure speed, and the adjusted image is displayed in operation S6720. To be specific, the brightness of the image value may be adjusted such that the same light quantity is provided to the instant film according to an exposure position of the portable image-forming device.

According to the method, the degradation of image quality which may occur according to the manual movement of the exposure member 130 may be corrected. The method for controlling a display of FIG. 50 may be executed in a display device having the structure of FIG. 60 and in a display device having the other structures.

The above-described method may be realized as a program (or application) having an executable algorithm which may be executed in a computer, and the program may be stored in a non-transitory computer readable medium.

The non-transitory computer readable medium refers to a medium which may store data permanently or semi-permanently rather than storing data for a short time, such as, register, cache, memory, and the like, and may be readable by an apparatus. To be specific, the above-described various applications and programs may be stored in and provided through the non-transitory computer readable medium, such as, Compact Disc (CD), Digital Versatile Disk (DVD), hard disk, Blu-ray disk, Universal Serial Bus (USB), memory card, Read-Only Memory (ROM), and the like.

Figure 68:
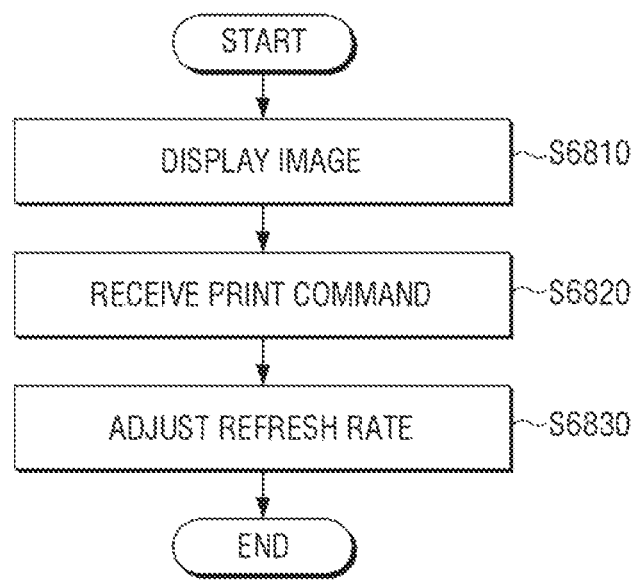
FIG. 68 is a flowchart provided to describe a method for controlling a printing operation according to an embodiment of the disclosure.

FIG. 68 is a flowchart provided to describe a method for controlling a printing operation according to an embodiment of the disclosure.

Referring to FIG. 68, an image is displayed at a predetermined refresh rate in operation S6810.

A print command is received in operation S6820. The print command may be a selection of a predetermined area on the touch screen and may be executed by a contact with respect to the portable image-forming device or by sensing of a touch sensor of the portable image-forming device. Meanwhile, in this embodiment, the print command is received through an access of the touch sensor on the touch screen, but in the implementation, a lid switch may be used.

In response to the print command being received, the image is adjusted and displayed at a refresh rate different from the predetermined refresh rate in operation S6830. To be specific, the refresh rate of the display may vary such that the image is displayed at a refresh rate corresponding to the exposure speed of the portable image-forming device.

According to the above-described method, the degradation of image quality due to the intersection of the exposure speed of the exposure member and the refresh line may be corrected. The method for controlling a display of FIG. 68 may be executed in a display device having the structure of FIG. 60 and in a display device having the other structures.

In addition, the above-described method may be realized as a program (or application) having an executable algorithm which may be executed in a computer, and the program may be stored in a non-transitory computer readable medium.

Hereinafter, a structure of a portable image-forming device according to an embodiment will be described with reference to FIGS. 69 to 79. The portable image-forming device according to an embodiment may be supplied with power so as to operate an exposure member and form an image displayed in the display device 400 on an instant film immediately, unlike the portable image-forming devices 100, 200, 300, 400 discussed previously which are operated manually.

Figure 69:
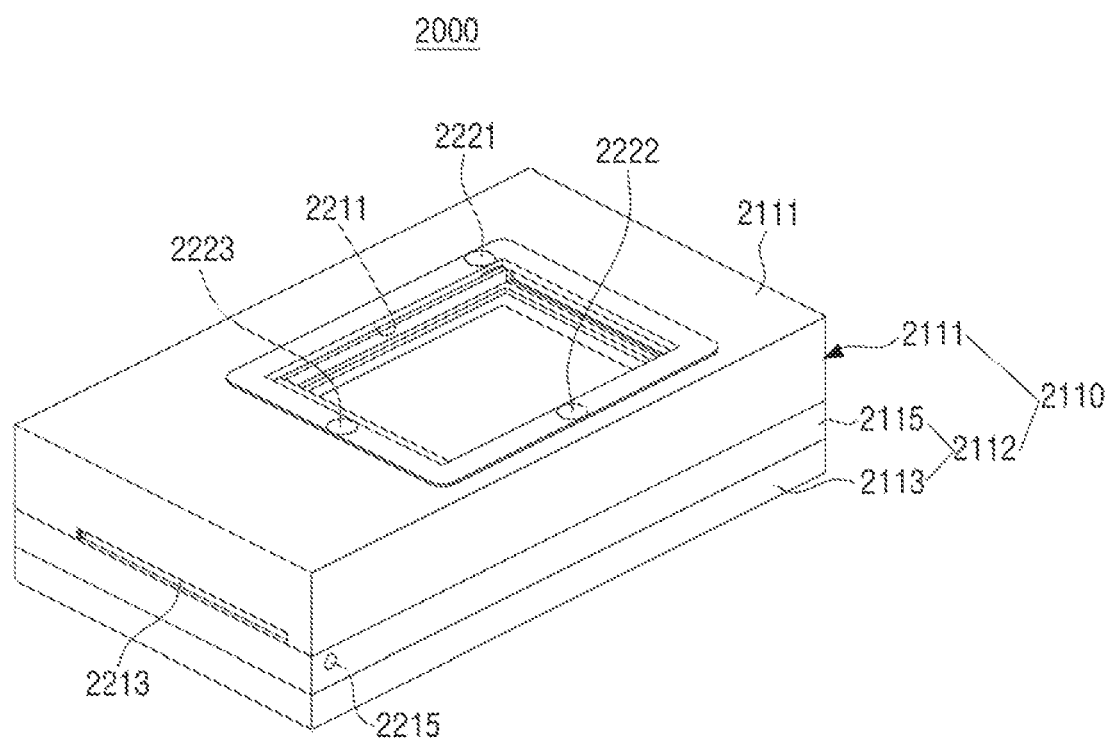
FIG. 69 is a perspective view illustrating a portable image-forming device according to an embodiment of the disclosure.
Figure 70:
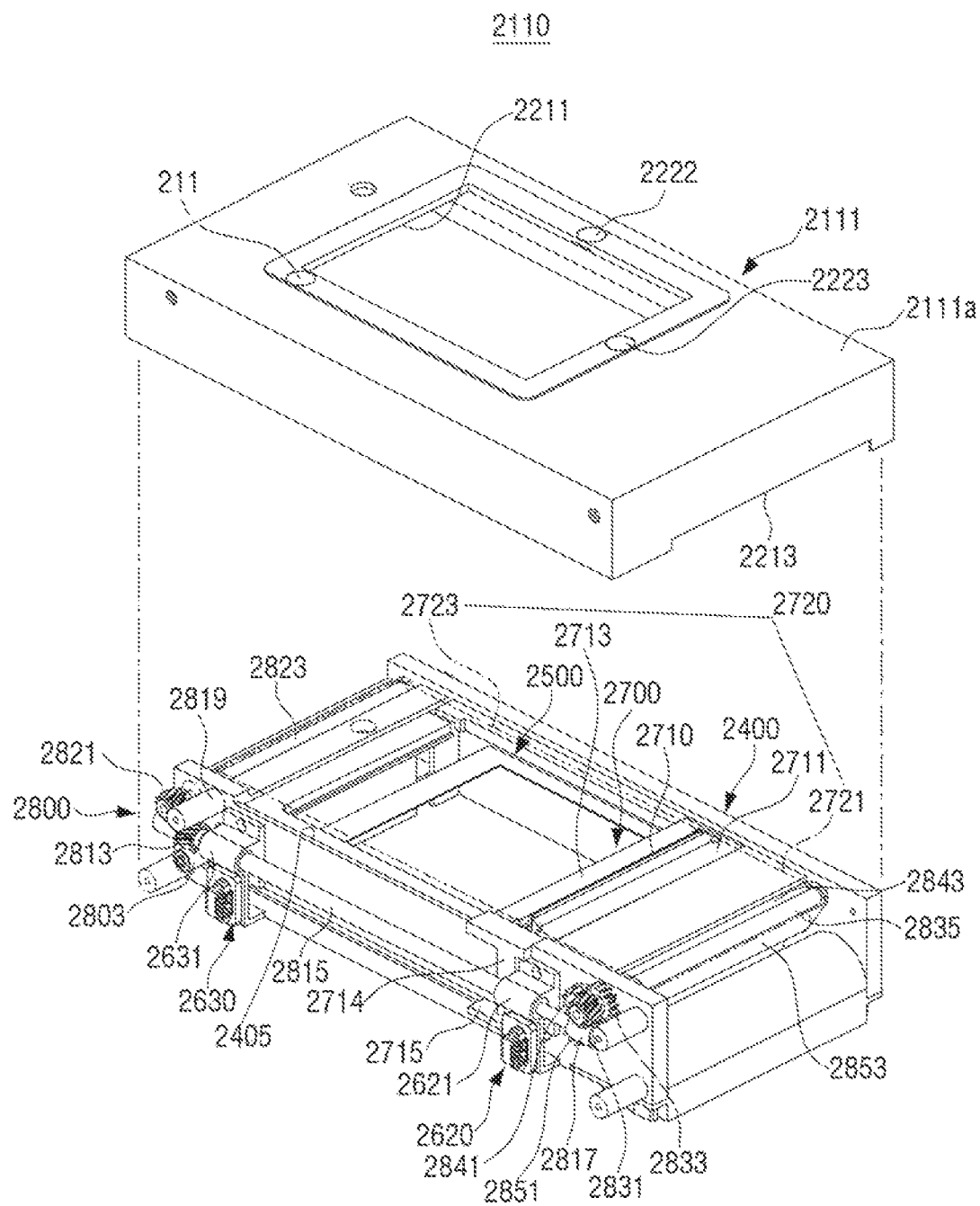
FIG. 70 is an exploded perspective view illustrating an upper housing of the portable image-forming device according to an embodiment of the disclosure.
Figure 71:
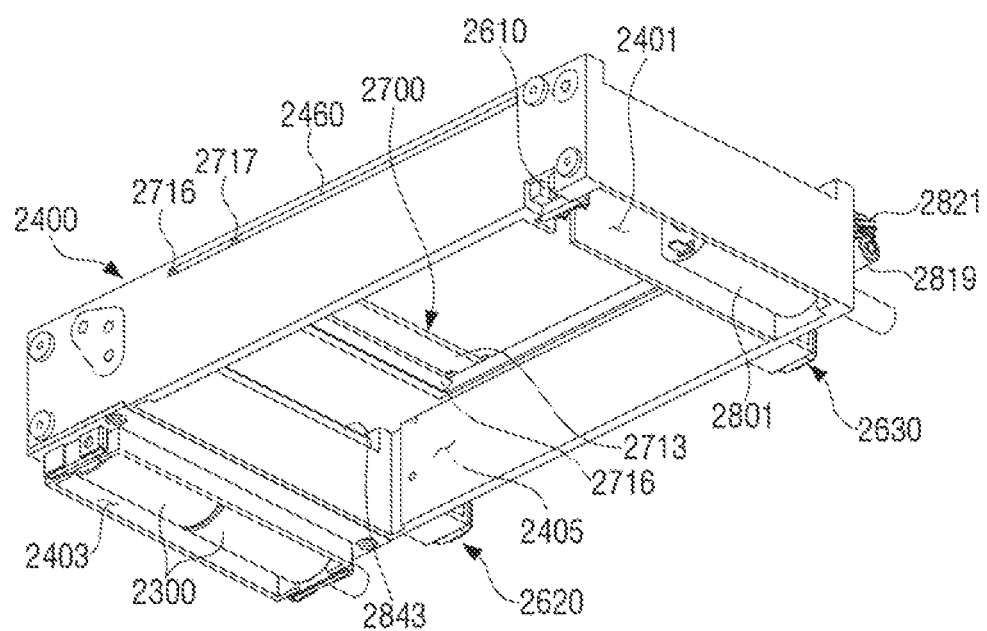
FIG. 71 is a perspective view illustrating the upper housing without a cover of FIG. 70.
Figure 72:
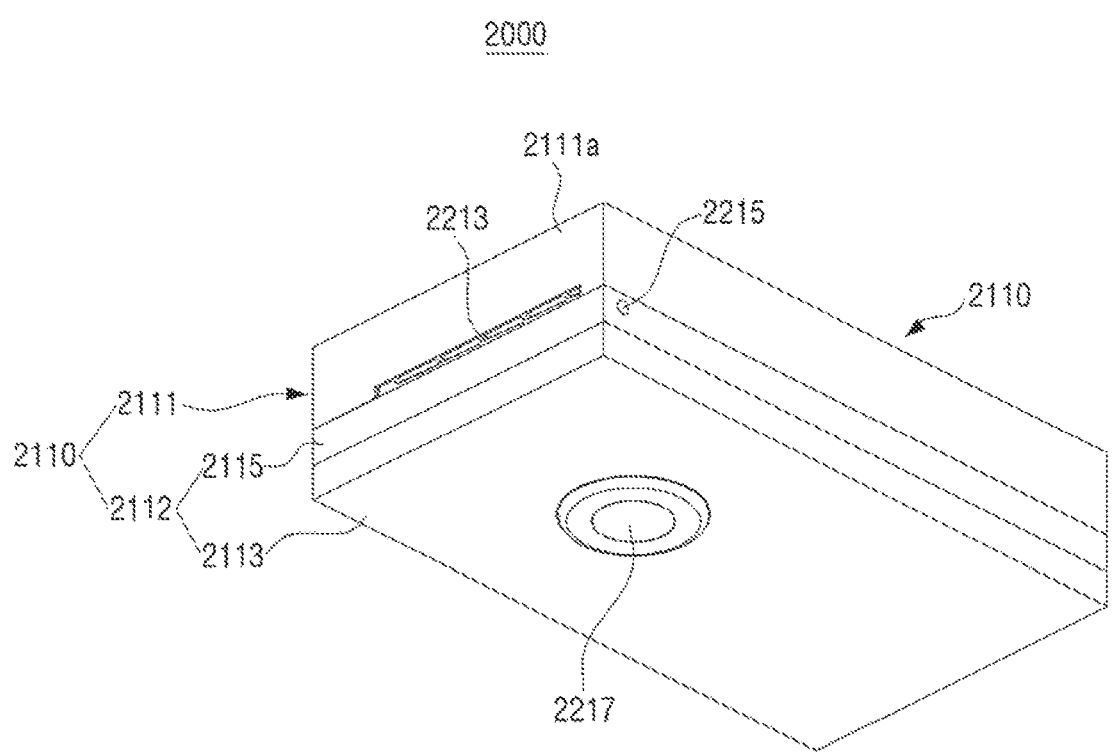
FIG. 72 is a perspective view illustrating a button disposed on a lower housing.
Figure 73:
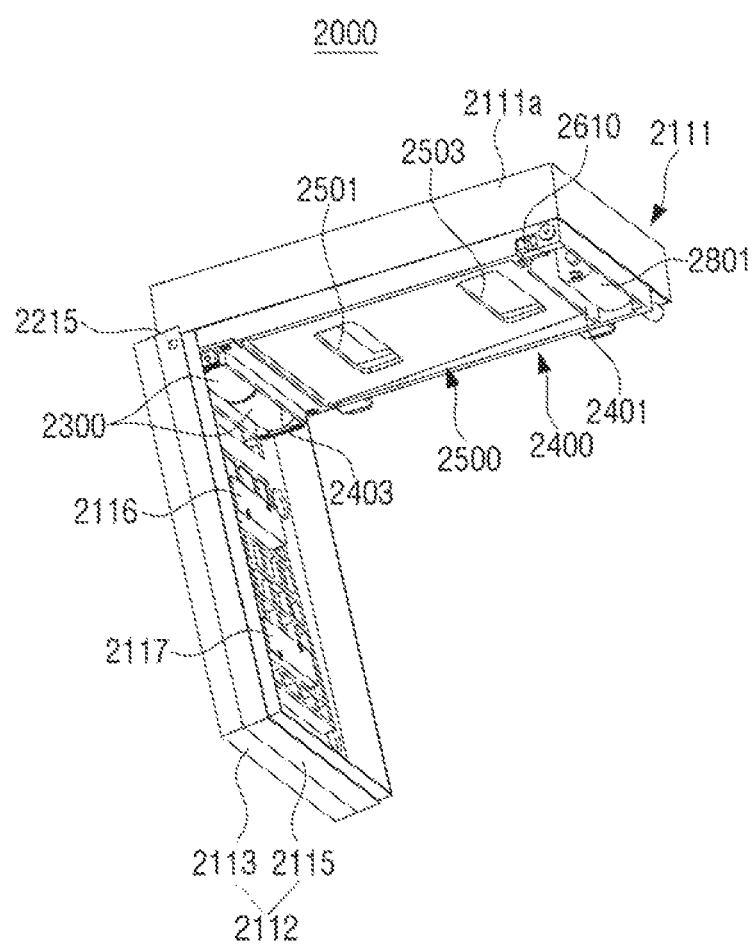
FIGS. 73 and 74 are perspective views illustrating an open state of the portable image-forming device according to an embodiment of the disclosure at different angles.
Figure 74:
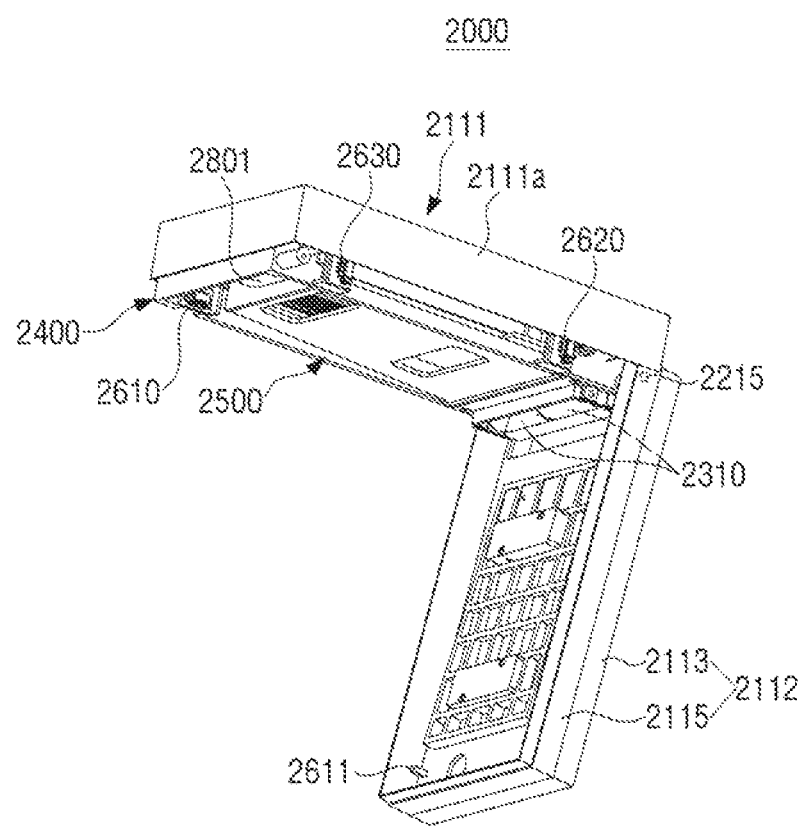
Figure 75:
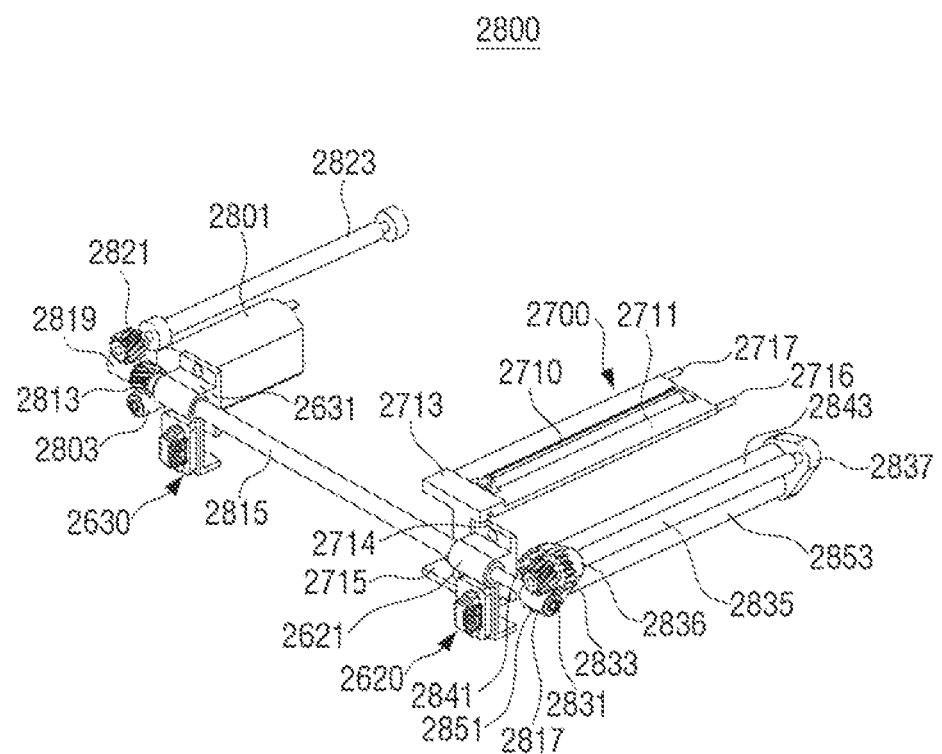
FIGS. 75 and 76A are perspective views illustrating a driving unit of FIG. 70 at different angles.
Figure 76A:
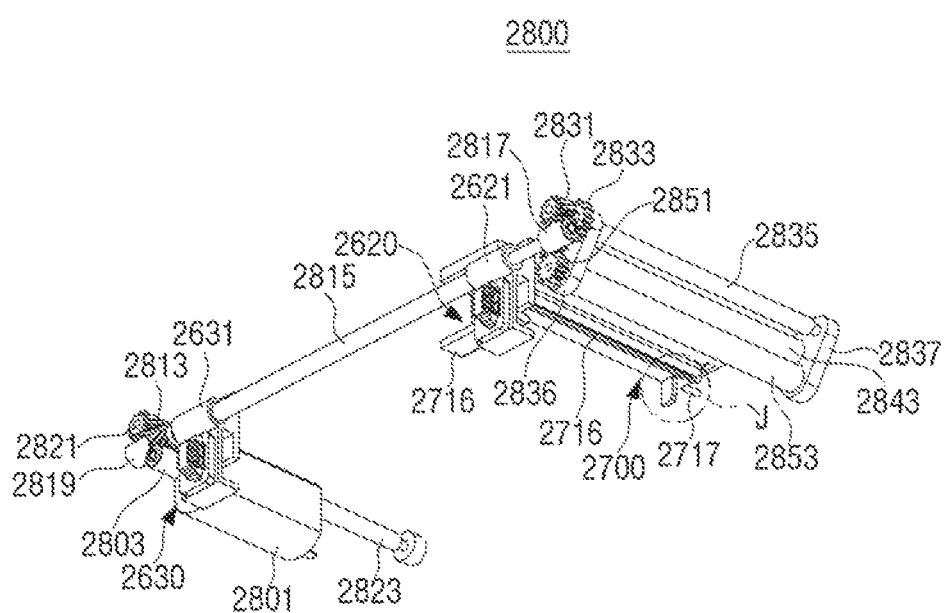
Figure 76B:
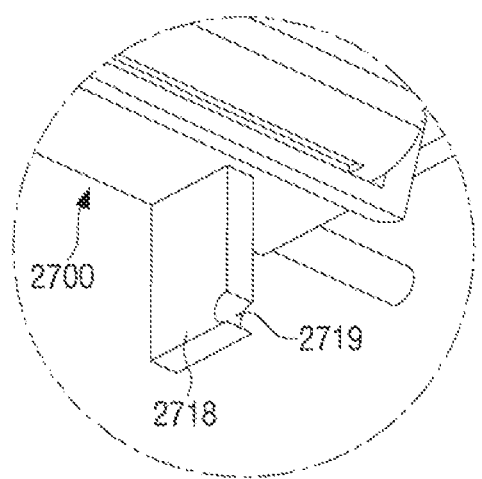
Figure 77:
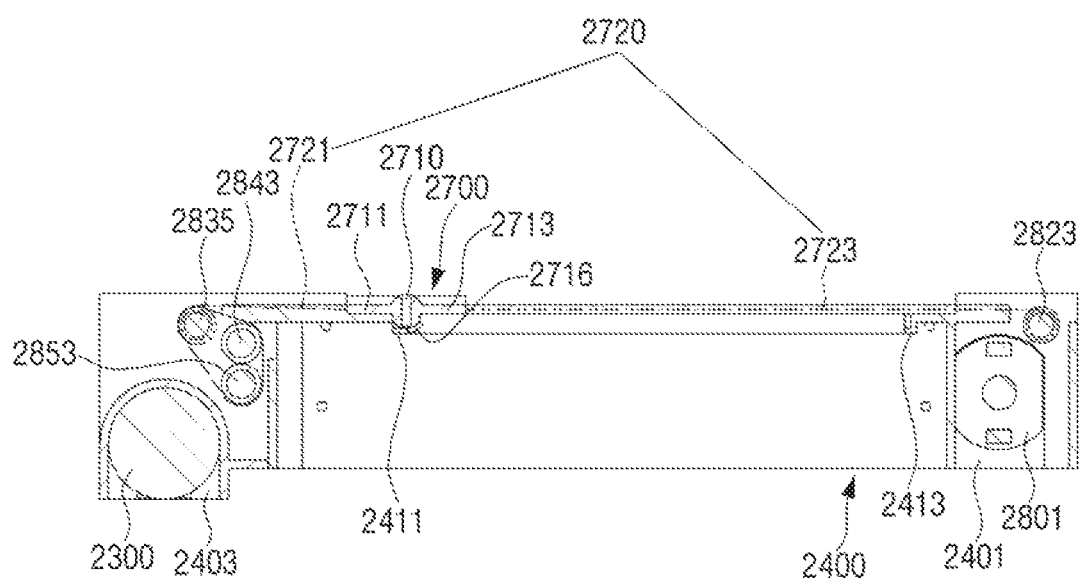
FIGS. 77 and 78 are schematic side views illustrating a first position and a second position of an exposure member.
Figure 78:
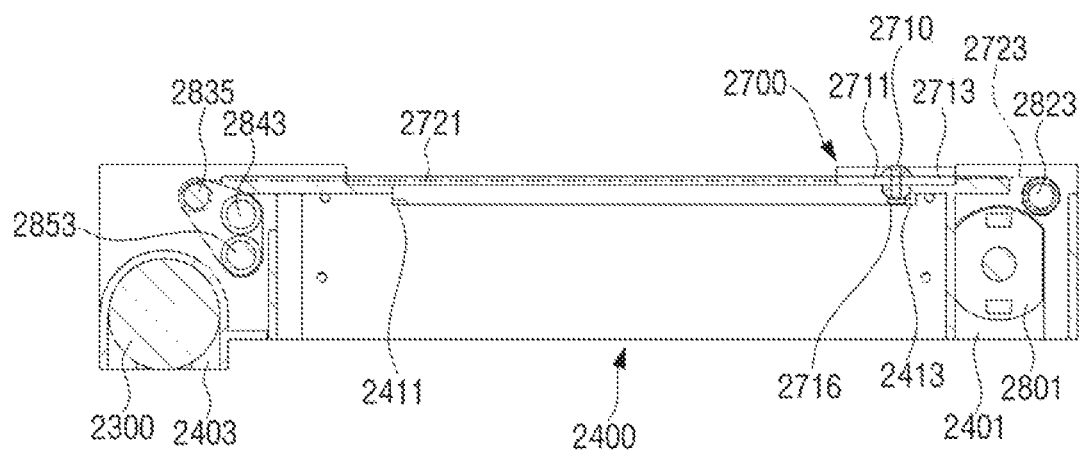

FIG. 69 is a perspective view illustrating a portable image-forming device according to an embodiment of the disclosure, FIG. 70 is an exploded perspective view illustrating an upper housing, FIG. 71 is a perspective view illustrating the upper housing without a cover, FIG. 72 is a perspective view illustrating a button disposed on a lower housing, FIGS. 73 and 74 are perspective views illustrating an open state of the portable image-forming device at different angles, FIGS. 75 and 76A are perspective views illustrating a driving unit at different angles, FIG. 76b is an expanded view of Portion J displayed in FIG. 76A, and FIGS. 77 and 78 are schematic side views illustrating a first position and a second position of an exposure member.

Referring to FIGS. 69 to 78, a portable image-forming device 2000 according to an embodiment may include a housing 2110, an exposure member 2700, a shading member 2720 for shading other area than an area occupied by the exposure member on a moving route of the exposure member 2700 (a section between a first position and a second position), a driving unit 2800 for driving the exposure member 2700 to the first position and to the second position, and developing agent-spreading members 2843, 2853.

Referring to FIG. 69, the housing 2110 may include an upper housing 2111 and a lower housing 2112 connected to the upper housing 2111 by means of a hinge 2215.

Referring to FIG. 70, the upper housing 2111 may include a cover 2111a and a frame 2400 covered with the cover 2111a.

In this case, the cover 2111a is provided with an incident window 2211 corresponding to the screen 401 of the display device 400 (refer to FIG. 20) in a penetrating manner on an upper surface thereof. The light radiating from the screen 401 of the display device 400 falls into the photosensitive surface 141 (refer to FIG. 23a) of the instant film 140 through the incident window 2211. In this case, the light radiating from the screen 401 of the display device 400 falls into the photosensitive surface 141 of the instant film 140 with a different light quantity according to a contrast of the image 403 displayed in the screen 401 of the display device 400.

The cover 2111a has at least three sensors 2221, 2222, 2223 disposed around the incident window 2211. The plurality of sensors 2221, 2222, 2223 are components for detecting an outer surface of the screen 401 of the display device 400. The three sensors 2221, 2222, 2223 are located at a position corresponding to a vertex of a virtual triangle obtained by sequentially connecting the sensors with a virtual line.

As described above, in the same manner as in an embodiment, in response to the portable image-forming device 2000 and the display device 400 being attached for the printing operation, the touch screen of the display apparatus 400 may sense a location of the plurality of touch sensors 2221, 222, 2223 and sense a size of the incident window 2211 based on the sensed location of the plurality of touch sensors 2221, 222, 2223. For example, in response to the display device 400 recognizing that the touch sensors are spaced 5 mm apart from the incident window 2211, the display device 400 may determine the size of the incident window 2211 by subtracting 10 mm from the distance of the sensed two locations. In addition, in response to the plurality of touch sensors 2221, 222, 2223 being disposed in an area in which the location of the incident window 2211 may be recognized (for example, the vertex of the incident window), the display device 400 may determine the location of the incident window 2211 based on the sensed location.

The plurality of touch sensors 2221, 222, 2223 may be disposed in an arrangement for determining a disposing direction of the display device 400 with respect to the portable image-forming device 2000. For example, in response to the display device 400 being attached, one touch is sensed on the upper side of the display device 400, and two touches are sensed on the lower side of the display device 400. In response to the upper side and the lower side of the display device being reversed and coming into contact with each other, two touches may be sensed on the upper side of the display device 400, and one touch may be sensed on the lower side of the display device 400. Accordingly, the display device 400 may recognize an attached form of the display device 400 and the portable image-forming device 2000 based on the arrangement of the touch sensors 2221, 222, 2223. In response to determining that the arrangement of the touch sensors 2221, 222, 2223 not being in accord with the intention of the manufacturer, the display device 400 may output an error message (voice) or output the displayed image by rotating 180 degrees.

The plurality of touch sensors 2221, 222, 2223 may be used to determine whether the display device is disposed accurately on the portable image-forming device 2000. For example, in response to determining that a touched point on the upper side is not located at a particular coordinate at which the touched point is supposed to be located when two devices come into contact with each other accurately, the display device may output that the devices are not located accurately. In response to determining that the display device is disposed on an accurate position, the display device may notify that the display device has been disposed accurately.

Although not depicted, it is preferred that the portable image-forming device 2000 according to an embodiment may include the fixing unit 114, 117 (refer to FIGS. 1 and 7) on the upper surface of the cover 2111a, as described above.

The cover 2111a has a film discharging port 2213 for discharging an instant film on an upper end thereof.

Referring to FIG. 70, the exposure member 2700 is slidably disposed on an upper side of the frame 2400, the driving unit 2800 is disposed on one side, and the developing agent-spreading members 2843, 2853 are disposed in a direction of discharging the instant film, respectively.

Referring to FIG. 71, the frame 2400 has a rough square shape. The frame 2400 is provided with a first space 2401 in which the driving motor 2801 is disposed on a rear end thereof, a second space 2403 in which a battery 2300 is mounted is formed on a front end thereof, and a third space 2405 in which an instant film cassette 2500 is mounted between the first space 2401 and the second space 2403. In this case, an upper side and a lower side of the third space 2405 are open. The exposing operation to the instant film may be performed through an upper opening, and the instant film cassette 2500 may be mounted and detached through a lower opening.

The frame 2400 is provided with a first sensor 1610 for determining whether the lower housing 2112 is closed on one lateral surface thereof, as illustrated is FIG. 71. The frame 2400 is also provided with a second sensor 2620 and a third sensor 2630 for determining a location of the exposure member 2700 with a certain space on the other lateral surface thereof, as illustrated in FIG. 70. A detailed description on the first to third sensors 2610, 2620, 2630 will be provided below.

Referring to FIGS. 72 to 74, the lower housing 2112 performs a role of a door for opening or closing a lower side of the upper housing 2111. The lower housing 2112 may include a first part 2113 and a second part 2115. A controller (not shown) is disposed between the first part 2113 and the second part 2115 so as not to be exposed to outside. The controller may include a memory including a printing processing program, a microprocessor which is electrically connected to the plurality of touch sensors 2221, 2222, 2223, and the first to third sensors 2610, 2620, 2630 so as to receive a signal and perform a printing process according to the received signal, and so on.

The first part 2113 may include a function button 2217 on a rear surface thereof. In this case, the controller turns off a sleep mode in response to the function button 2217 being pressed while the portable image-forming device 2000 is in the sleep mode and proceeds with the printing process in response to the function button 2217 being pressed again while the sleep mode is turned off. In addition, in response to a predetermined time elapsing while the sleep mode is turned off, the controller changes a mode to the sleep mode again.

Meanwhile, in this embodiment, an on/off command with respect to the sleep mode and a printing process command are inputted through the single function button 2217, but not limited thereto. That is, function buttons corresponding to respective functions may be provided.

Referring to FIG. 74, the second part 2113 is provided with a first unit to be detected 2611 on an inner side thereof. The first unit to be detected 2611 protrudes at a location which is spaced a certain distance apart from the hinge 2215. The first unit to be detected 2611 rotates on the hinge 2215 in the lower housing 2112 and is disposed at a position detected by the first sensor 2610 upon the lower side of the upper housing 2111 being closed.

In response to the lower side of the upper housing 2111 being closed, a plurality of supporting protrusions 2116, 2117 for supporting a plurality of instant films laminated in the instant film cassette 2500 are formed on the second part 2113. The plurality of supporting protrusions 2116, 2117 are inserted into through holes 2501, 2503 formed on a lower side of the instant film cassette 2500 so as to support the plurality of instant films.

The instant film cassette 2500 (refer to FIG. 23) is detachably mounted in the third space third space 2405 of the frame 2400. The structure of the instant film cassette 2500 is the same as the structure of the instant film cassette 120 according to the first embodiment, and thus, a repeated description is omitted. In addition, the instant film is not illustrated in the drawing, but the instant film 140 which is the same as the instant film of the first embodiment is charged and used in the instant film cassette 2500.

The first sensor 2610 of FIG. 71 is a component for detecting whether the lower housing 2112 closes the lower side of the upper housing 2111. The first sensor 2610 may include of an optical sensor having a light-receiving unit and a light-emitting unit. The first sensor 2610 detects the first unit to be detected 2611 protruding from the inner side of the lower housing 2112. In response to the lower housing 2112 being opened by the first sensor 2610, the controller cuts off the power supply with respect to the driving unit 2800, and in response to the lower housing 2112 being closed, supplies the power to the driving unit 2800.

In this case, the first sensor 2610 may include of a push switch-type sensor which generates a signal by being pressurized by the first unit to be detected 2611, on top of the optical sensor, needless to say.

Referring to FIG. 70, the second and third sensors 2620, 2630 detect a first position (initial position, refer to FIG. 77) and a second position (post-exposure position, refer to FIG. 78) of the exposure member 2700. The second and third sensors 2620, 2630 may include an optical sensor in the same manner as the first sensor 2610, but not limited thereto. That is, the second and third sensors 2620, 2630 may include the push switch-type sensor, needless to say.

The second sensor 2620 is disposed at the first position (initial position) adjacent to the front end of the frame 2400 adjacent to the developing agent-spreading members 2843, 2853. The second sensor 2620 is disposed on a first supporting member 2621 fixed to the frame 2400 and detects a second unit to be detected 2715 which is included in the exposure member 2700 so as to move along with the exposure member 2700.

The third sensor 2630 is disposed at the second position (post-exposure position) adjacent to the rear end of the frame 2400. The third sensor 2630 is disposed on a second supporting member 2631 fixed to the frame 2400 and detects the second unit to be detected 2715.

In response to each of the first and second positions of the exposure member 2700 being detected, the second and third sensors 2620, 2630 transmit a corresponding detection signal to the controller. The controller detects a location of the exposure member 2700 according to the received detection signal and turns off the driving motor 2801 of the driving unit 2800.

Referring to FIG. 70, the exposure member 2700 reciprocates in a longitudinal direction of the frame 2400 on the upper side of the frame 2400 in a sliding manner and exposes the photosensitive surface of the instant film charged in the instant film cassette 2500 to the light radiating from the screen of the display device.

The exposure member 2700 may include the components similar to the components of the exposure member 130 discussed previously, and thus, only a component which is not included in the components of the exposure member 130 will be described in detail, without a repeated description on the similar components.

As illustrated in FIG. 70, the exposure member 2700 may include an extension unit 2714 which is formed on one end of the exposure member so as to be slidably seated on a guide rail 2405 protruding along one end of the upper side of the frame. In addition, as illustrated in FIG. 71, the exposure member 2700 may include a couple of guide protrusions 2716, 2717 which protrude from the other end of the exposure member so as to be slidably inserted into a linear guide hole 2460 formed in a penetrating manner along the other end of the upper side of the frame 2400.

In this case, the extension unit 2714 may include the second unit to be detected 2715 in a thin leaf shape, which is extended from a lower end of the extension unit 2714 of the exposure member 2700. The extension unit 2714 moves along the exposure member 2700 such that the second unit to be detected 2715 is detected at the first position and the second position by the second and third sensors 2620, 2630.

A first shading film 2721 of the shading member 2720 is connected to one end 2711 of the exposure member 2700, and a second shading film 2723 of the shading member 2720 is connected to the other end 2713 of the exposure member 2700. Upon the exposure member 2700 reciprocating between the first position and the second position, the shading member 2720 covers a front part and a rear part of the space occupied by the exposure member 2700 and blocks out a light which falls into the upper housing 2111 through the incident window 2111 to be irradiated to the photosensitive surface of the instant film.

In addition, the exposure member 2700 may include a shutter 2716 for blocking out the light irradiated to the instant film through a lens 2710. The shutter 2716 is disposed in a swinging manner at a position which covers or does not cover a lens array 2710. Accordingly, the shutter 2716 swings to the position which does not cover the lens array 2710 by a first stopping bump 2411 on the frame 2400 at the point of time of returning to the first position (refer to FIG. 77). In addition, the shutter 2716 swings to the position which covers the lens array 2710 by a second stopping bump 2413 on the frame 2400 at the point of time of reaching the second position (refer to FIG. 78)

Accordingly, the exposure member 2700 is on standby at the first position (initial position) in a state for performing the exposing operation through the lens array 2710. In response to the exposure member 2700 returning to the first position from the second position (post-exposure position), the exposure member 2700 is on standby in a state of covering the lens array 2710 such that the light is not irradiated to the instant film waiting for a next printing process on the lower side of the instant film which is currently being printed.

Referring to FIG. 76B, the exposure member 2700 may include a push protrusion 2718 which is downwardly extended from a lower surface of the other end of the exposure member 2700, and a blind hole 2719 is formed on the push protrusion 2718. The push protrusion 2718 performs a role which is the same as the hook 197g of the first embodiment. That is, in response to the exposure member 2700 returning to the first position from the second position, the push protrusion 2718 pushes the rear end 140b of the instant film 140 (refer to FIG. 23C). In this case, a part of the rear end 140b may be inserted into the blind hole 2719.

The shading member 2720 may include the first shading film 2721 and the second shading film 2723 which are separated from each other. The first shading film 2721 has one end fixed to one end 2711 of the exposure member 2700 and the other end fixed to a first slave shaft 2835. The second shading film 2723 has one end fixed to the other end 2713 of an optical member 2720 and the other end fixed to a second slave shaft 2823.

It is preferred that the first shading film 2721 and the second shading film 2723 are made of an opaque material for blocking out a light and a flexible material such that the first shading film 2721 and the second shading film 2723 are wound or unwound with respect to the first slave shaft 2835 and the second slave shaft 2823.

Referring to FIGS. 75 and 76A, the driving unit 2800 moves the exposure member 2700 to reciprocate to the first and second positions and drives the developing agent-spreading members 2843, 2853.

The driving unit 2800 may include the driving motor 2801 which performs a role of a power source and may perform forward rotation and reverse rotation, a driving shaft 2815, and the first slave shaft 2835 and the second slave shaft 2823 rotating in association with the driving shaft 2815. In addition, the driving unit 2800 may include a plurality of gears for transmitting power to the respective shafts 2815, 2823, 2835.

The driving motor 2801 is realized as a single body and provides power for driving the exposure member 2700 and power for driving the developing agent-spreading member 2843, 2853 simultaneously.

Meanwhile, the conventional portable image-forming device controls an operation for scanning an image on an instant film through a Light Emitting Diode (LED) head by means of a step motor and drives a discharging roller and a developing roller by means of a D.C motor. In this case, the exposing operation through the LED head scanning requires a line-by-line accurate scanning operation, and thus, the step motor is inevitably included. However, the portable image-forming device 2000 may perform the above two operations simultaneously by using one DC motor.

The driving shaft 2815 has both ends rotatably being supported by the first and second supporting members 2621, 2631.

In addition, the driving shaft 2815 may include a second gear 2813 meshed with a first gear 2803 engaged with the driving shaft of the driving motor 2801 on one end and may include a third gear 2819 coaxially disposed to be adjacent to the second gear 2813. The third gear 2819 is meshed with a fourth gear 2821 engaged with one end of the second slave shaft 2823. The driving shaft 2815 may include a sixth gear 2817 meshed with a fifth gear 2831 engaged with one end of the first slave shaft 2835 on the other end thereof.

The first slave shaft 2835 may include a seventh gear 2841 which is coaxially disposed to be adjacent to the fifth gear 2831. The seventh gear 2841 is meshed with an eighth gear 2841 disposed on one end of the developing agent-spreading member 2843 disposed on an upper side, out of the couple of developing agent-spreading members 2843, 2853. The eighth gear 2841 is meshed with a ninth gear 2851 disposed on one end of the developing agent-spreading member 2853 disposed on a lower side, out of the couple of developing agent-spreading members 2843, 2853.

In response to the driving shaft 2815 rotating in a certain direction, the first slave shaft 2835 and the second slave shaft 2823 rotate clockwise simultaneously. Consequently, the first shading film 2721 is unwound from the first slave shaft 2835, the second shading film 2723 is wound on the second slave shaft 2823, and the exposure member 2700 moves from the first position to the second position.

In response to the driving shaft 2815 rotating in a reverse direction, the first slave shaft 2835 and the second slave shaft 2823 rotate counterclockwise simultaneously. Consequently, the first shading film 2721 is wound on the first slave shaft 2835, the second shading film 2723 is unwound from the second slave shaft 2823, and the exposure member 2700 returns to the first position from the second position.

In response to the first slave shaft 2835 rotating counterclockwise, the developing agent-spreading members 2843, 2853 rotate in opposite directions and push the instant film toward the film discharging port 2213 while pressurizing the instant film. Consequently, the developing agent is spread on an opposite surface of the photosensitive surface of the instant film.

The developing agent-spreading members 2843, 2853 include of a rubber roller. The conventional portable image-forming device uses a discharging roller made of a metal, which may include a spring for adjusting a developing agent to be spread on an instant film evenly due to the intrinsic stiffness of the material. However, in the embodiment, the developing agent-spreading members 2843, 2853 include of a rubber roller, and thus, a developing agent may be spread evenly only by the intrinsic elastic force without an additional spring or a complicated elastic structure.

The portable image-forming device 2000 according to an embodiment is different from the portable image-forming device 100 previously described in terms of being operated on electricity. However, the exposure member 2700 of the portable image-forming device 2000 exposes the instant film while moving from the first position to the second position and pushes the front end of the instant film to be meshed with the developing agent-spreading members 2843, 2853 upon returning to the first position from the second position after completion of the exposure, which is the same as the operations of the portable image-forming device 100 previously described.

Accordingly, a detailed description on a printing process through the portable image-forming device 2000 will be replaced with a brief description.

An image to be printed is selected from the display device and displayed in a display area of the display device.

The display device is placed on the upper housing 2111 so as to face the incident window 2211. In this case, a location of the image in the display device is adjusted according to the location of the plurality of touch sensors 2221, 222, 2223.

In response to the function button 2217 being pressed, the sleep mode is turned off. In response to the function button 2217 being pressed once again, the driving unit 2800 is operated. Accordingly, the exposure member 2700 and the developing agent-spreading members 2843, 2853 are operated, a printing process is performed with respect to the instant film, and the instant film is discharged through the film discharging port 2213.

The general disclosure generally relates to a portable image-forming device which prints an image displayed in a screen of a portable display device on an instant film.

As set forth above, example embodiments have been shown and described. The foregoing embodiments and advantages are merely exemplary and are not to be construed as limiting the disclosure. The teachings of the disclosure may be readily applied to other types of devices. Also, the description of the embodiments is intended to be illustrative, and not to limit the scope of the claims, and many alternatives, modifications, and variations will be apparent to those skilled in the art.

What is claimed is:

1. A portable image-forming device, comprising:
a housing;
an exposure member to expose an instant film disposable in an inside of the housing to a light radiating from a portable display device;
a manually operable traction unit, connected to the exposure member, to move the exposure member between a pre-exposure position and a post-exposure position; and
a manually operable developing agent-spreading member to spread a developing agent provided in the instant film over an exposed portion of the instant film.

2. The device as claimed in claim 1, wherein the exposure member comprises:
a lens array;
a frame to support the lens array; and
a shutter slidably engaged with the frame,
wherein the shutter closes the lens array in response to the exposure member moving to the pre-exposure position and opens the lens array in response to the exposure member moving from the pre-exposure position to the post-exposure position.

3. The device as claimed in claim 2, wherein the frame comprises a plurality of contact protrusions formed to be in contact with the shutter.

4. The device as claimed in claim 1, further comprising a shading member to operate in association with the exposure member so as to shield the instant film,
wherein
the shading member includes an opaque film having an elastic force and comprises a first shading film and a second shading film respectively connected to a front end and a rear end of the exposure member, and
the first shading film and the second shading film are disposed in the housing such that a part of each of the first shading film and the second shading film is to be in a rolled state and another part of each of the first shading film and the second shading film is to be in an unrolled state.

5. The device as claimed in claim 1, wherein the traction unit comprises:
a lever to move the exposure member to the pre-exposure position or the post-exposure position;
an elastic member to elastically support the lever; and
a locking member to lock or release the lever at the pre-exposure position of the exposure member,
wherein the lever is connected to a front end of the exposure member by a first string and connected to a rear end of the exposure member by a second string.

6. The device as claimed in claim 5, wherein
the exposure member includes:
a lens array,
a frame to move the lens array between the pre-exposure position and the post-exposure position via movement of the first string and the second string, the first string being connected at one end to a central front side of the frame and the second string being connected at one end to a central rear side of the frame, and
a shutter slidably engaged with the frame, to move at a slower moving speed than a moving speed of the frame when the frame is moved via the lever.

7. The device as claimed in claim 1, further comprising:
a damping unit to elastically support the exposure member in a direction in which the exposure member moves from the post-exposure position to the pre-exposure position.

8. The device as claimed in claim 1, wherein the traction unit further comprises an instant film-setting member to introduce a front end of the instant film into the developing agent-spreading member by applying a force to a rear end of the instant film in response to the exposure member moving from the pre-exposure position toward the post-exposure position.

9. A portable image-forming device, comprising:
a housing in which an instant film is mountable;
an exposure member, disposed in an inside of the housing, to move along a longitudinal direction of the housing;
a pressurizing member, provided on one side of the exposure member, to pressurize the instant film such that a developing agent included in the instant film develops an exposed portion of the instant film; and
a moving member to move the exposure member and the pressurizing member within the housing along the longitudinal direction of the housing,
wherein the exposure member, the pressurizing member, and the moving member are integrally formed as a single body, such that movement of the moving member causes movement of the exposure member and the pressurizing member.

10. The device as claimed in claim 9, further comprising:
a display fixing unit, disposed on an upper side of the housing, to fix a portable display device to the housing.

11. The device as claimed in claim 10, further comprising:
a middle plate disposed between the display fixing unit and the housing and provided with an input window corresponding to at least a portion of a screen of the portable display device,
wherein the middle plate is hinge-engaged with the housing and provided with a fixing protrusion to fix the instant film to the housing.

12. The device as claimed in claim 9, wherein
the exposure member includes:
  a lens array;
  a lens supporting unit to support the lens array; and
  a shading plate, fixed to the lens supporting unit, to cover the instant film,
the pressurizing member includes at least one pressure roller, and
the lens supporting unit includes at least one roller groove in which the at least one pressure roller is rotatably inserted, the at least one roller groove disposed in parallel to the lens array.

13. The device as claimed in claim 12, wherein
the moving member comprises a handle disposed on one side of the lens supporting unit of the exposure member, and the shading plate is disposed on another side of the lens supporting unit of the exposure member, and
the handle has a length corresponding to a length of the shading plate.

14. The device as claimed in claim 9, wherein
the exposure member includes:
  a lens array,
  a lens supporting unit to support the lens array, and
  a shading plate, fixed to the lens supporting unit, to move between a first position to cover the instant film and a second position at which the shading plate is disposed outside of the housing to allow the instant film to be exposed.

15. A portable image-forming device, comprising:
a housing;
an exposure member to expose an instant film disposable in an inside of the housing to a light radiating from a portable display device;
a shading member to operate in association with the exposure member and to shield the instant film;
a traction unit, connected to the exposure member, to move the exposure member to a pre-exposure position;
a developing agent-spreading member including a plurality of rollers to spread a developing agent provided in the instant film over an exposed portion of the instant film;
a driving unit, including a motor, to indirectly transmit power to the exposure member through the shading member and to directly transmit power to the developing agent-spreading member;
a battery to supply power to the driving unit;
a first sensor disposed at the pre-exposure position adjacent to the plurality of rollers to sense a position of the exposure member at a first position at which the exposure member starts exposure; and
a second sensor disposed at a post-exposure position adjacent to the motor to sense a position of the exposure member at a second position at which the exposure member completes the exposure.

16. The device as claimed in claim 15, wherein
the housing includes an upper housing which includes the first and second sensors,
the first and second sensors include at least one of an optical sensor having a light-receiving unit and a light-emitting unit or a push switch-type sensor which generate a signal when pressurized, and
the exposure member includes a shutter to hide or expose a lens array disposed in the exposure member, the shutter to expose the lens array at the first position and to hide the lens array at the second position.

17. The device as claimed in claim 15, wherein
the housing includes an upper housing and a lower housing being hinge-engaged with the upper housing and opening or closing a lower side of the upper housing, and
the upper housing is provided with a third sensor to sense whether the lower housing opens or closes the lower side of the upper housing.

18. The device as claimed in claim 15, further comprising
a controller to receive a first detection signal from the first sensor when the first sensor detects the exposure member at the first position and to receive a second detection signal from the second sensor when the second sensor detects the exposure member at the second position, and to turn the motor on and off based on the first and second detection signals.

19. A portable image-forming device, comprising:
a housing to accommodate an electronic device which displays an image;
a traction unit to be engaged with the electronic device and to move in a first direction toward a pre-exposure position when the electronic device is inserted into the housing in the first direction;
an exposure member to be engaged with the traction unit when the traction unit moves in the first direction and to move in the first direction along with the traction unit, to be released from the traction unit in response to the traction unit reaching the pre-exposure position, and when the exposure member is released from the traction unit, to move in a second direction, opposite of the first direction, toward a post-exposure position; and a developing agent spreader to spread a developing agent to a portion of an instant film exposed to light by the exposure member, the instant film being mountable in an inside of the housing.

20. The device as claimed in claim 19, wherein the exposure member is to expose the instant film to the light when the exposure member moves in the second direction toward the post-exposure position, the developing agent spreader is to spread the developing agent in response to the traction unit moving in the second direction from the pre-exposure position toward the post-exposure position, and the traction unit is to move in the second direction toward the post-exposure position according to an external force retracting the electronic device from the housing or by an elastic force of an elastic member connected to the traction unit.

* * * * *